US012765191B2

(12) United States Patent

Liu et al.

(10) Patent No.: US 12,765,191 B2

(45) Date of Patent: Oct. 13, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Changchang Liu, Beijing (CN); Zhu Wang, Beijing (CN); Jiafan Shi, Beijing (CN); Ruoxiang Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 250 days.

(21) Appl. No.: 18/579,424

(22) PCT Filed: Feb. 24, 2023

(86) PCT No.: PCT/CN2023/078147

§ 371 (c)(1),
(2) Date: Jan. 15, 2024

(87) PCT Pub. No.: WO2024/174231

PCT Pub. Date: Aug. 29, 2024

(65) Prior Publication Data

US 2025/0089479 A1 Mar. 13, 2025

(51) Int. Cl.

*G09G 3/20* (2006.01)
*H10K 59/121* (2023.01)

(Continued)

(52) U.S. Cl.

CPC ....... *H10K 59/126* (2023.02); *H10K 59/1213* (2023.02); *H10K 59/131* (2023.02);

(Continued)

(58) Field of Classification Search

CPC ... H10K 9/126; H10K 59/131; H10K 59/1213

(Continued)

(56) References Cited

U.S. PATENT DOCUMENTS

2007/0155045 A1 7/2007 Seo et al.
2015/0187797 A1 7/2015 Xu (Continued)

FOREIGN PATENT DOCUMENTS

CN 103728795 A 4/2014
CN 112397538 A 2/2021

(Continued)

OTHER PUBLICATIONS

International Search Report & Written Opinion mailed Jun. 21, 2023, regarding PCT/CN2023/078147.

*Primary Examiner* — Jonathan M Blancha

(74) *Attorney, Agent, or Firm* — Intellectual Valley Law, P.C.

(57) ABSTRACT

An array substrate is provided. The array substrate includes a base substrate, and a light shielding layer on the base substrate. An orthographic projection of the light shielding layer on the base substrate at least partially overlaps with an orthographic projection of an active layer of a driving transistor of a pixel driving circuit on the base substrate. A part of the light shielding layer in a second region includes a plurality of islands, a plurality of bridges, and an auxiliary line extending along a direction substantially parallel to a second direction. The auxiliary line is connected to one or more adjacent islands through a bridge. The auxiliary line includes a plurality of fragments spaced apart from each other. An orthographic projection of the plurality of fragments on the base substrate is substantially non-overlapping with an orthographic projection of transistors of the pixel driving circuit on the base substrate.

20 Claims, 43 Drawing Sheets

(51) Int. Cl.

| | |
|---|---|
| ***H10K 59/126*** | (2023.01) |
| ***H10K 59/131*** | (2023.01) |
| *G09G 3/32* | (2016.01) |
| *H10K 59/35* | (2023.01) |
| *H10K 59/65* | (2023.01) |
| *H10W 90/00* | (2026.01) |

(52) U.S. Cl.
CPC ....... *G09G 3/32* (2013.01); *G09G 2300/0426* (2013.01); *G09G 2300/0819* (2013.01); *G09G 2300/0842* (2013.01); *G09G 2310/08* (2013.01); *H10K 59/351* (2023.02); *H10K 59/65* (2023.02); *H10W 90/00* (2026.01)

(58) Field of Classification Search
USPC ........................................................... 345/55
See application file for complete search history.

(56) References Cited

U.S. PATENT DOCUMENTS

| | | | | |
|---|---|---|---|---|
| 2017/0012097 | A1* | 1/2017 | Choi | H10D 89/60 |
| 2020/0176506 | A1* | 6/2020 | Yu | H10F 77/244 |
| 2021/0050403 | A1 | 2/2021 | Lee et al. | |
| 2022/0180792 | A1* | 6/2022 | Choi | H10K 59/121 |
| 2022/0208804 | A1 | 6/2022 | Jang et al. | |
| 2022/0208925 | A1* | 6/2022 | Park | G09G 3/3233 |
| 2022/0367587 | A1 | 11/2022 | Li | |
| 2024/0185757 | A1 | 6/2024 | Li et al. | |

FOREIGN PATENT DOCUMENTS

| | | | |
|---|---|---|---|
| CN | 113096601 | A | 7/2021 |
| CN | 115000092 | A | 9/2022 |
| CN | 115084209 | A | 9/2022 |
| CN | 115206222 | A | 10/2022 |
| JP | 2007011056 | A | 1/2007 |
| JP | 2007178810 | A | 7/2007 |
| JP | 2008134337 | A | 6/2008 |
| KR | 950012122 | A | 5/1995 |
| KR | 100667077 | A | 1/2007 |
| KR | 101972574 | A | 4/2019 |
| WO | 2022151534 | A1 | 7/2022 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/078147, filed Feb. 24, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In a first aspect, the present disclosure provides an array substrate, comprising a base substrate, and a light shielding layer on the base substrate; wherein an orthographic projection of the light shielding layer on the base substrate at least partially overlaps with an orthographic projection of an active layer of a driving transistor of a pixel driving circuit on the base substrate; wherein a part of the light shielding layer in a second region comprises a plurality of islands, a plurality of bridges, and an auxiliary line extending along a direction substantially parallel to a second direction; the auxiliary line is connected to one or more adjacent islands of the plurality of islands through a bridge of the plurality of bridges; the auxiliary line comprises a plurality of fragments spaced apart from each other; and an orthographic projection of the plurality of fragments on the base substrate is substantially non-overlapping with an orthographic projection of transistors of the pixel driving circuit on the base substrate.

In some embodiments of the present disclosure, in a column of fragments, a respective fragment is in a respective row of pixel driving circuits, and is between a respective pair of two adjacent pixel driving circuits in the respective row between which data lines are absent.

In some embodiments of the present disclosure, the array substrate further comprises an accessory signal line in a first region outside the second region; the accessory signal line extends along a direction substantially parallel to the second direction; the accessory signal line is between two adjacent pixel driving circuits in a same row between which data lines are absent; and the accessory signal line continuously extends through multiple rows of pixel driving circuits.

In some embodiments of the present disclosure, the accessory signal line is in a region adjacent to a window region of the array substrate having a hole configured for installing an accessory; and the accessory signal line is connected to an accessory installed in the window region.

In some embodiments of the present disclosure, the accessory signal line and the auxiliary line are in the light shielding layer.

In some embodiments of the present disclosure, the accessory signal line is connected to a signal line in a window region that is connected to an accessory; the signal line in the window region is connected to the accessory signal line through a connecting pad; the accessory signal line is in a third signal line layer on a side of the light shielding layer away from the base substrate.

In some embodiments of the present disclosure, the array substrate further comprises: a plurality of first fanout connecting lines extending along a direction substantially parallel to a first direction; a plurality of second fanout connecting lines extending along a direction substantially parallel to the second direction; a plurality of second voltage supply lines extending along a direction substantially parallel to the second direction; and a plurality of data lines extending along a direction substantially parallel to the second direction; wherein a respective second fanout connecting line of the plurality of second fanout connecting lines is between a second voltage supply line and a data line; two adjacent second fanout connecting lines of the plurality of second fanout connecting lines are between two adjacent data lines of the plurality of data lines; and a second voltage supply line of the plurality of second voltage supply lines spaces apart two adjacent second fanout connecting lines.

In some embodiments of the present disclosure, the respective data line is connected to a respective first fanout connecting line; a respective second fanout connecting line is connected to the respective first fanout connecting line; the respective first fanout connecting line connects the respective data line with the respective second fanout connecting line; and the plurality of second fanout connecting lines are connected to a data driving circuit.

In some embodiments of the present disclosure, the array substrate further comprises: a plurality of third voltage supply lines extending along a direction substantially parallel to the second direction; a respective third voltage supply line of the plurality of third voltage supply lines is between a second voltage supply line and a data line; two adjacent third voltage supply lines of the plurality of third voltage supply lines are between two adjacent data lines of the plurality of data lines; and a second voltage supply line of the plurality of second voltage supply lines spaces apart two adjacent third voltage supply lines.

In some embodiments of the present disclosure, at least one third voltage supply line of the plurality of third voltage supply lines and a second fanout connecting line of the plurality of second fanout connecting lines are disconnected from each other, and are between a same second voltage supply line and a same data line that are configured to provide signals to a same column of pixel driving circuits; the at least one third voltage supply line crosses over a first portion of the array substrate; the second fanout connecting line crosses over a second portion of the array substrate; and the first portion and the second portion are non-overlapping to each other.

In some embodiments of the present disclosure, the array substrate further comprises: an anode layer comprising a plurality of anodes; a plurality of first fanout connecting lines extending along a direction substantially parallel to a first direction; and a plurality of first voltage supply lines extending along a direction substantially parallel to the first direction; wherein an orthographic projection of the plurality of anodes on the base substrate is substantially non-overlapping with an orthographic projection of the plurality of first fanout connecting lines on the base substrate, and is substantially non-overlapping with an orthographic projection of the plurality of first voltage supply lines on the base substrate.

In some embodiments of the present disclosure, the array substrate further comprises: a plurality of second voltage supply lines extending along a direction substantially parallel to the second direction; wherein the anode layer comprises a first respective anode, a second respective anode, a third respective anode, and a fourth respective anode; and an orthographic projection of the plurality of second voltage supply lines on the base substrate substantially covers an orthographic projection of the first respective anode on the base substrate, and substantially covers an orthographic projection of the second respective anode on the base substrate.

In some embodiments of the present disclosure, the array substrate further comprises: a plurality of second fanout connecting lines extending along a direction substantially parallel to the second direction; and a plurality of data lines extending along a direction substantially parallel to the second direction; wherein the anode layer comprises a first respective anode, a second respective anode, a third respective anode, and a fourth respective anode; an orthographic projection of the third respective anode on the base substrate at least partially overlaps with orthographic projections of two adjacent data lines and two adjacent second fanout connecting lines on the base substrate; the third respective anode comprises a third main anode part and a third extension connecting the third main anode part with a third corresponding anode connecting pad; the two adjacent data lines and the two adjacent second fanout connecting lines respectively cross over the third respective anode along the second direction; and the two adjacent data lines and the two adjacent second fanout connecting lines are substantially evenly distributed along a first direction with respect to the third main anode part of the third respective anode.

In some embodiments of the present disclosure, the array substrate further comprises: a voltage connecting pad; wherein the voltage connecting pad connects a respective first voltage supply line of a plurality of first voltage supply lines to a second capacitor electrode of a storage capacitor and connects a respective first voltage supply line of a plurality of first voltage supply lines to a first electrode of a light emitting control transistor; a respective second voltage supply line of a plurality of second voltage supply lines is connected to a respective first voltage supply line of a plurality of first voltage supply lines through an eighth via; and the respective first voltage supply line is connected to the voltage connecting pad through a ninth via, thereby supplying a first reference voltage signal to the voltage connecting pad, and in turn to the second capacitor electrode.

In some embodiments of the present disclosure, the voltage connecting pad is in a region between two adjacent pixel driving circuits in a same row between which at least one data line is present; the voltage connecting pad is absent in a region between two adjacent pixel driving circuits in a same row between which data lines are absent; and an orthographic projection of the voltage connecting pad on the base substrate at least partially overlaps with an orthographic projection of a data line on the base substrate.

In some embodiments of the present disclosure, the array substrate further comprises: an interconnected reset signal line network; wherein the interconnected reset signal line network comprises a plurality of first reset signal lines and a plurality of fourth reset signal lines interconnected together; the plurality of first reset signal lines extend along a direction substantially parallel to a first direction; the plurality of fourth reset signal lines extend along a direction substantially parallel to the second direction; and the plurality of first reset signal lines and the plurality of fourth reset signal lines are parts of a unitary structure and are in a same layer.

In some embodiments of the present disclosure, a ratio of a number of the plurality of first reset signal lines to a number of rows of pixel driving circuits in a display area of the array substrate is in a range of 0.8:1.0 to 1.2:1.0; and a ratio of a number of the plurality of fourth reset signal lines to a number of columns of pixel driving circuits in a display area of the array substrate is in a range of 0.8:2.0 to 1.2:2.0.

In some embodiments of the present disclosure, the array substrate further comprises: an interconnected voltage supply network; wherein the interconnected voltage supply network comprises a plurality of first voltage supply lines and a plurality of second voltage supply lines interconnected together; the plurality of first voltage supply lines extend along a direction substantially parallel to a first direction; the plurality of second voltage supply lines extend along a direction substantially parallel to the second direction; the plurality of first voltage supply lines are in a layer different from the plurality of second voltage supply lines; and a respective second voltage supply line is connected to a respective first voltage supply line through a via extending through a planarization layer.

In some embodiments of the present disclosure, a ratio of a number of the plurality of second voltage supply lines to a number of columns of pixel driving circuits in a display area of the array substrate is in a range of 0.8:2.0 to 1.2:2.0.

In a second aspect, the present disclosure provides display apparatus, comprising the above array substrate, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a base substrate, and a light shielding layer on the base substrate. Optionally, an orthographic projection of the light shielding layer on the base substrate at least partially overlaps with an orthographic projection of an active layer of a driving transistor of a pixel driving circuit on the base substrate. Optionally, the light shielding layer in a second region comprises a plurality of islands, a plurality of bridges, and an auxiliary line extending along a direction substantially parallel to a second direction. Optionally, the auxiliary line is connected to one or more adjacent islands of the plurality of islands through a bridge of the plurality of bridges. Optionally, the auxiliary line comprises a plurality of fragments spaced apart from each other.

Optionally, an orthographic projection of the plurality of fragments on the base substrate is substantially non-overlapping with an orthographic projection of transistors of the pixel driving circuit on the base substrate.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
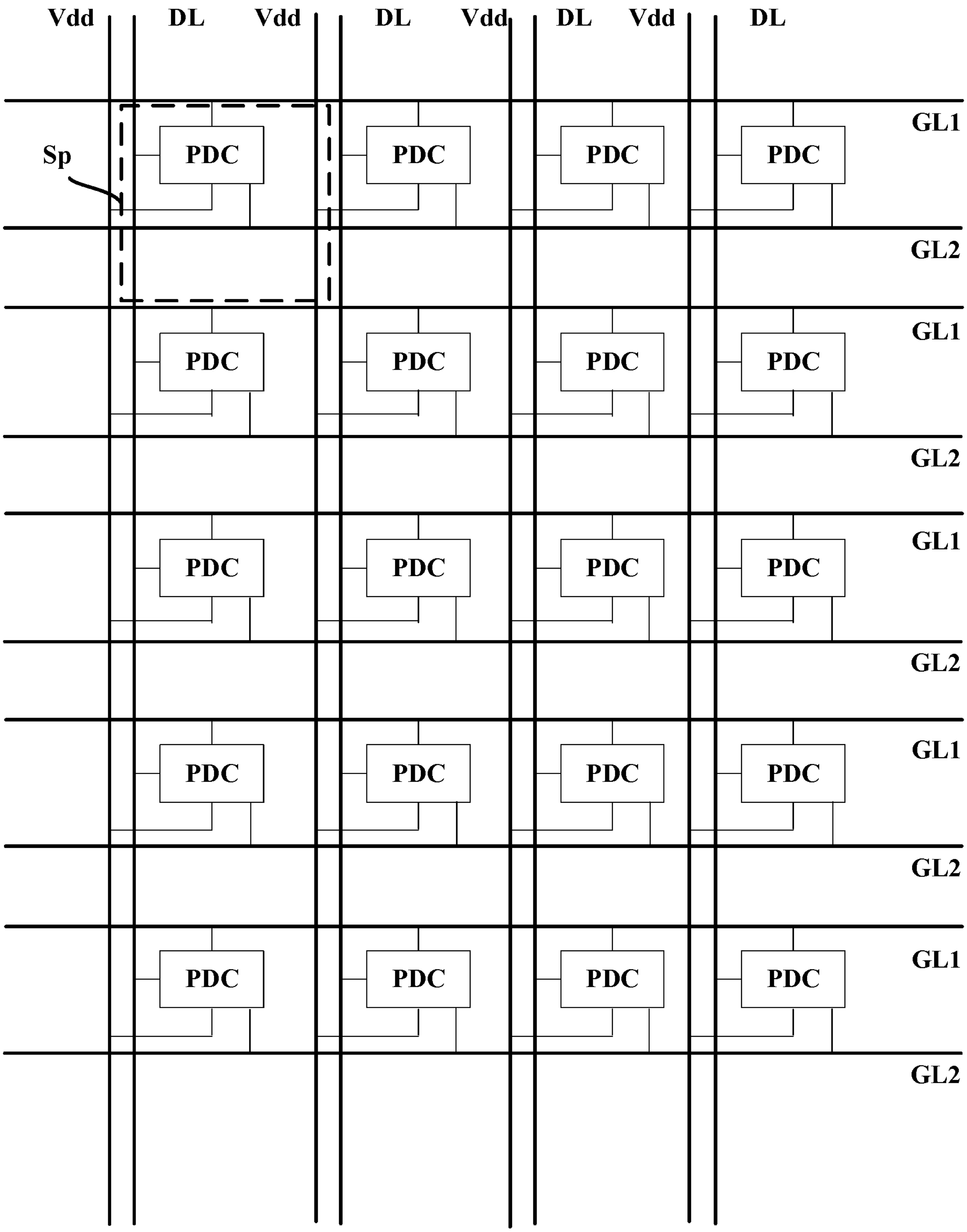
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of first gate lines GL1, a plurality of second gate lines GL2, a plurality of data lines DL, a plurality of voltage supply line Vdd, and a respective second voltage supply line (e.g., a low voltage supply line Vss). Light emission in a respective subpixel Sp is driven by a respective pixel driving circuit PDC. In one example, a high voltage signal (e.g., a VDD signal) is input, through the respective high voltage supply line of the plurality of voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage ΔV that drives light emission in the light emitting element.

Figure 2A:
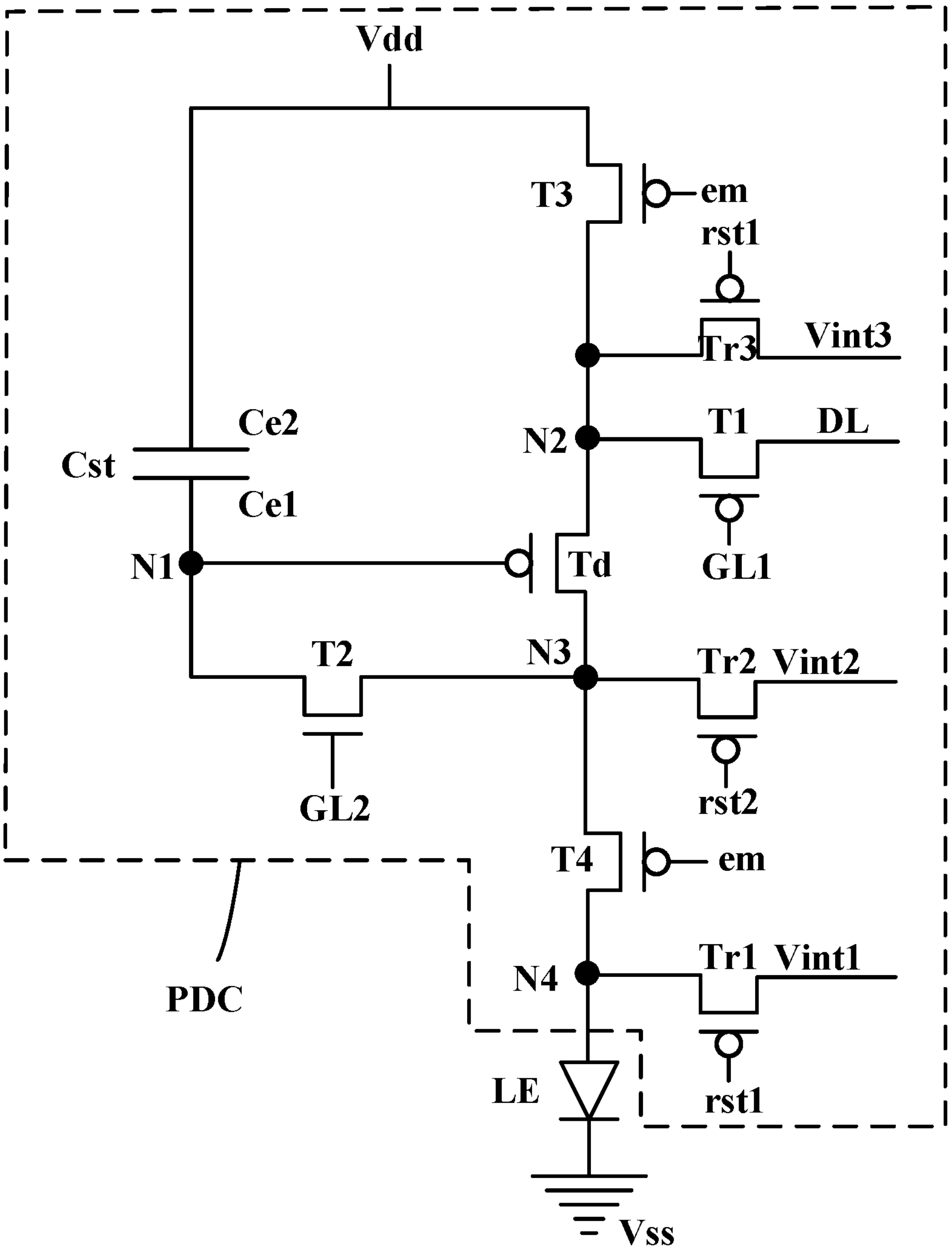
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a second reset transistor Tr2 having a gate electrode connected to a respective second reset control signal line rst2 of a plurality of second reset control signal lines, a first electrode connected to a respective second reset signal line Vint2 of a plurality of second reset signal lines, and a second electrode connected to a second electrode of the driving transistor Td; a first transistor T1 having a gate electrode connected to a respective first gate line GL1 of a plurality of first gate lines, a first electrode connected to a respective data line DL of a plurality of data lines, and a second electrode connected to a first electrode of the driving transistor Td; a third reset transistor Tr3 having a gate electrode connected to a respective first reset control signal line rst1 of a plurality of first reset control signal lines, a first electrode connected to a respective third reset signal line Vint3 of a plurality of third reset signal lines, and a second electrode connected to the first electrode of the driving transistor Td; a second transistor T2 having a gate electrode connected to a respective second gate line GL2 of a plurality of second gate lines, a first electrode connected to the first capacitor electrode Ce1 of the storage capacitor Cst and the gate electrode of the driving transistor Td, and a second electrode connected to the second electrode of the driving transistor Td; a third transistor T3 having a gate electrode connected to a respective light emitting control signal line em of a plurality of light emitting control signal lines, a first electrode connected to a respective voltage supply line Vdd of a plurality of voltage supply lines, and a second electrode connected to the first electrode of the driving transistor Td and the second electrode of the first transistor T1; a fourth transistor T4 having a gate electrode connected to the respective light emitting control signal line em of the plurality of light emitting control signal lines, a first electrode connected to second electrodes of the driving transistor Td and the second transistor T2, and a second electrode connected to an anode of a light emitting element LE; and a first reset transistor Tr1 having a gate electrode connected to the respective first reset control signal line rst1 of a plurality of first reset control signal lines, a first electrode connected to a respective first reset signal line Vint1 of a plurality of first reset signal lines, and a second electrode connected to the second electrode of the fourth transistor T4 and the anode of the light emitting element LE. The second capacitor electrode Ce2 is connected to the respective voltage supply line and the first electrode of the third transistor T3.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

The pixel driving circuit further include a first node N1, a second node N2, a third node N3, and a fourth node N4. The first node N1 is connected to the gate electrode of the driving transistor Td, the first capacitor electrode Ce1, and the first electrode of the second transistor T2. The second node N2 is connected to the second electrode of the third transistor T3, the second electrode of the first transistor T1, the second electrode of the third reset transistor Tr3, and the first electrode of the driving transistor Td. The third node N3 is connected to the second electrode of the driving transistor Td, the second electrode of the second transistor T2, the first electrode of the fourth transistor T4, and the second electrode of the second reset transistor Tr2. The fourth node N4 is connected to the second electrode of the fourth transistor T4, the second electrode of the first reset transistor Tr1, and the anode of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In some embodiments, a minimum repeating unit of the plurality of subpixels of the array substrate includes the respective first subpixel, the respective second subpixel, and the respective third subpixel. Optionally, each of the respective first subpixel, the respective second subpixel, and the respective third subpixel, includes the first transistor T1, the second transistor T2, the third transistor T3, the fourth transistor T4, the first reset transistor Tr1, the second reset transistor Tr2, the third reset transistor Tr3, and the driving transistor Td.

The present disclosure may be implemented in pixel driving circuit having transistors of various types, including a pixel driving circuit having p-type transistors, a pixel driving circuit having n-type transistors, and a pixel driving circuit having one or more p-type transistors and one or more n-type transistors. Referring to FIG. 2A, the second transistor T2 is an n-type transistor such as a metal oxide transistor, and other transistors are p-type transistors such as polysilicon transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal.

Figure 2B:
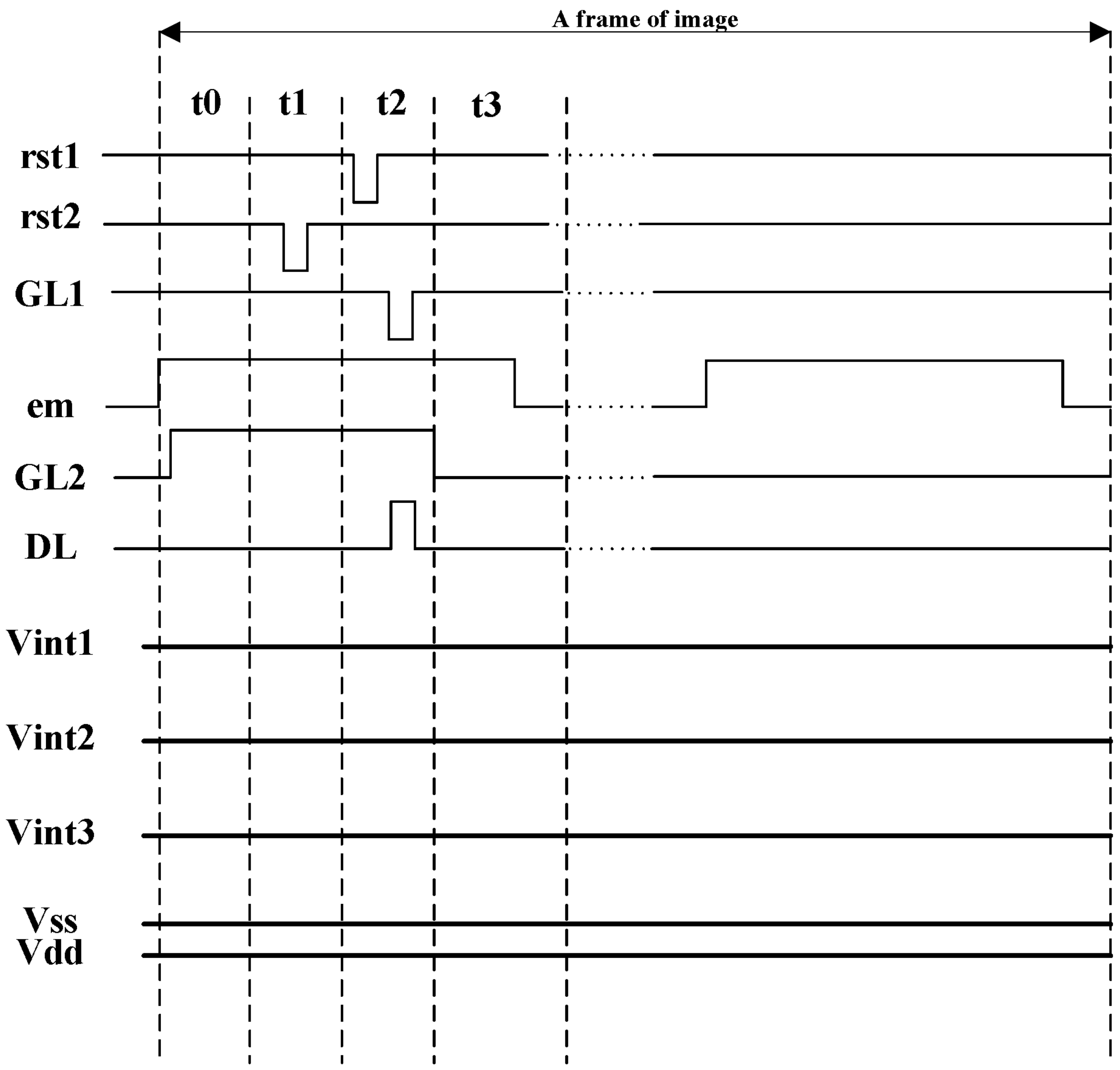
FIG. 2B is a timing diagram illustrating the operation of a pixel driving circuit in some embodiments according to the present disclosure.

FIG. 2B is a timing diagram illustrating the operation of a pixel driving circuit in some embodiments according to the present disclosure. Referring to FIG. 2A and FIG. 2B, during one frame of image, the operation of the pixel driving circuit includes a reset sub-phase t1, a data write sub-phase t2, and a light emitting sub-phase t3. In the initial sub-phase t0, a turning-off reset control signal is provided through the respective second reset control signal line rst2 to the gate electrode of the second reset transistor Tr2 to turn off the second reset transistor Tr2. A turning-off reset control signal is provided through the respective first reset control signal line rst1 to the gate electrode of the first reset transistor Tr1 and the gate electrode of the third reset transistor Tr3 to turn off the first reset transistor Tr1 and the third reset transistor Tr3. In the initial sub-phase t0, the respective first gate line GL1 is provided with a turning-off signal, thus the first transistor T1 is turned off.

In the reset sub-phase t1, a turning-on reset control signal is provided through the respective first reset control signal line rst1 to the gate electrode of the first reset transistor Tr1 to turn on the first reset transistor Tr1; allowing an initialization voltage signal from the respective first reset signal line Vint1 to pass from a first electrode of the first reset transistor Tr1 to a second electrode of the first reset transistor Tr1; and in turn to the node N4. The anode of the light emitting element LE is initialized. A turning-on reset control signal is provided through the respective first reset control signal line rst1 to the gate electrode of the third reset transistor Tr3 to turn on the third reset transistor Tr3; allowing an initialization voltage signal from the respective third reset signal line Vint3 to pass from a first electrode of the third reset transistor Tr3 to a second electrode of the third reset transistor Tr3; and in turn to the node N2. The node N2 is initialized. The second capacitor electrode Ce2 receives a high voltage signal from the respective voltage supply line Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective first gate line GL1 is provided with a turning-off signal, thus the first transistor T1 is turned off. The respective light emitting control signal line em is provided with a high voltage signal to turn off the third transistor T3 and the fourth transistor T4.

In the data write sub-phase t2, a turning-on reset control signal is provided through the second reset control signal line rst2 to the gate electrode of the second reset transistor Tr2 to turn on the second reset transistor Tr2; allowing an initialization voltage signal from the respective second reset signal line Vint2 to pass from a first electrode of the second reset transistor Tr2 to a second electrode of the second reset transistor Tr2, and in turn to the first capacitor electrode Ce1 and the gate electrode of the driving transistor Td. The gate electrode of the driving transistor Td is initialized.

In the data write sub-phase t2, the turning-off reset control signal is again provided through the respective first reset control signal line rst1 to the gate electrode of the first reset transistor Tr1 and the gate electrode of the third reset transistor Tr3 to turn off the first reset transistor Tr1 and the third reset transistor Tr3. The respective first gate line GL1 and the respective second gate line GL2 are provided with a turning-on signal, thus the first transistor T1 and the second transistor T2 are turned on. A second electrode of the driving transistor Td is connected with the second electrode of the second transistor T2. A gate electrode of the driving transistor Td is electrically connected with the first electrode of the second transistor T2. Because the second transistor T2 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The first transistor T1 is turned on in the data write sub-phase t2. The data voltage signal transmitted through the respective data line DL is received by a first electrode of the first transistor T1, and in turn transmitted to the first electrode of the driving transistor Td, which is connected to the second electrode of the first transistor T1. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line em is provided with a high voltage signal to turn off the third transistor T3 and the fourth transistor T4.

In the light emitting sub-phase t3, a turning-off reset control signal is provided through the respective second reset control signal line rst2 to the gate electrode of the second reset transistor Tr2 to turn off the second reset transistor Tr2. A turning-off reset control signal is provided through the respective first reset control signal line rst1 to the gate electrode of the first reset transistor Tr1 and the gate electrode of the third reset transistor Tr3 to turn off the first reset transistor Tr1 and the third reset transistor Tr3. The respective first gate line GL1 and the respective second gate line GL2 are provided with a turning-off signal, the first transistor T1 and the second transistor T2 are turned off. The respective light emitting control signal line em is provided with a low voltage signal to turn on the third transistor T3 and the fourth transistor T4. The voltage level at the node N1 in the light emitting sub-phase t3 is maintained at (Vdata+Vth), the driving transistor Td is turned on by the voltage level, and working in the saturation area. A path is formed through the third transistor T3, the driving transistor Td, the fourth transistor T4, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 3A:
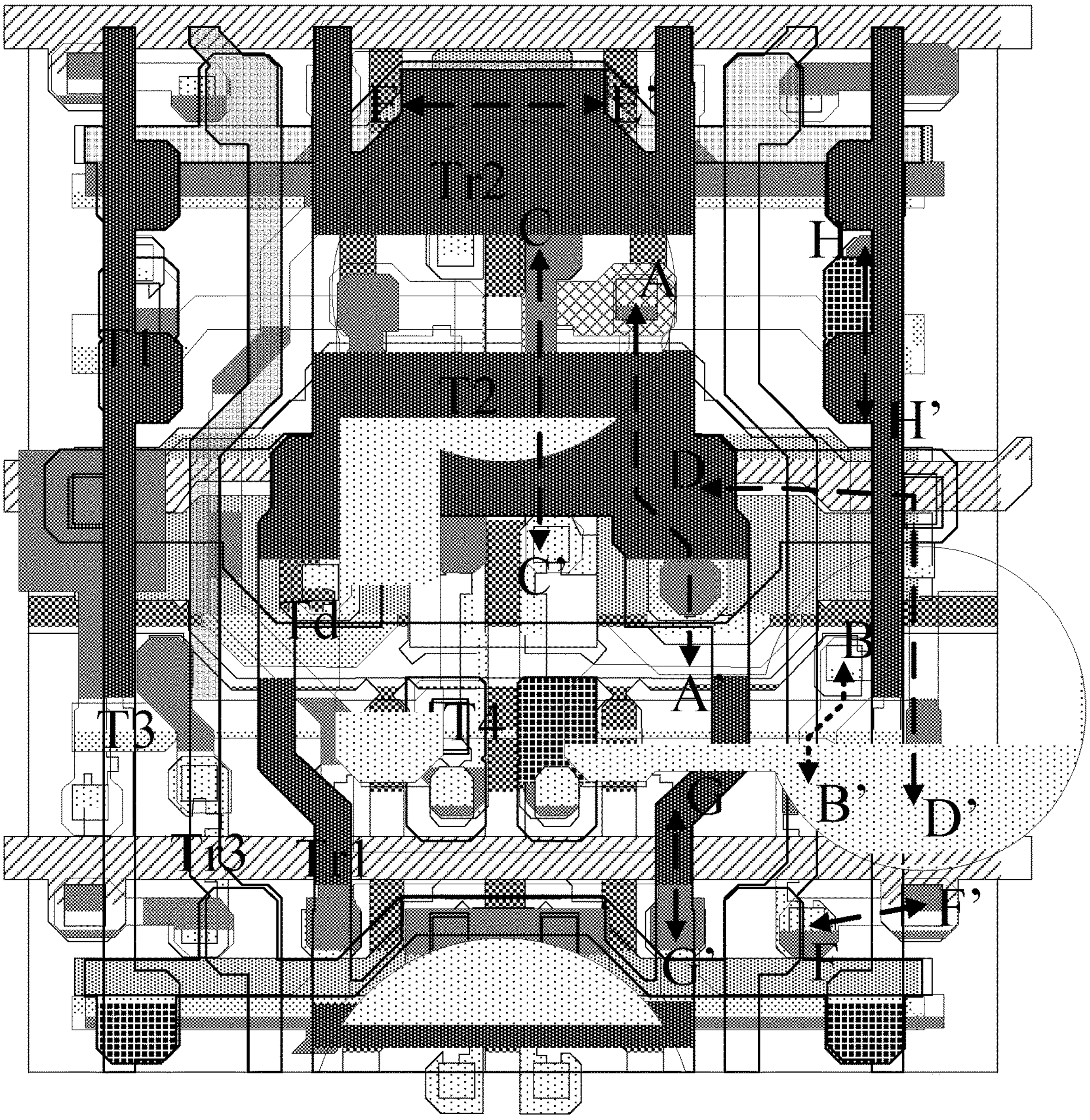
FIG. 3A is a diagram illustrating the structure of pixel driving circuits in an array substrate in some embodiments according to the present disclosure.
Figure 3B:
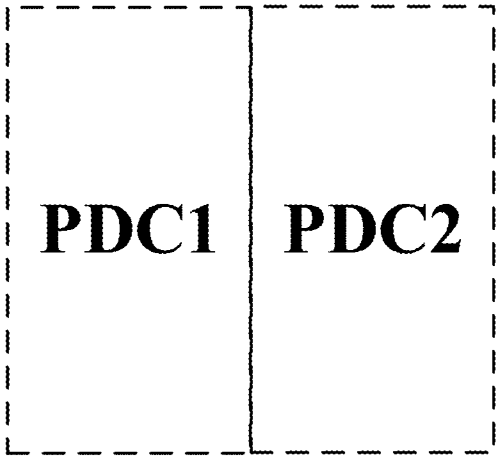
FIG. 3B is a schematic diagram illustrating an arrangement of pixel driving circuits in the array substrate depicted in FIG. 3A.

FIG. 3A is a diagram illustrating the structure of pixel driving circuits in an array substrate in some embodiments according to the present disclosure. FIG. 3B is a schematic diagram illustrating an arrangement of pixel driving circuits in an array substrate depicted in FIG. 3A. FIG. 3A and FIG. 3B depicts a portion of the array substrate having two adjacent pixel driving circuits, including PDC1 and PDC2.

Figure 3C:
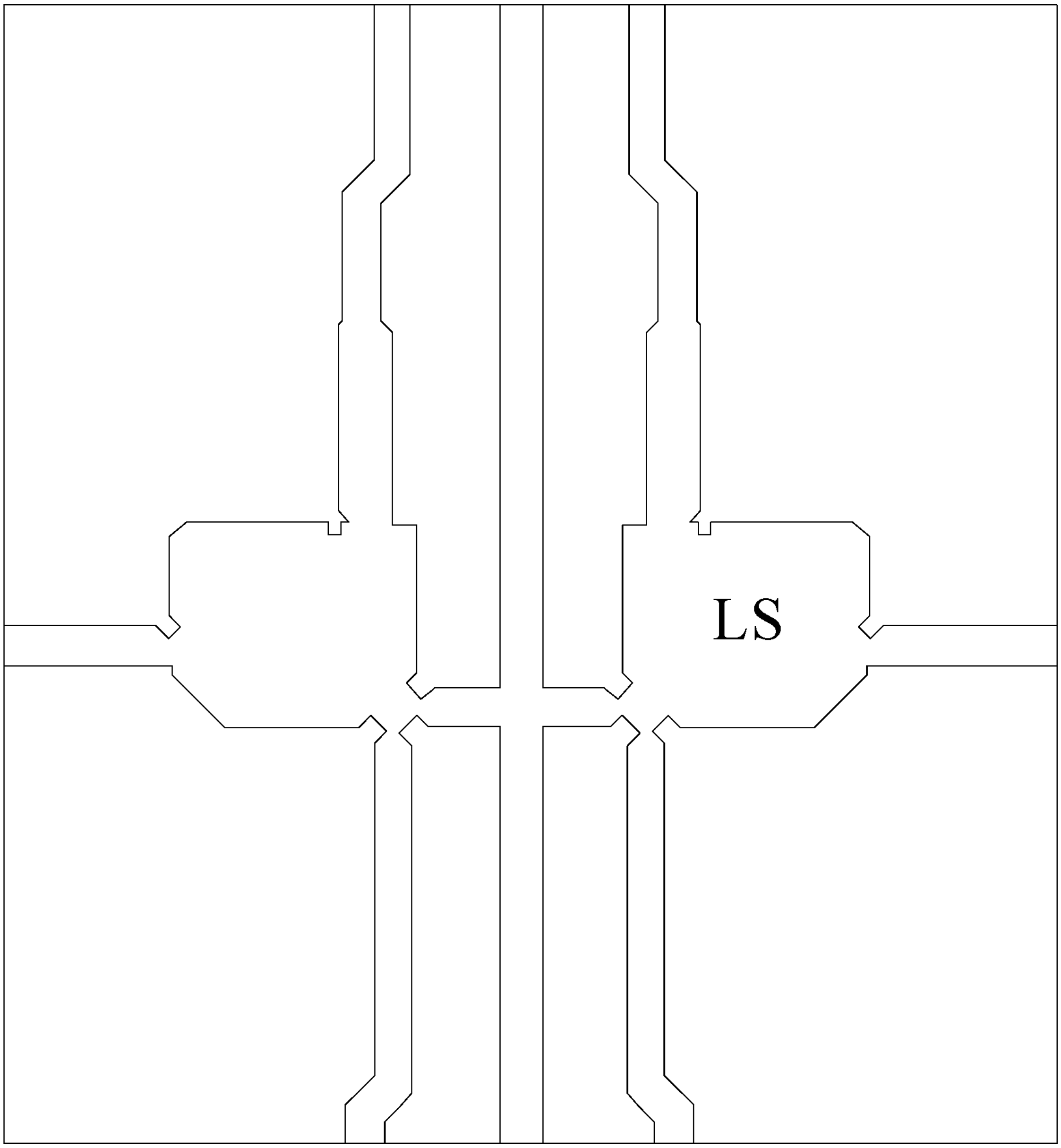
FIG. 3C is a diagram illustrating the structure of a light shielding layer in the array substrate depicted in FIG. 3A.
Figure 3D:
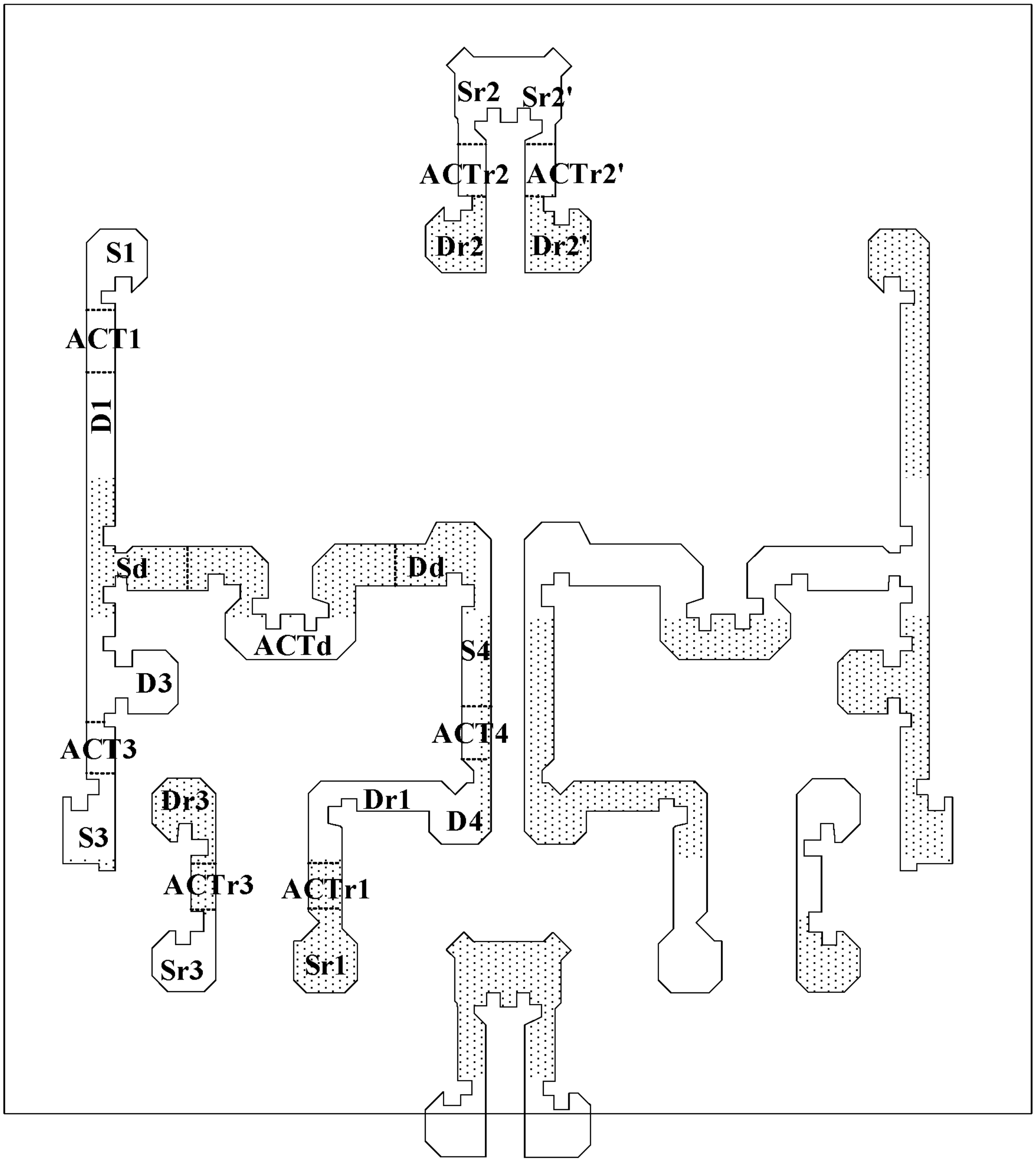
FIG. 3D is a diagram illustrating the structure of a first semiconductor material layer in the array substrate depicted in FIG. 3A.
Figure 3E:
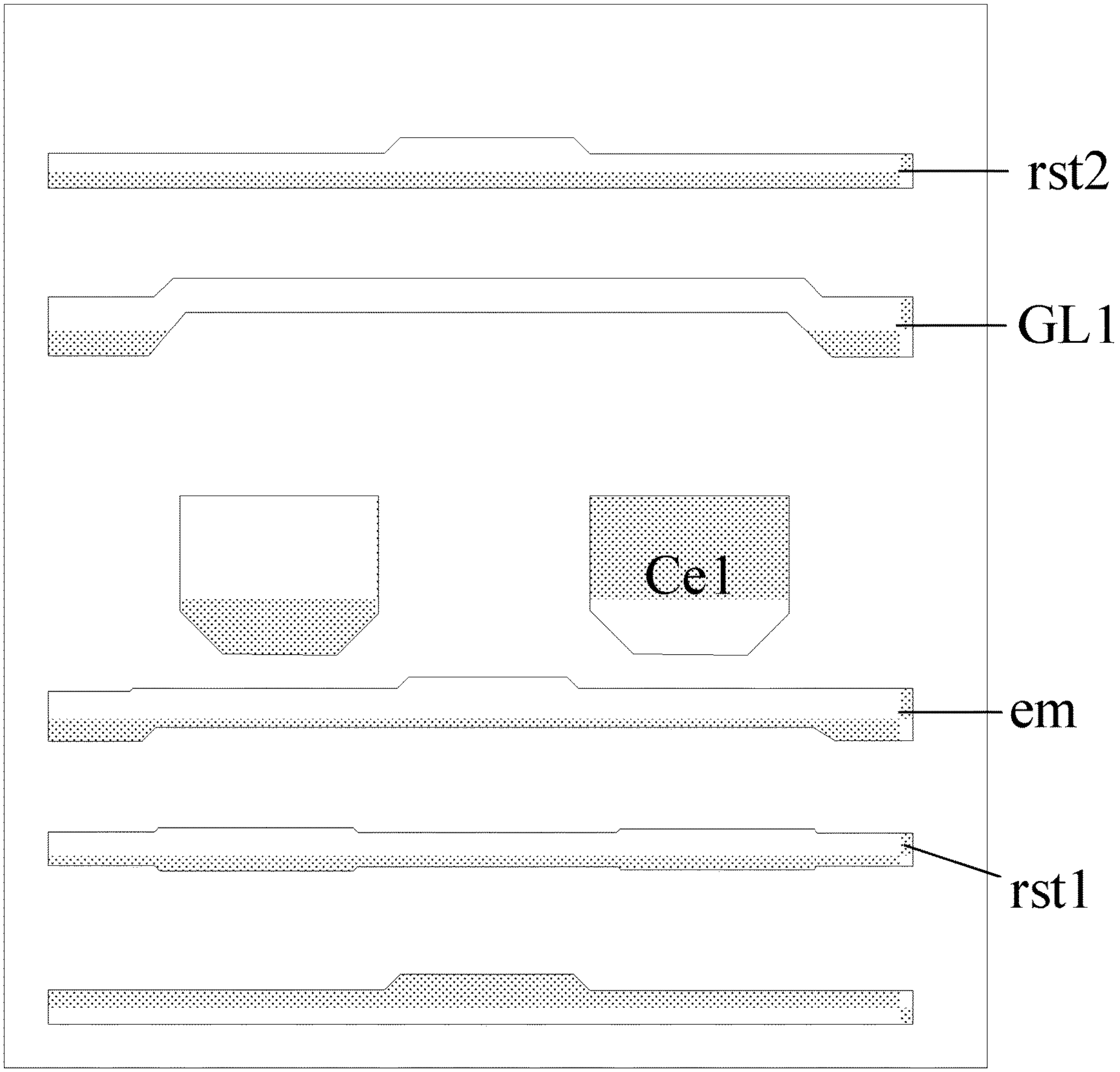
FIG. 3E is a diagram illustrating the structure of a first gate metal layer in the array substrate depicted in FIG. 3A.
Figure 3F:
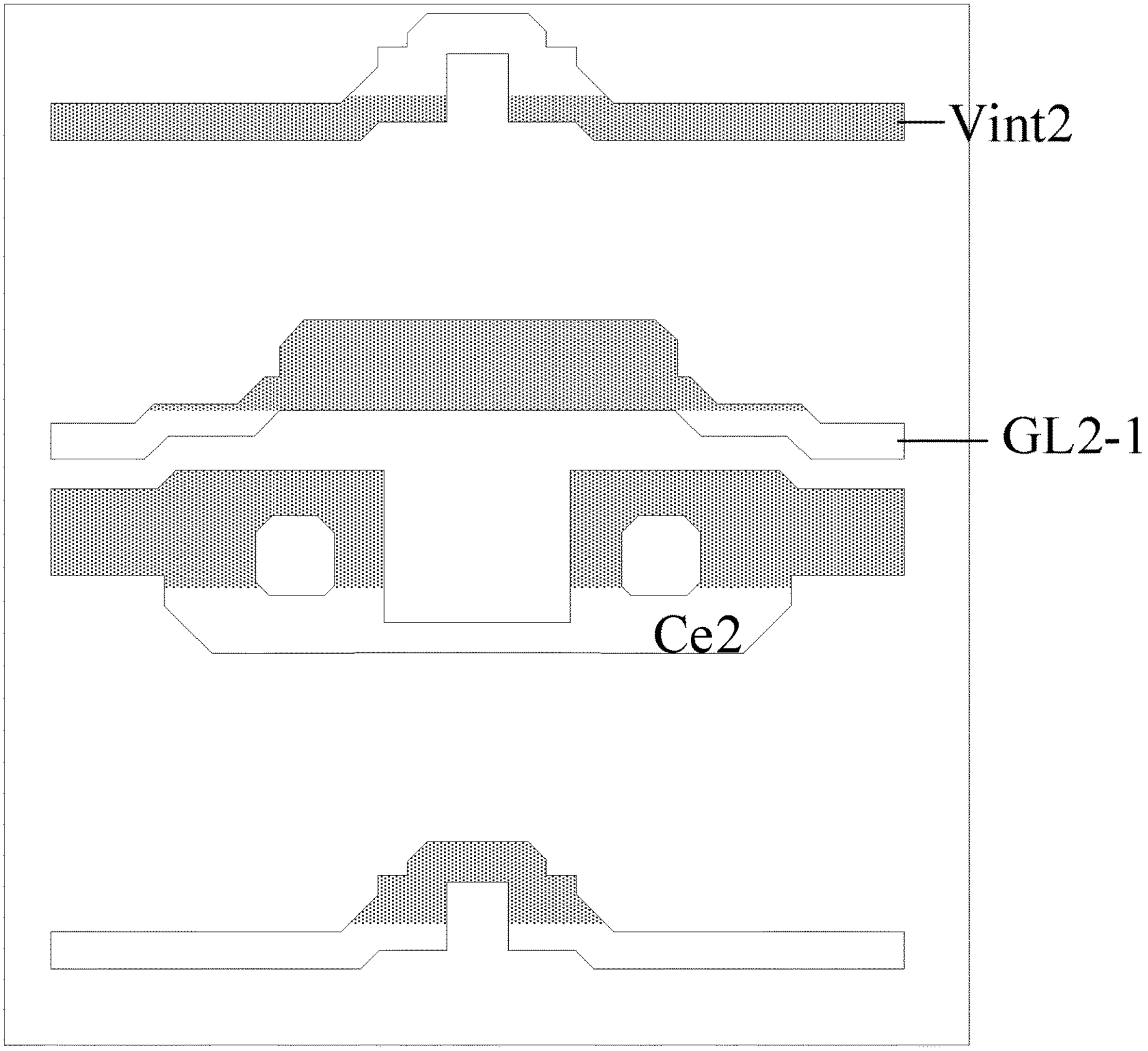
FIG. 3F is a diagram illustrating the structure of a second gate metal layer in the array substrate depicted in FIG. 3A.
Figure 3G:
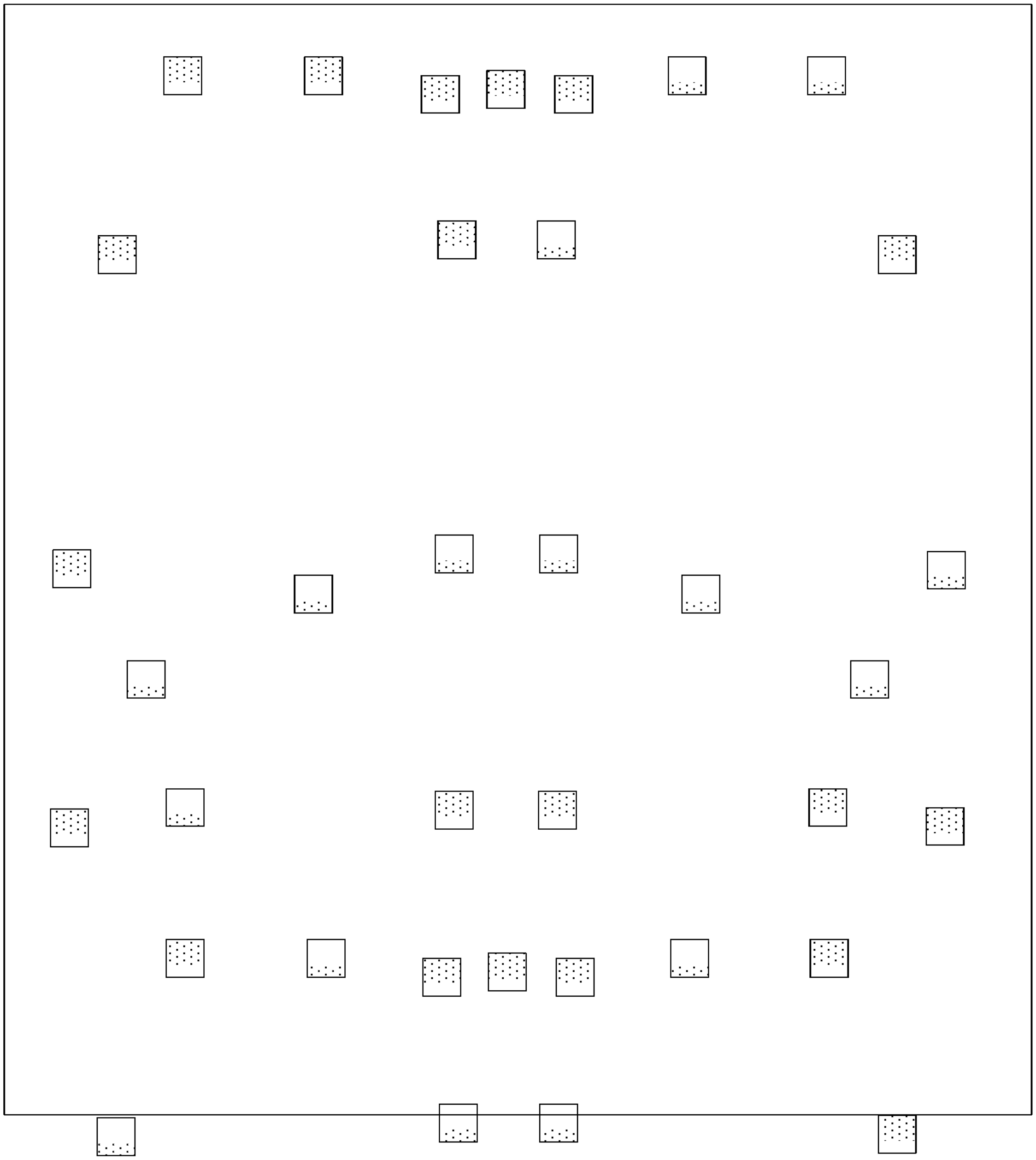
FIG. 3G is a diagram illustrating vias extending through a first inter-layer dielectric layer in the array substrate depicted in FIG. 3A.
Figure 3H:
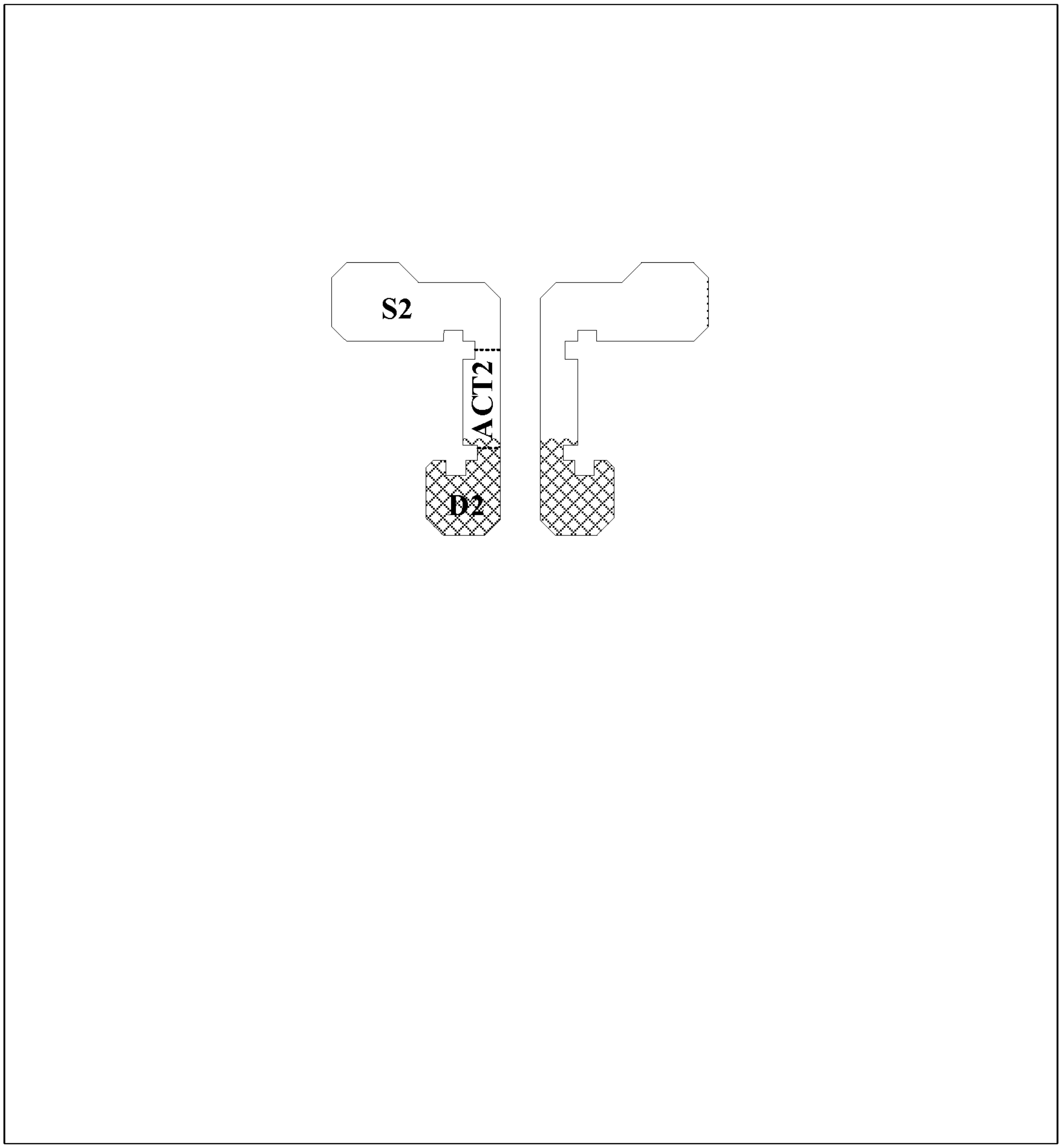
FIG. 3H is a diagram illustrating the structure of a second semiconductor material layer in the array substrate depicted in FIG. 3A.
Figure 3I:
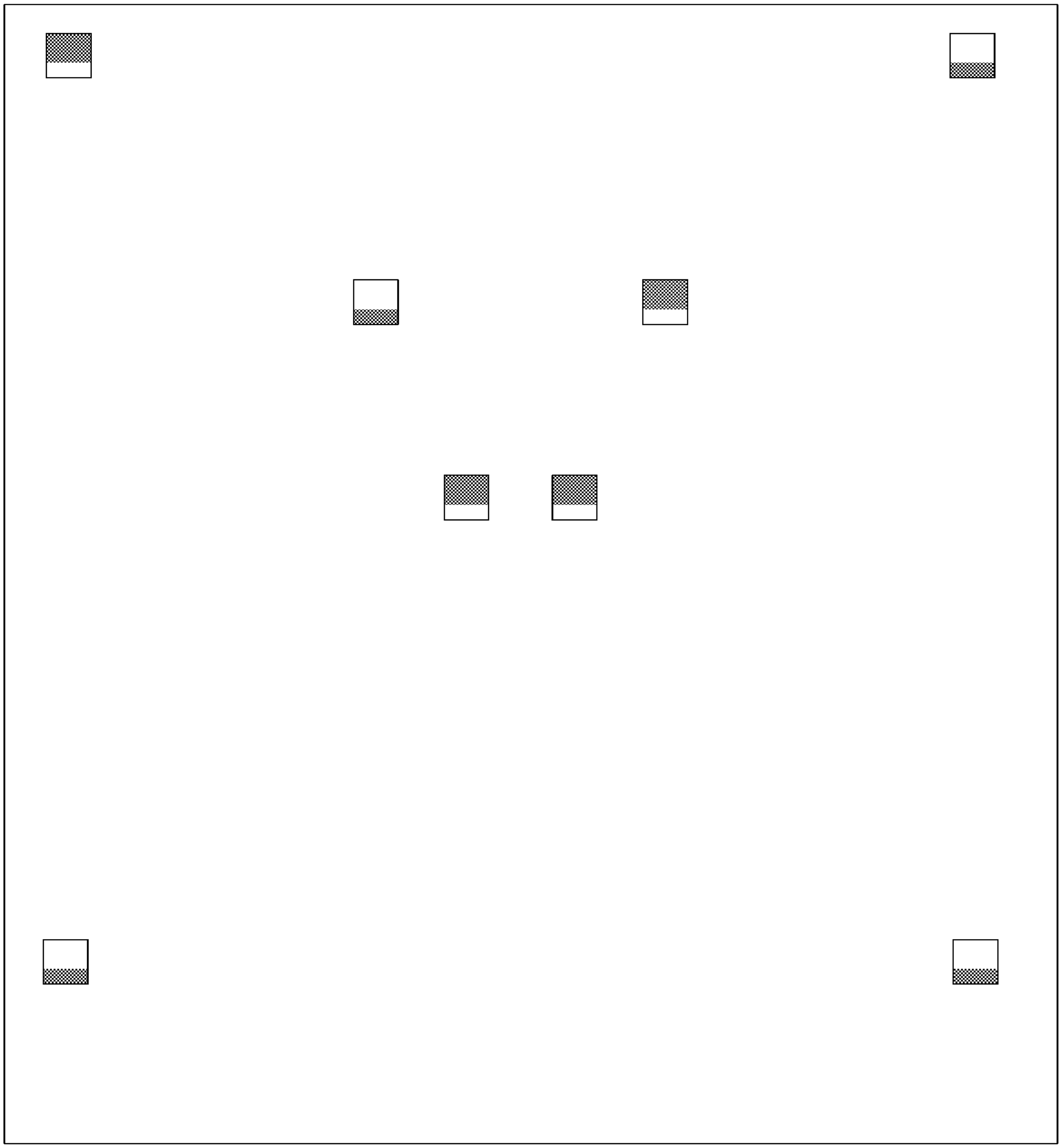
FIG. 3I is a diagram illustrating vias extending through a second inter-layer dielectric layer in the array substrate depicted in FIG. 3A.
Figure 3J:
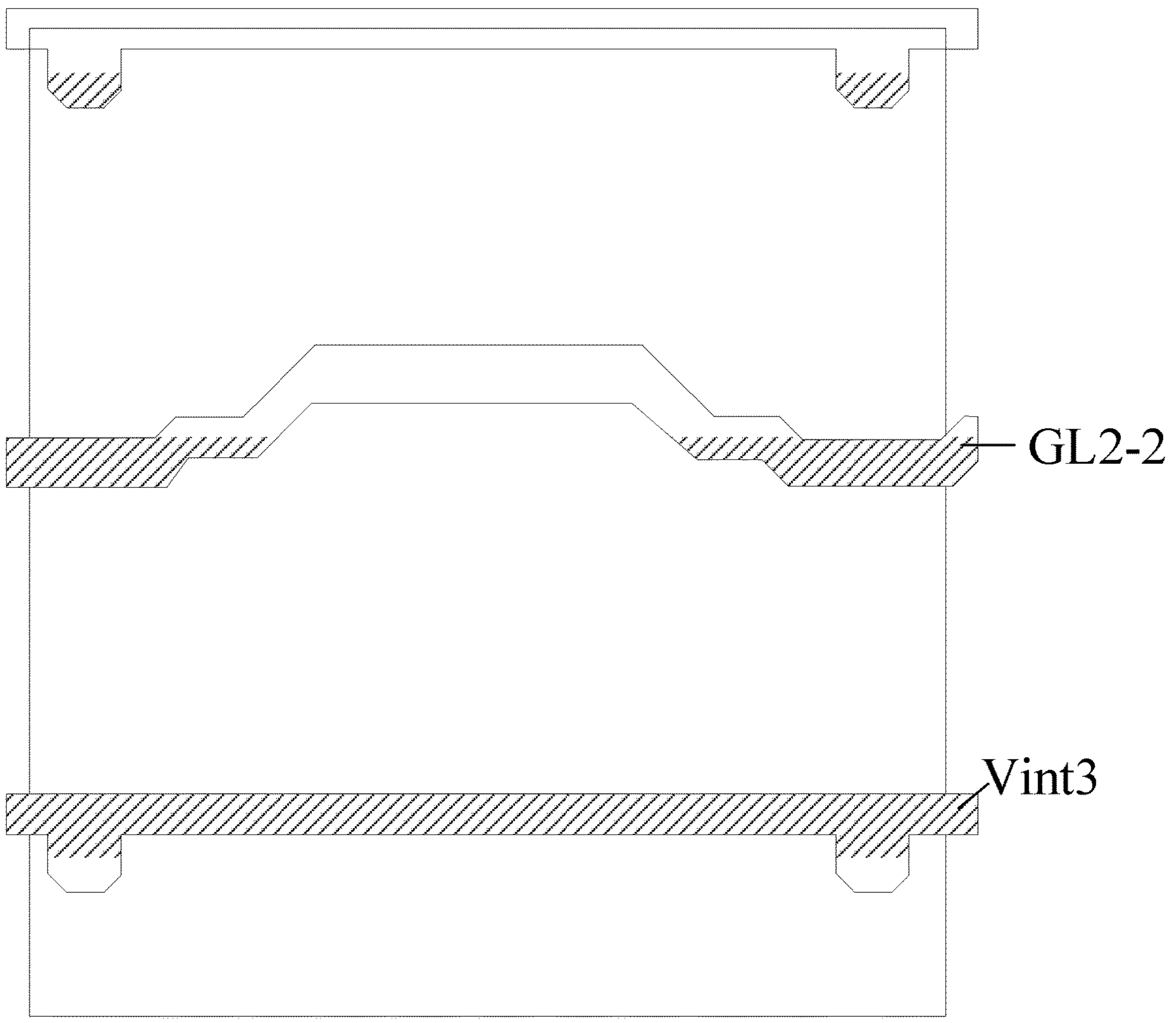
FIG. 3J is a diagram illustrating the structure of a third gate metal layer in the array substrate depicted in FIG. 3A.
Figure 3K:
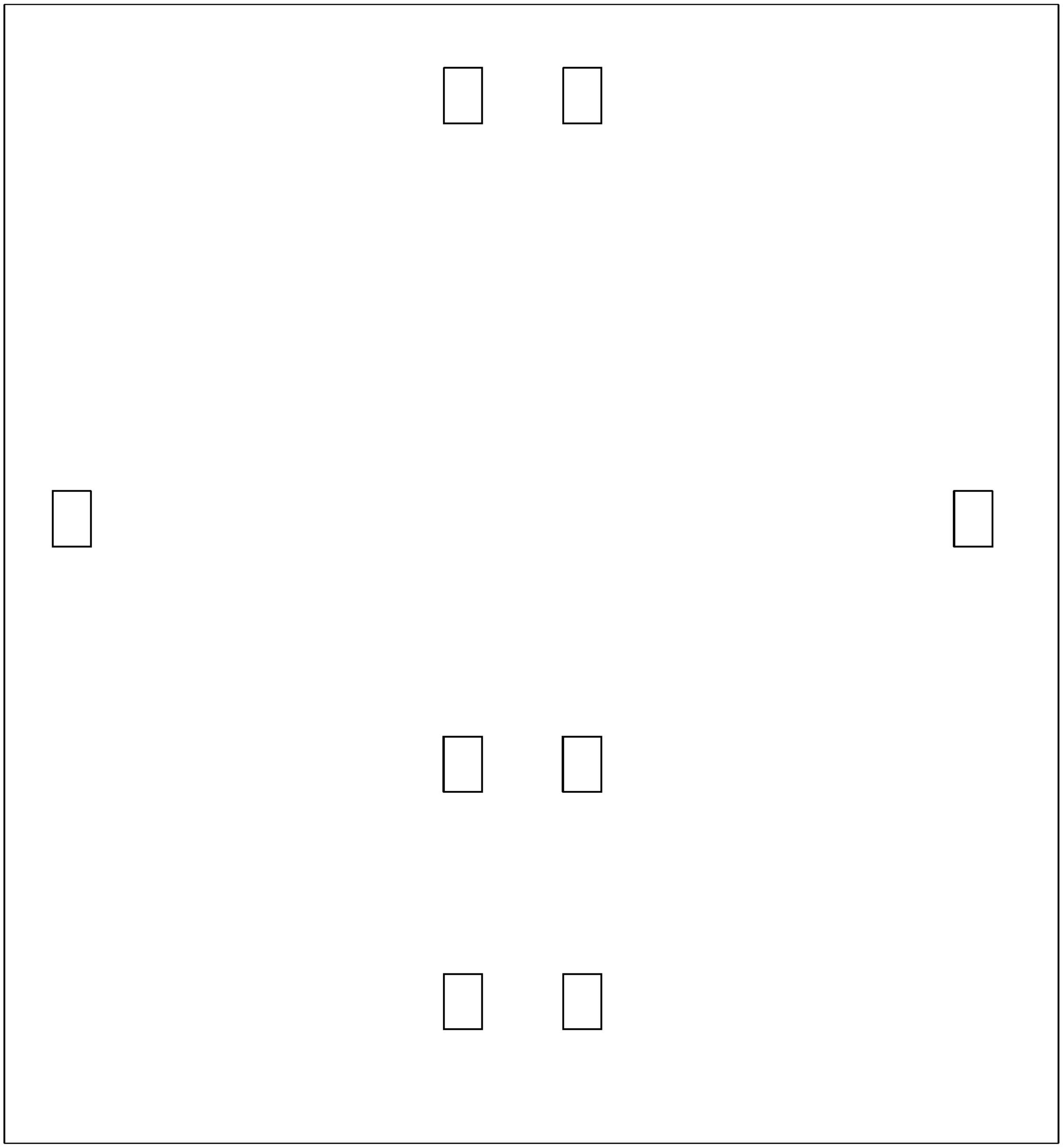
FIG. 3K is a diagram illustrating vias extending through a passivation layer in the array substrate depicted in FIG. 3A.
Figure 3L:
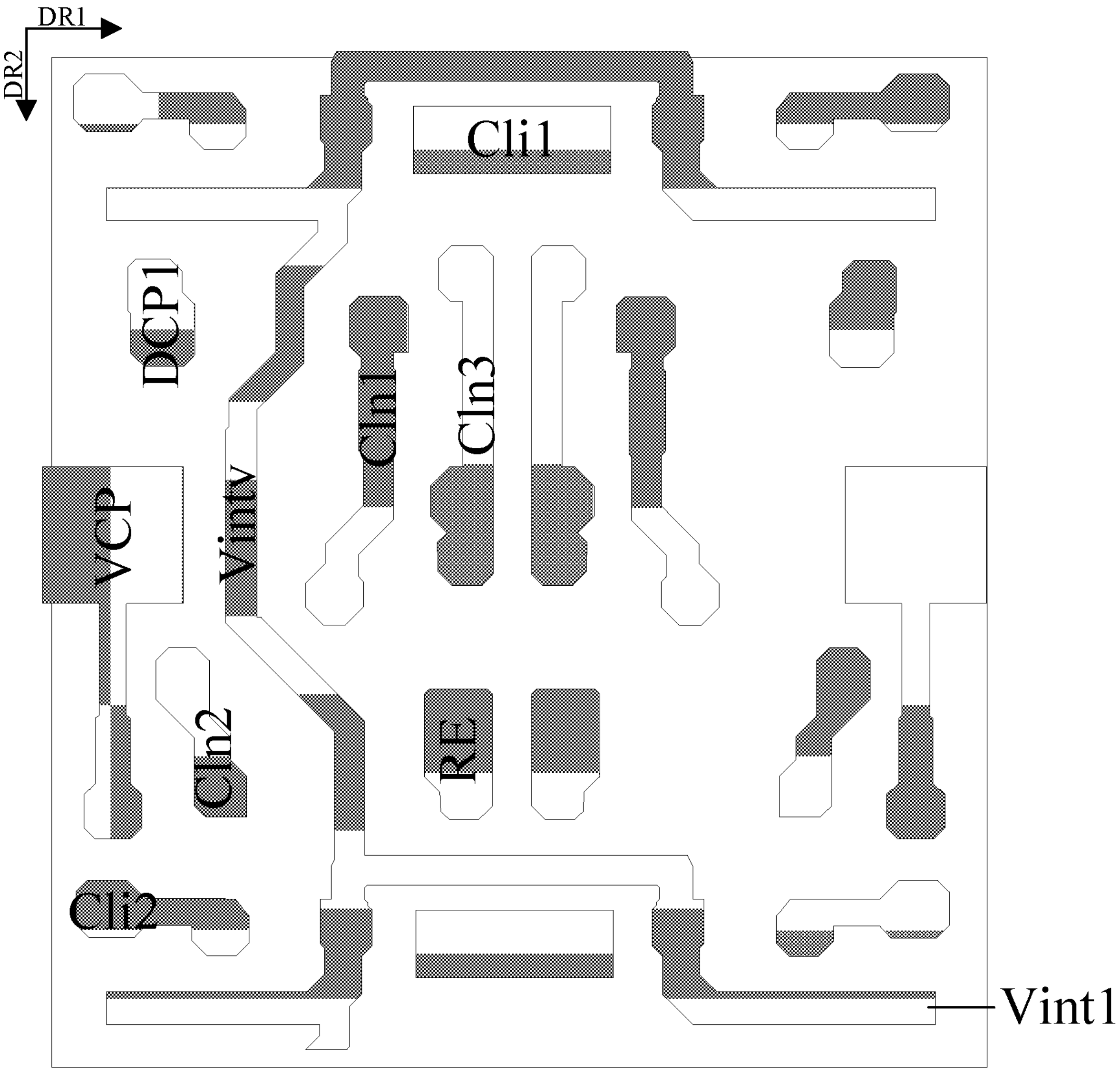
FIG. 3L is a diagram illustrating the structure of a first signal line layer in the array substrate depicted in FIG. 3A.
Figure 3M:
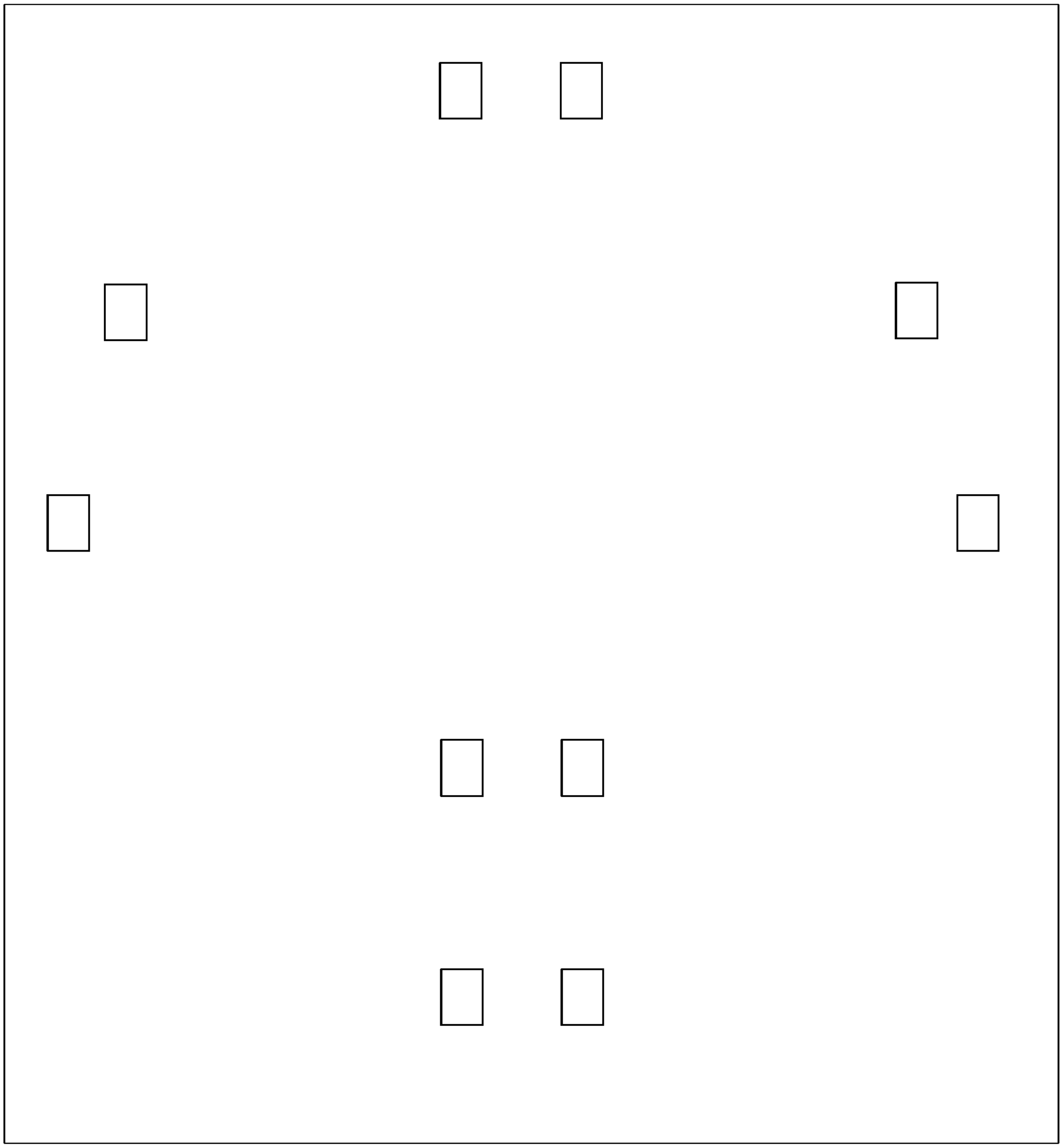
FIG. 3M is a diagram illustrating vias extending through a first planarization layer in the array substrate depicted in FIG. 3A.
Figure 3N:
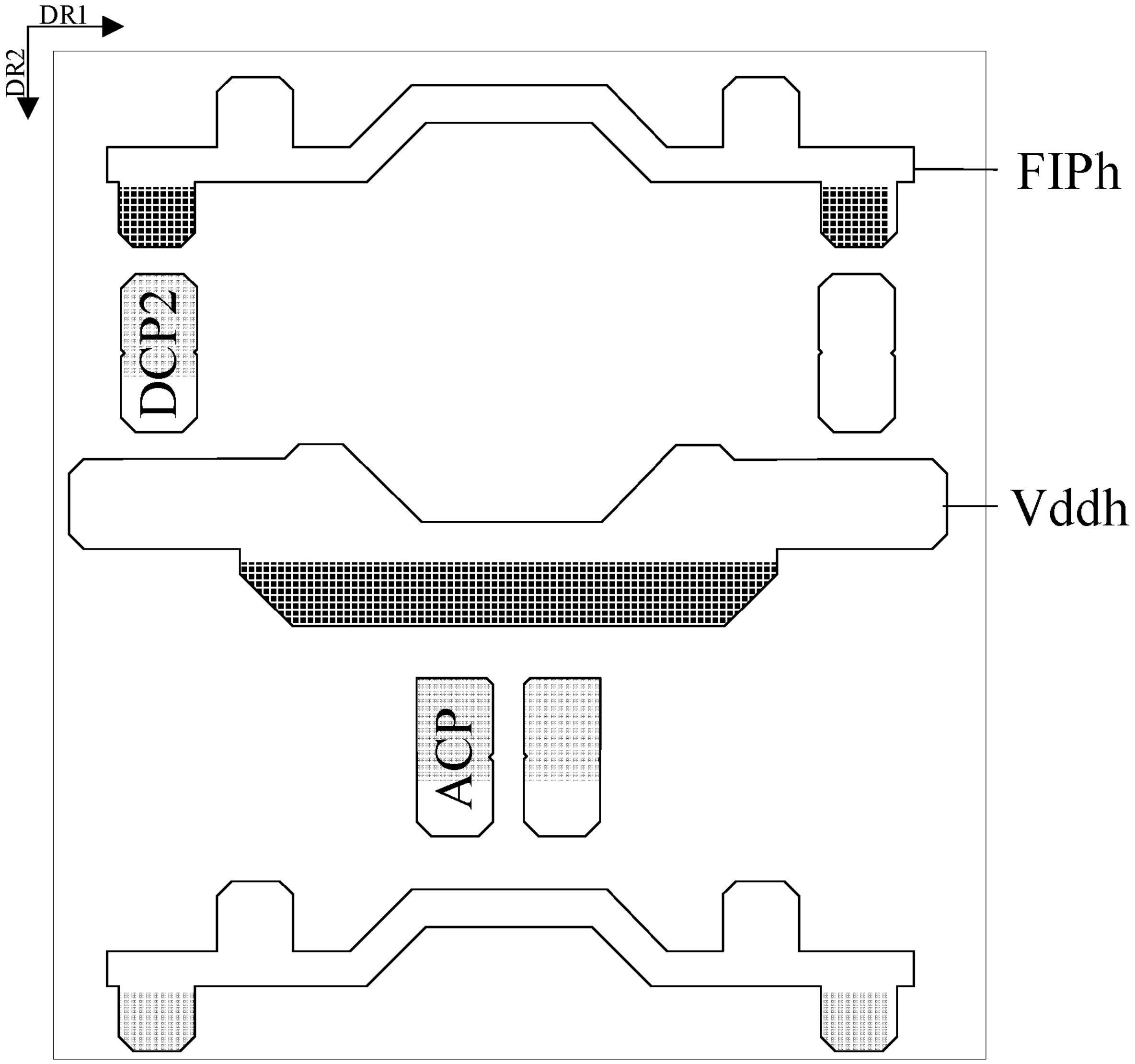
FIG. 3N is a diagram illustrating the structure of a second signal line layer in the array substrate depicted in FIG. 3A.
Figure 3O:
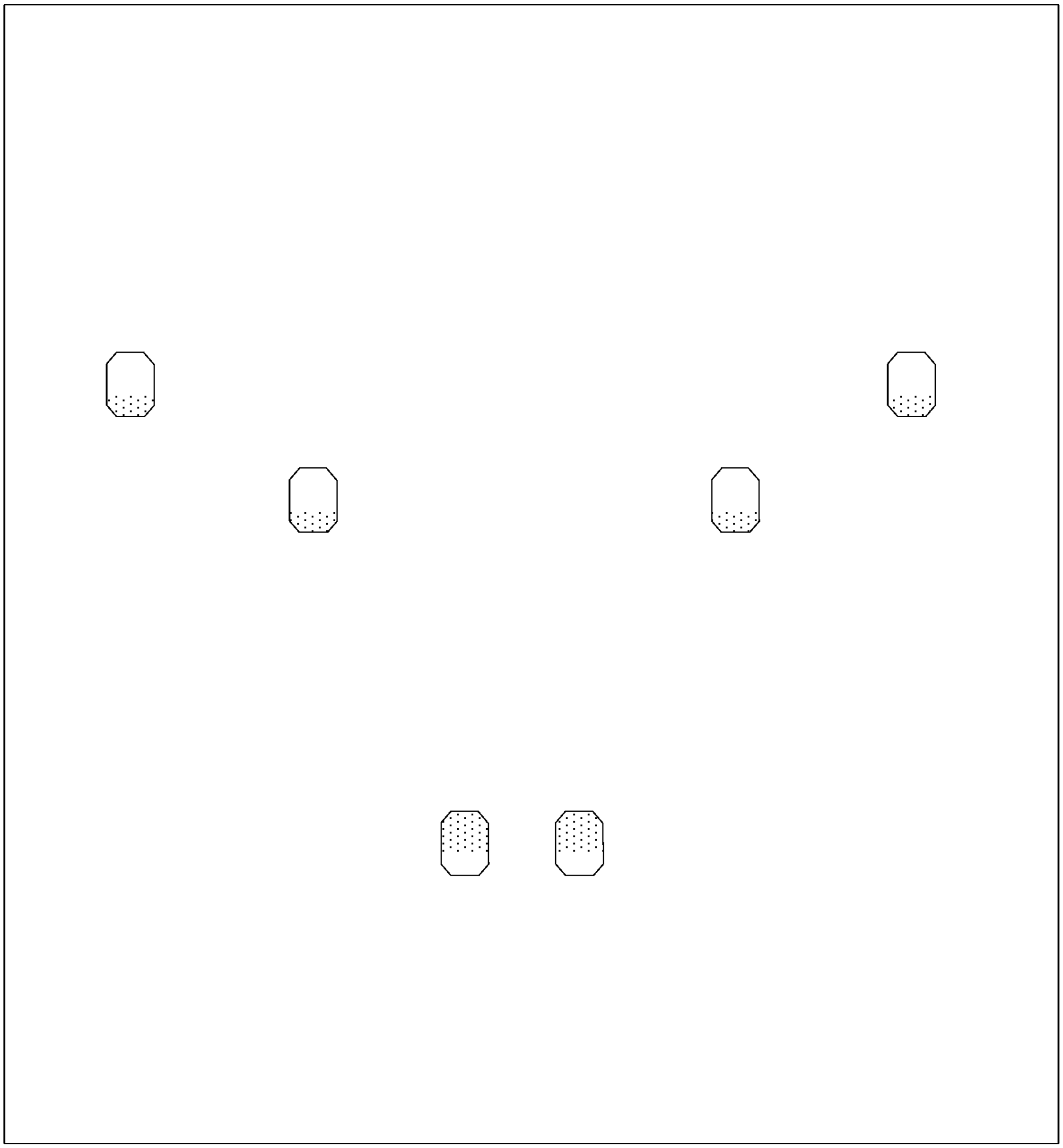
FIG. 3O is a diagram illustrating vias extending through a second planarization layer in the array substrate depicted in FIG. 3A.
Figure 3P:
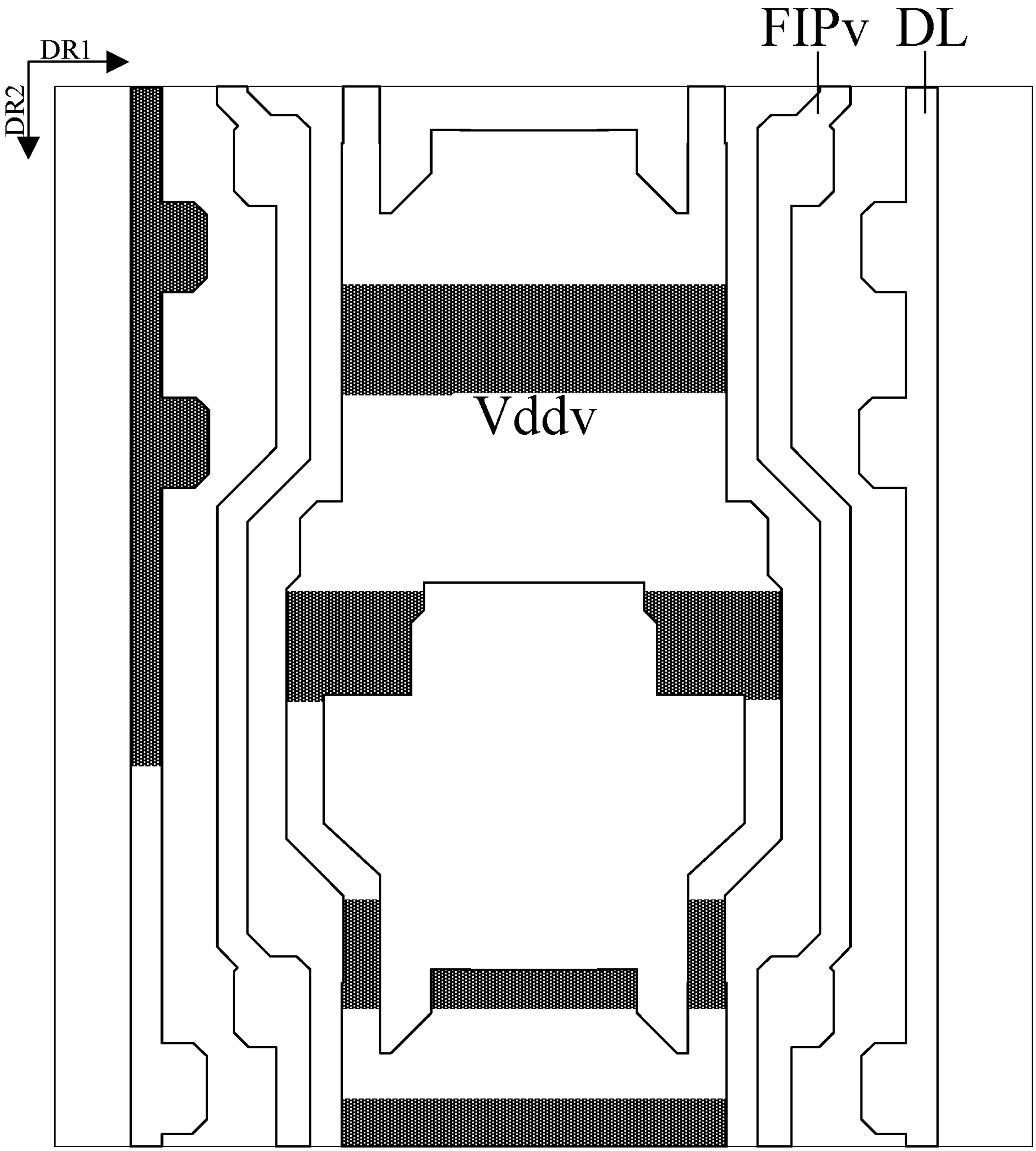
FIG. 3P is a diagram illustrating the structure of a third signal line layer in the array substrate depicted in FIG. 3A.
Figure 3Q:
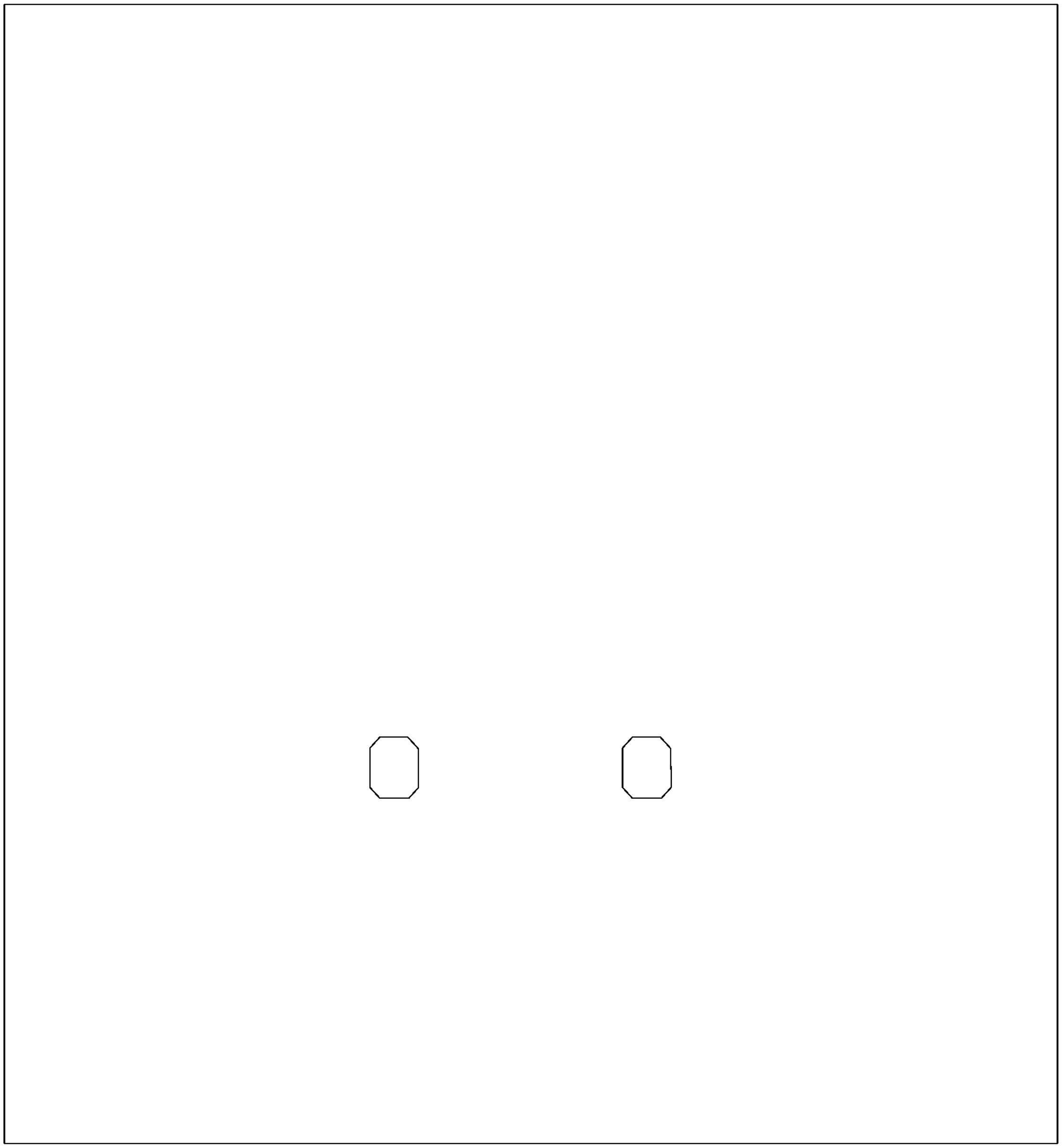
FIG. 3Q is a diagram illustrating vias extending through a third planarization layer in the array substrate depicted in FIG. 3A.
Figure 3R:
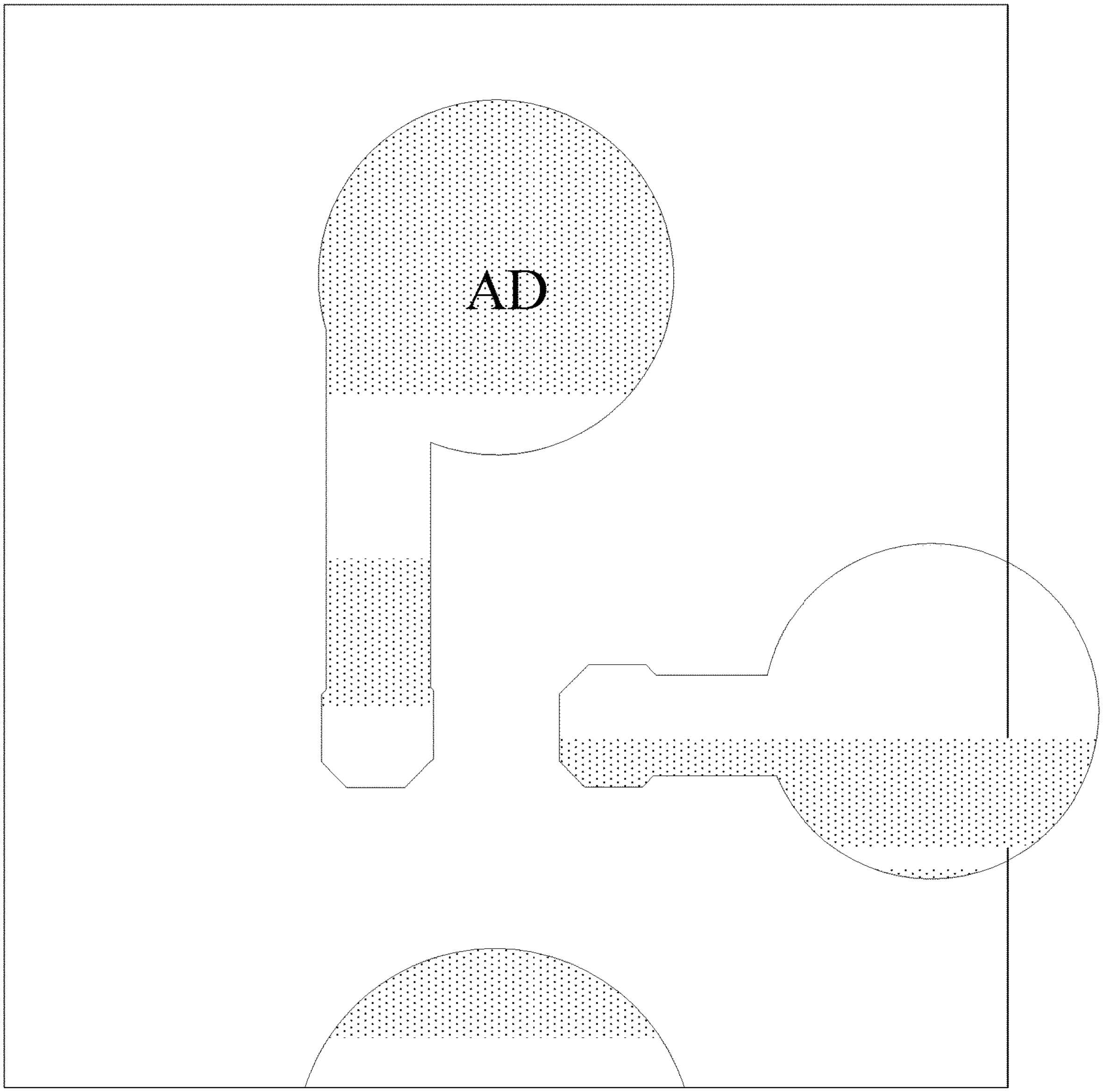
FIG. 3R is a diagram illustrating vias extending through an anode layer in the array substrate depicted in FIG. 3A.

FIG. 3C is a diagram illustrating the structure of a light shielding layer in the array substrate depicted in FIG. 3A. FIG. 3D is a diagram illustrating the structure of a first semiconductor material layer in the array substrate depicted in FIG. 3A. FIG. 3E is a diagram illustrating the structure of a first gate metal layer in the array substrate depicted in FIG. 3A. FIG. 3F is a diagram illustrating the structure of a second gate metal layer in the array substrate depicted in FIG. 3A. FIG. 3G is a diagram illustrating vias extending through a first inter-layer dielectric layer in the array substrate depicted in FIG. 3A. FIG. 3H is a diagram illustrating the structure of a second semiconductor material layer in the array substrate depicted in FIG. 3A. FIG. 3I is a diagram illustrating vias extending through a second inter-layer dielectric layer in the array substrate depicted in FIG. 3A. FIG. 3J is a diagram illustrating the structure of a third gate metal layer in the array substrate depicted in FIG. 3A. FIG. 3K is a diagram illustrating vias extending through a passivation layer in the array substrate depicted in FIG. 3A. FIG. 3L is a diagram illustrating the structure of a first signal line layer in the array substrate depicted in FIG. 3A. FIG. 3M is a diagram illustrating vias extending through a first planarization layer in the array substrate depicted in FIG. 3A. FIG. 3N is a diagram illustrating the structure of a second signal line layer in the array substrate depicted in FIG. 3A. FIG. 3O is a diagram illustrating vias extending through a second planarization layer in the array substrate depicted in FIG. 3A. FIG. 3P is a diagram illustrating the structure of a third signal line layer in the array substrate depicted in FIG. 3A. FIG. 3Q is a diagram illustrating vias extending through a third planarization layer in the array substrate depicted in FIG. 3A. FIG. 3R is a diagram illustrating vias extending through an anode layer in the array substrate depicted in FIG. 3A.

Figure 4A:
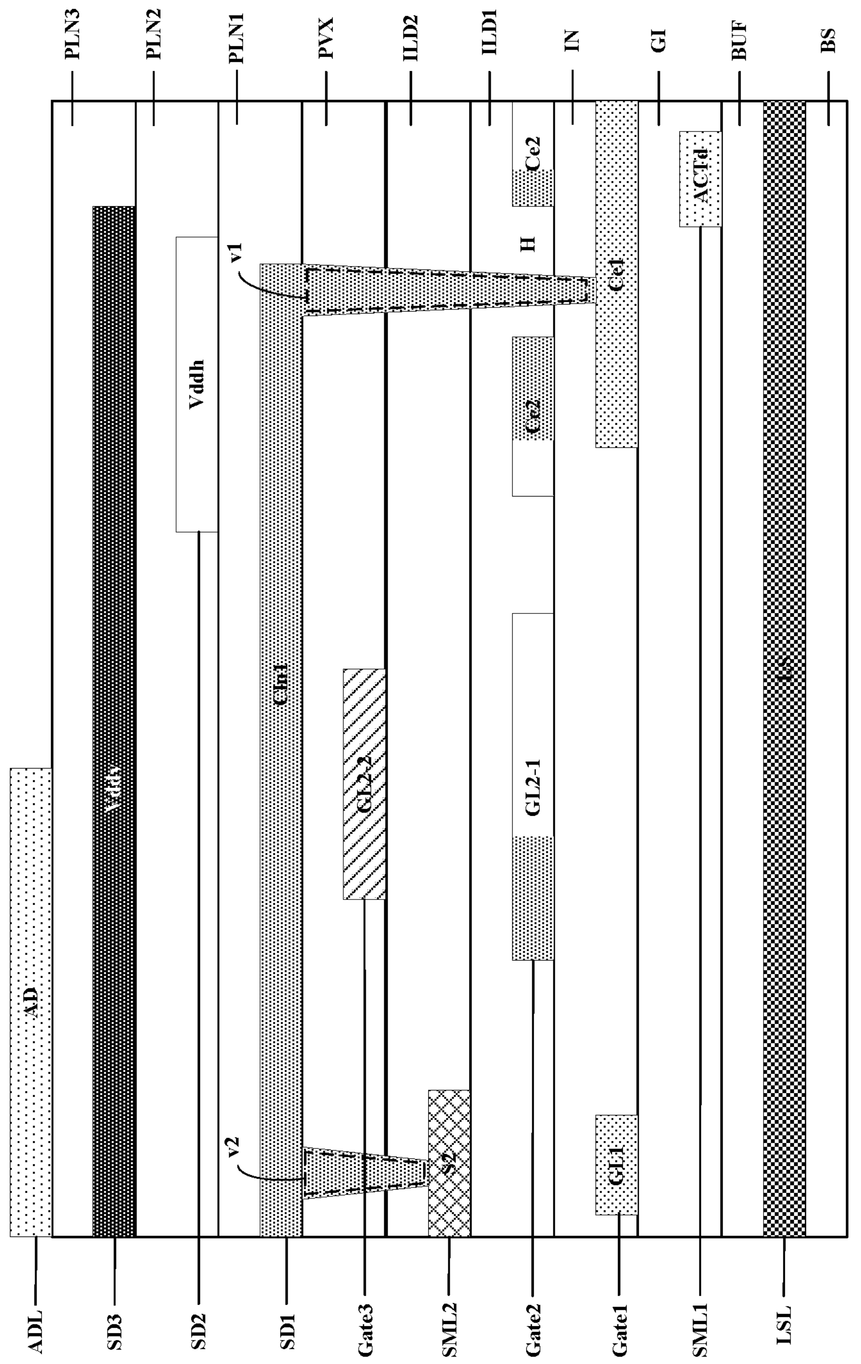
FIG. 4A is a cross-sectional view along an A-A' line in FIG. 3A.
Figure 4B:
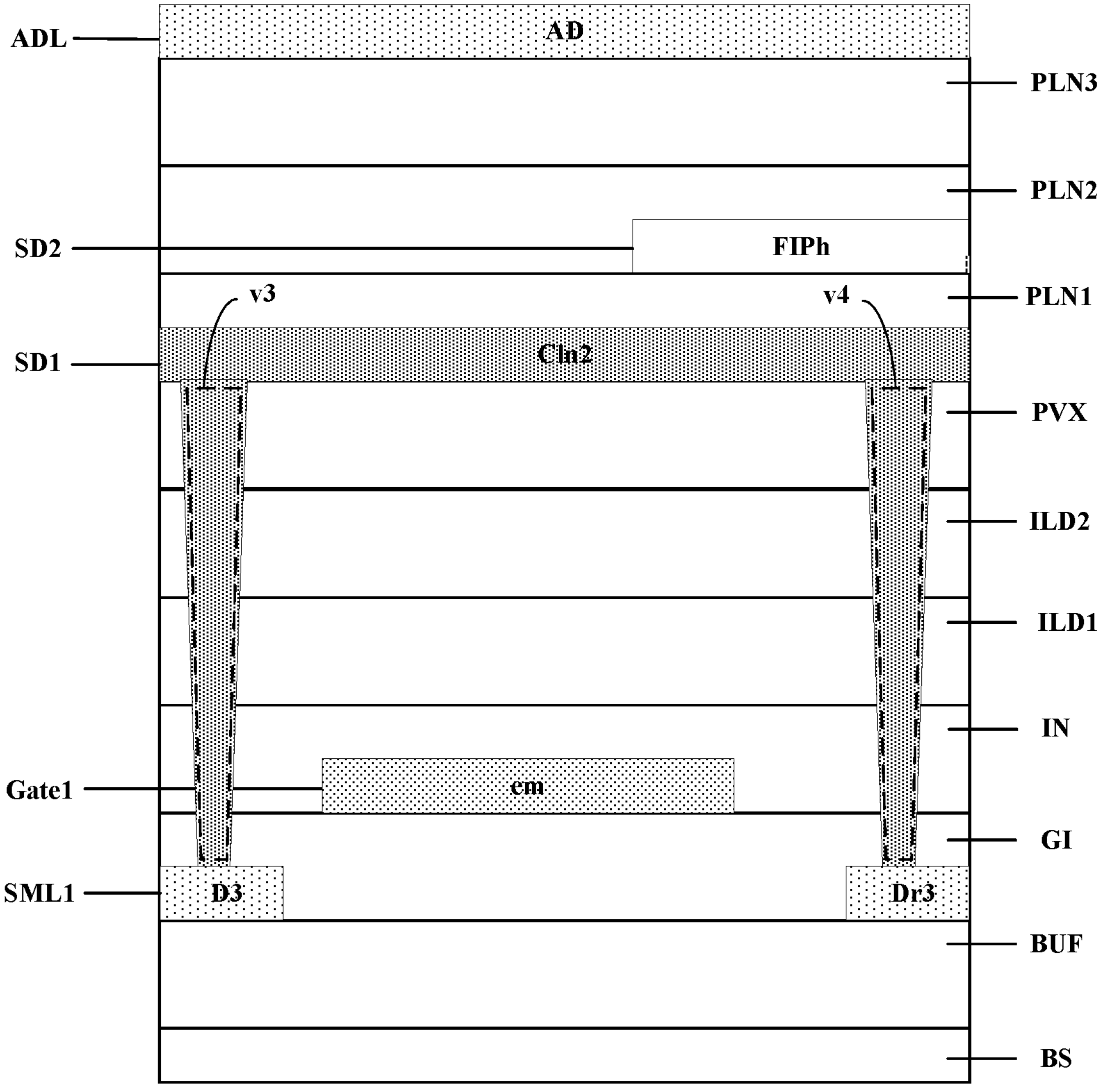
FIG. 4B is a cross-sectional view along a B-B' line in FIG. 3A.
Figure 4C:
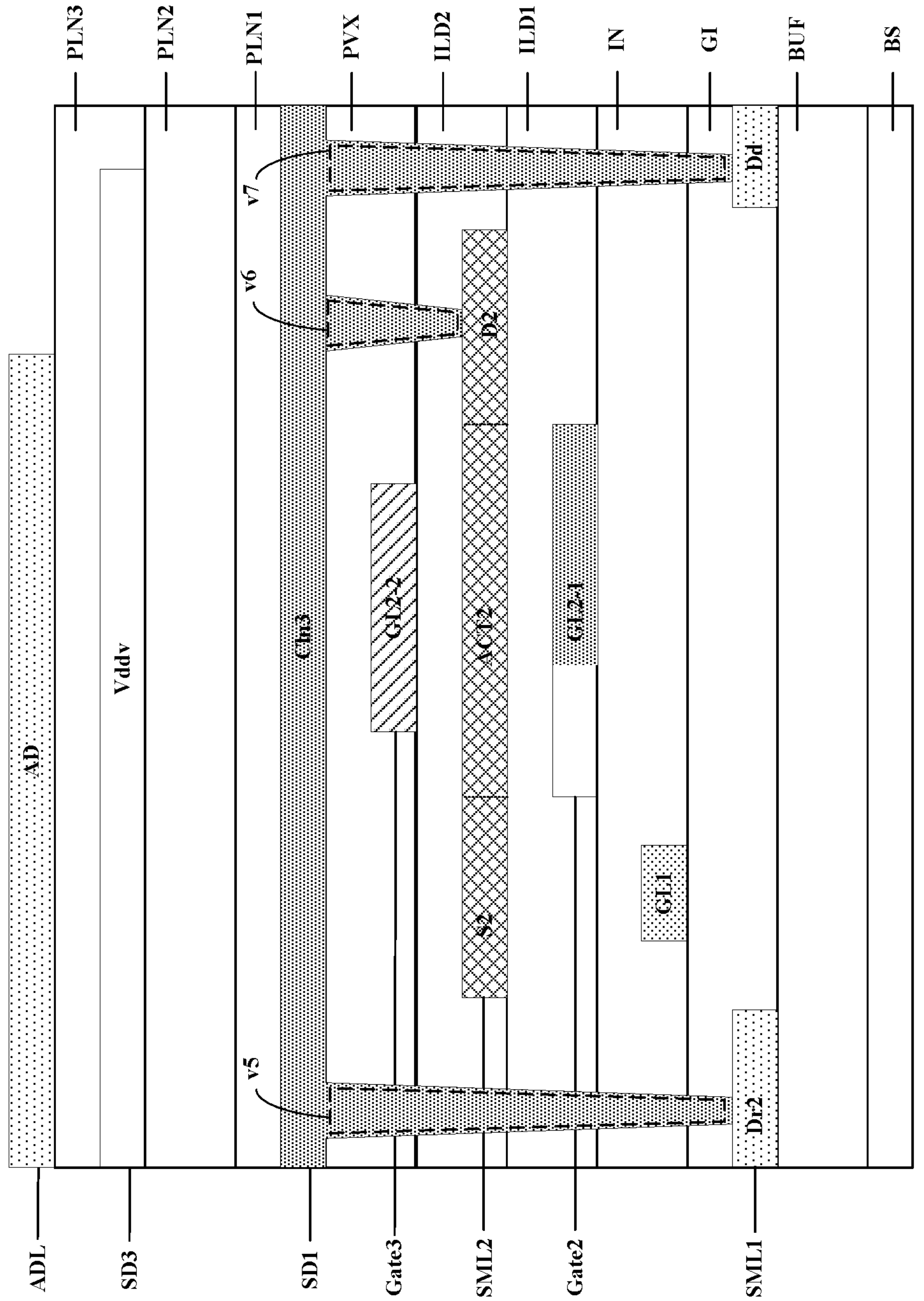
FIG. 4C is a cross-sectional view along a C-C' line in FIG. 3A.
Figure 4D:
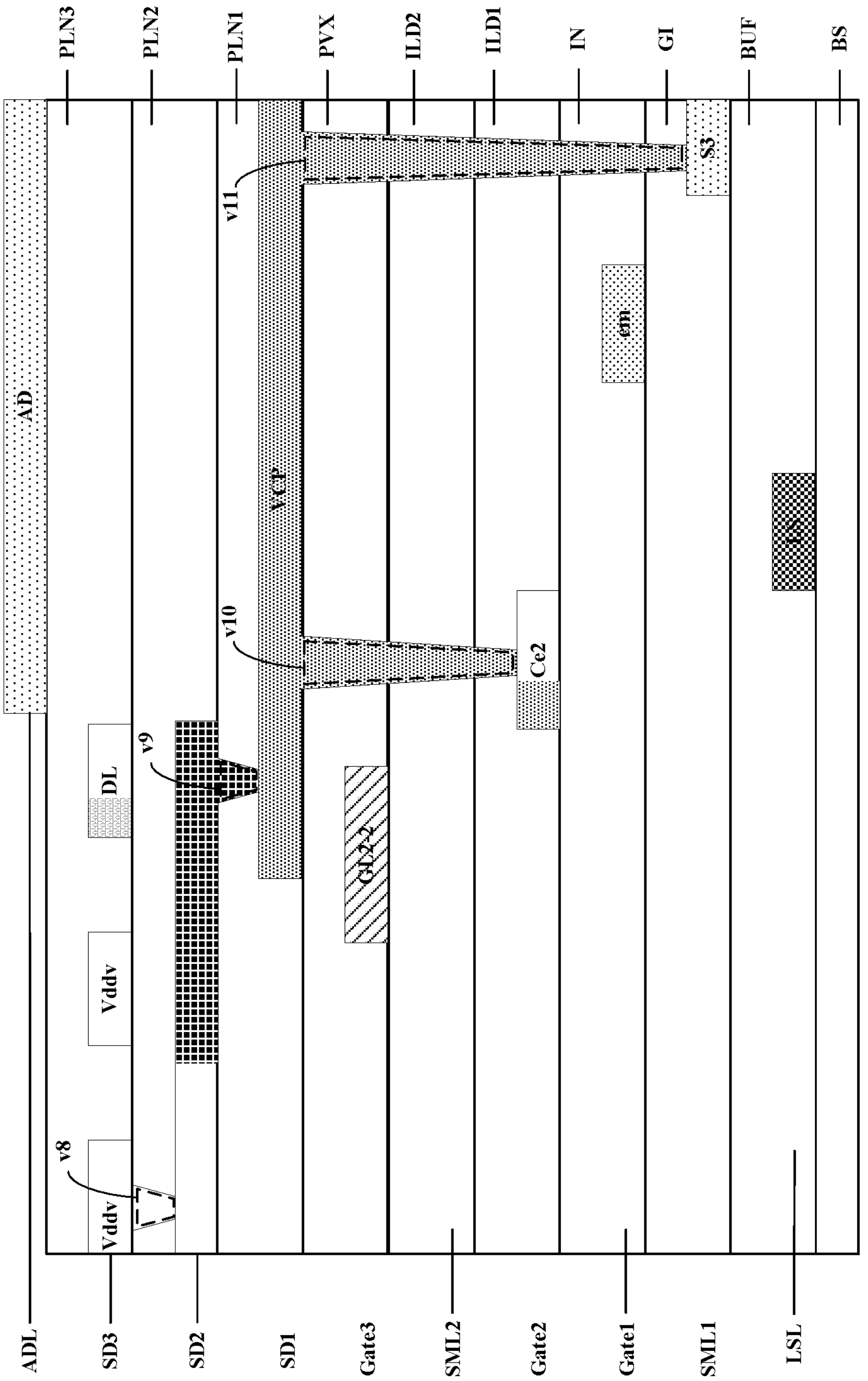
FIG. 4D is a cross-sectional view along a D-D' line in FIG. 3A.
Figure 4E:
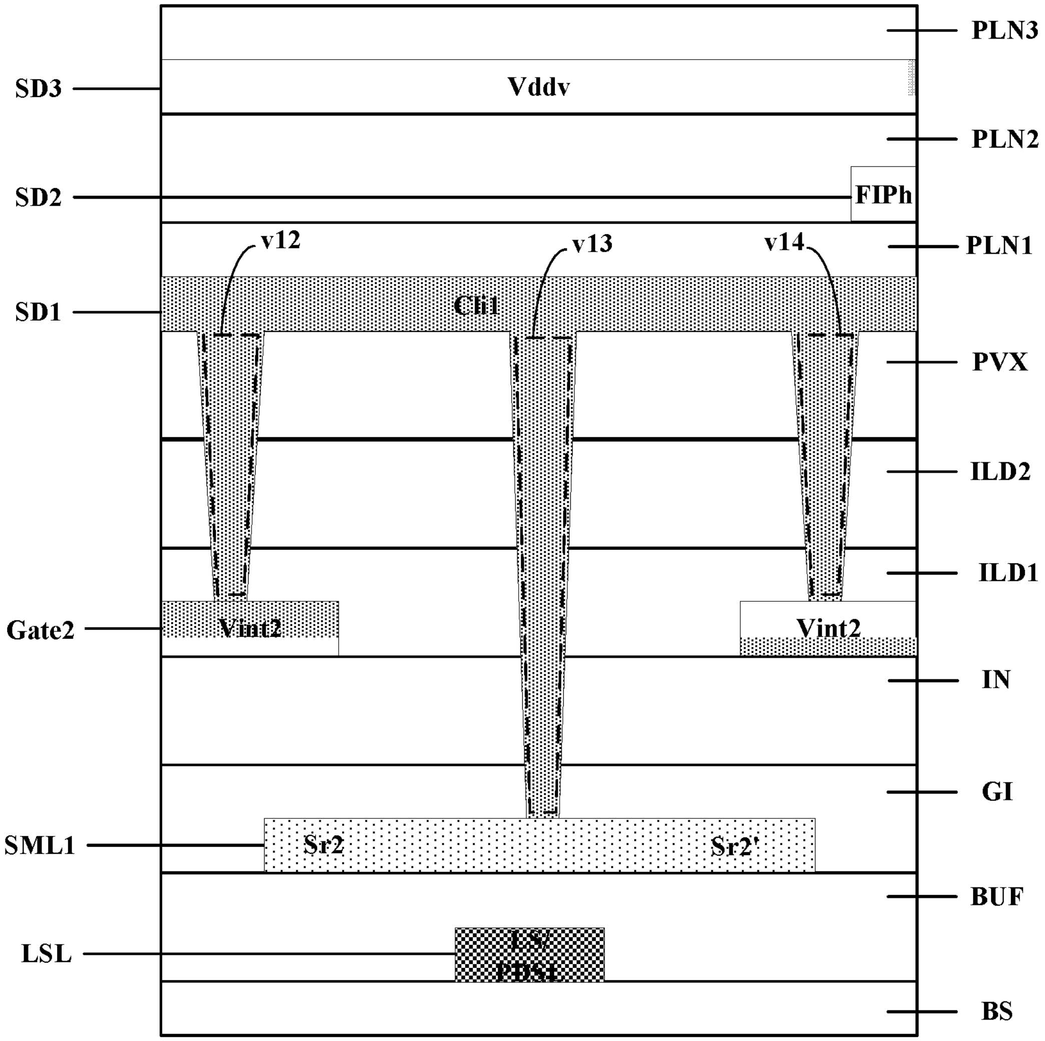
FIG. 4E is a cross-sectional view along a E-E' line in FIG. 3A.
Figure 4F:
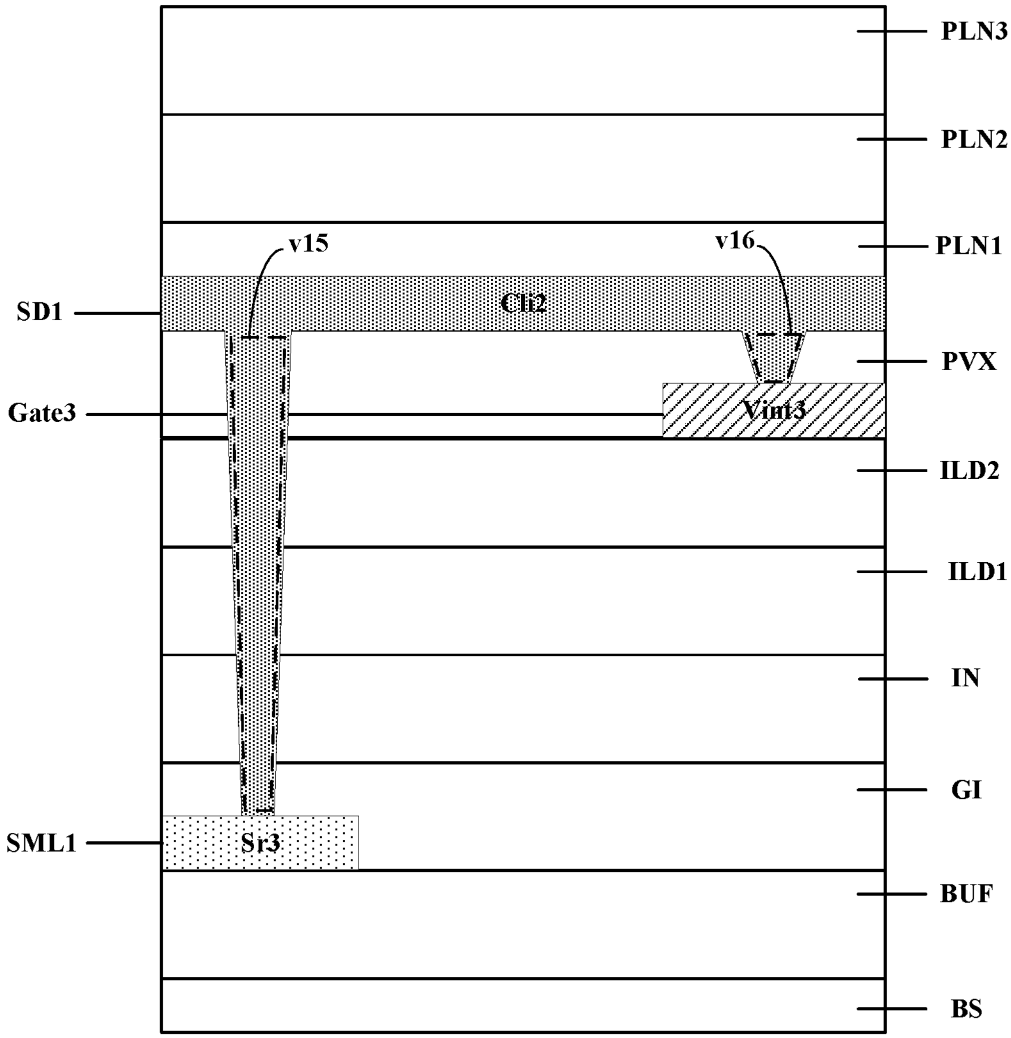
FIG. 4F is a cross-sectional view along an F-F' line in FIG. 3A.
Figure 4G:
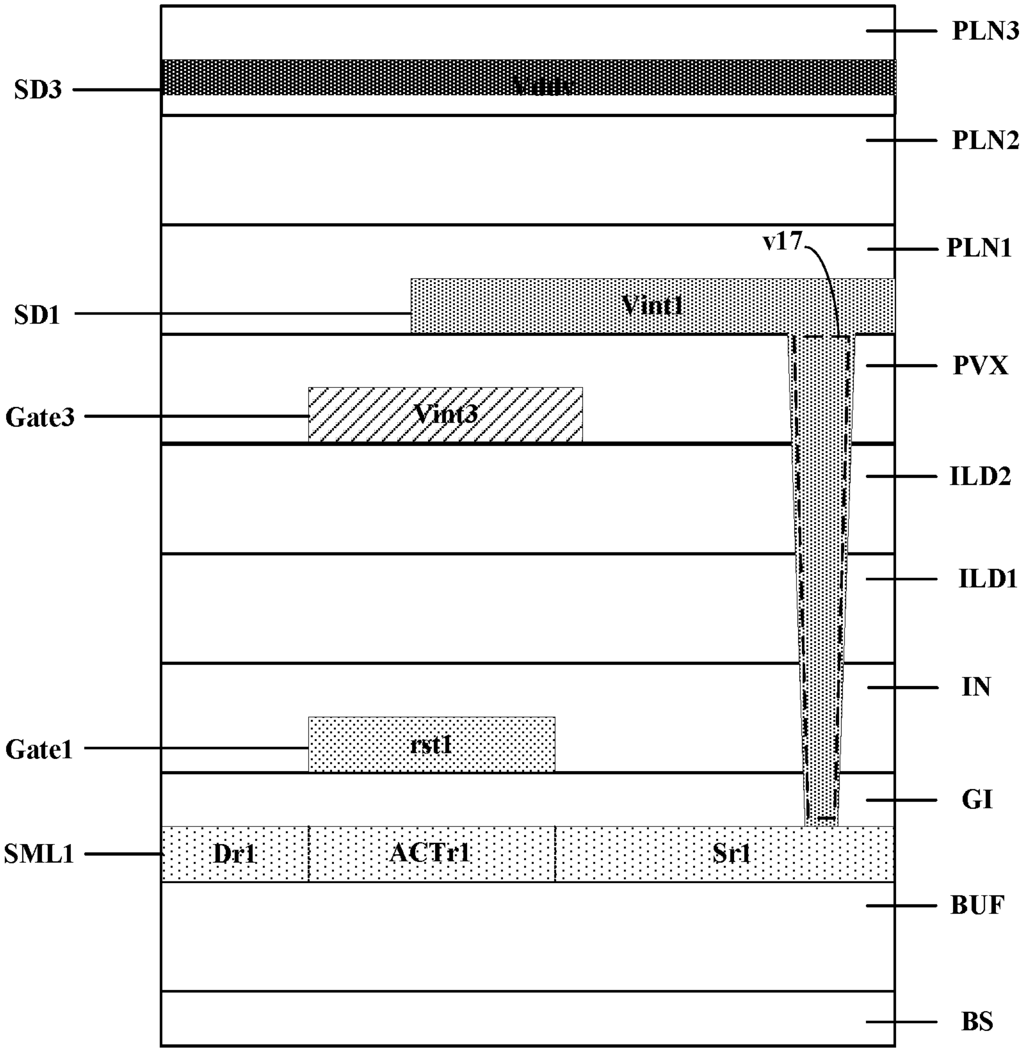
FIG. 4G is a cross-sectional view along a G-G' line in FIG. 3A.
Figure 4H:
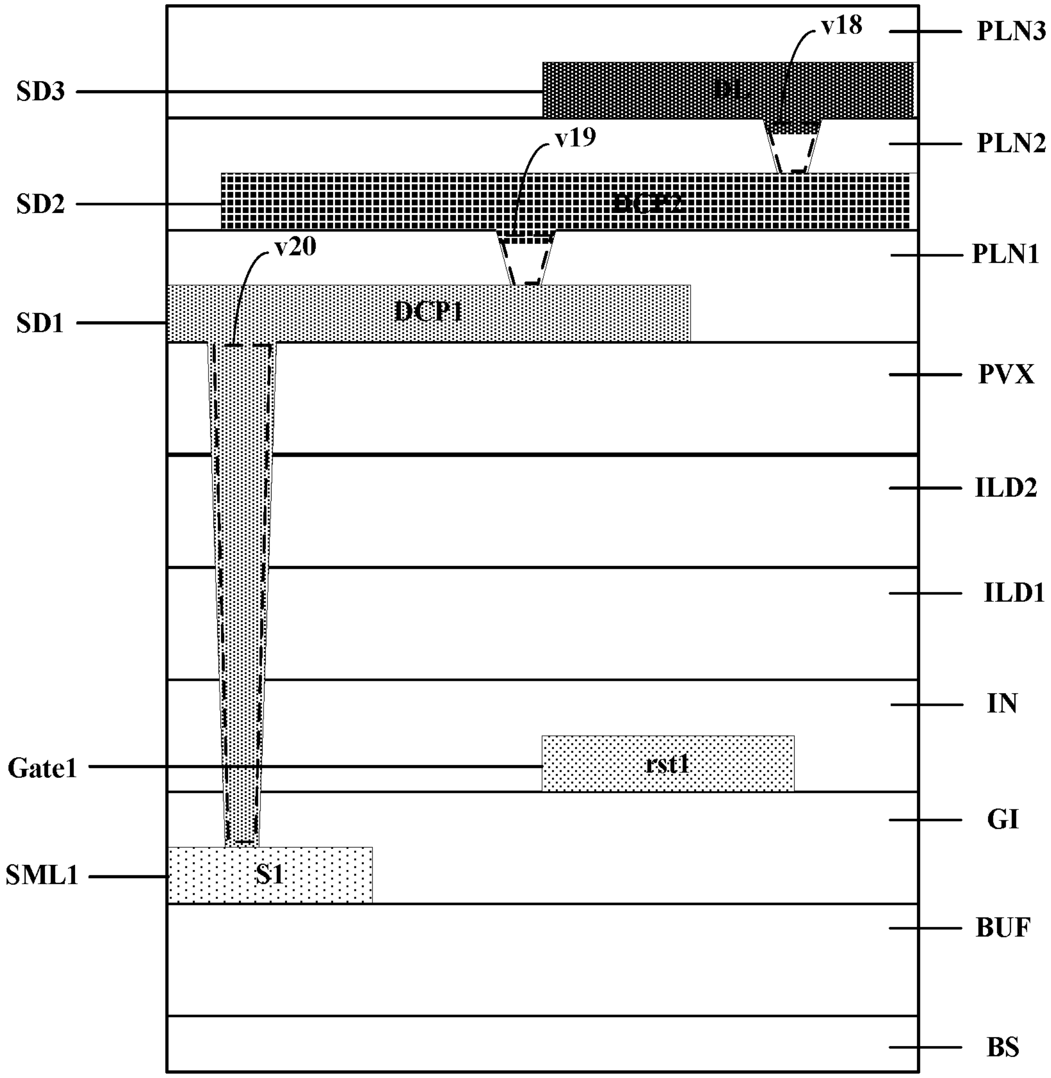
FIG. 4H is a cross-sectional view along an H-H' line in FIG. 3A.

FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A. FIG. 4F is a cross-sectional view along an F-F' line in FIG. 3A. FIG. 4G is a cross-sectional view along a G-G' line in FIG. 3A. FIG. 4H is a cross-sectional view along an H-H' line in FIG. 3A.

Referring to FIG. 3A to FIG. 3R, and FIG. 4A to FIG. 4H, the array substrate in some embodiments includes a base substrate BS, a light shield layer LSL on the base substrate BS, a buffer layer BUF on a side of the light shield layer LSL away from the base substrate BS, a first semiconductor material layer SML1 on a side of the buffer layer BUF away from the base substrate BS, a gate insulating layer G1 on a side of the first semiconductor material layer SML1 away from the base substrate BS, a first gate metal layer Gate1 on a side of the gate insulating layer G1 away from the first semiconductor material layer SML1, an insulating layer IN on a side of the first gate metal layer Gate1 away from the gate insulating layer G1, a second gate metal layer Gate2 on a side of the insulating layer IN away from the first gate metal layer Gate1, a first inter-layer dielectric layer ILD1 on a side of the second gate metal layer Gate2 away from the insulating layer IN, a second semiconductor material layer SML2 on a side of the first inter-layer dielectric layer ILD1 away from the second gate metal layer Gate2, a second inter-layer dielectric layer ILD2 on a side of the second semiconductor material layer SML2 away from the first inter-layer dielectric layer ILD1, a third gate metal layer Gate3 on a side of the second inter-layer dielectric layer ILD2 away from the second semiconductor material layer SML2, a passivation layer PVX on a side of the third gate metal layer Gate3 away from the second inter-layer dielectric layer ILD2, a first signal line layer SD1 on a side of the passivation layer PVX away from the third gate metal layer Gate3, a first planarization layer PLN1 on a side of the first signal line layer SD1 away from the passivation layer PVX, a second signal line layer SD2 on a side of the first planarization layer PLN1 away from the first signal line layer SD1, a second planarization layer PLN2 on a side of the second signal line layer SD2 away from the first planarization layer PLN1, a third signal line layer SD3 on a side of the second planarization layer PLN2 away from the second signal line layer SD2, a third planarization layer PLN3 on a side of the third signal line layer SD3 away from the second planarization layer PLN2, and an anode layer ADL on a side of the third planarization layer PLN3 away from the third signal line layer SD3.

Referring to FIG. 2A, FIG. 3A, FIG. 3C, FIG. 4A, FIG. 4D, and FIG. 4E, in some embodiments, the light shield layer LSL includes a light shield LS. Various appropriate materials and various appropriate fabricating methods may be used for making the light shield layer LSL. For example, a metallic material may be deposited on the substrate by a plasma-enhanced chemical vapor deposition (PECVD) process. Examples of appropriate metallic materials for making the light shield layer LSL include, but are not limited to, aluminum, chromium, tungsten, titanium, tantalum, molybdenum, copper, and alloys or laminates containing the same.

In some embodiments, an orthographic projection of the light shield LS on a base substrate BS substantially covers (e.g., covers at least 80%, covers at least 85%, covers at least 90%, covers at least 95%, covers at least 99%, or completely covers) an orthographic projection of an active layer of a driving transistor of the pixel driving circuit on the base substrate BS.

In some embodiments, the light shield LS is configured to be provided with a first reference signal. Optionally, the light shield LS is electrically connected to a voltage supply line. In one example, the light shield LS is electrically connected to a voltage supply line in a peripheral area of the array substrate.

In alternative embodiments, the light shield LS is configured to be provided with a second reference signal.

In alternative embodiments, the light shield LS is configured to be provided with a reset signal.

Referring to FIG. 2A, FIG. 3A, FIG. 3D, FIG. 4A to FIG. 4H, the first semiconductor material layer SML1 in some embodiments includes at least active layers of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of first electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 further includes at least respective portions of second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Optionally, the first semiconductor material layer SML1 includes active layers, first electrodes, and second electrodes of multiple transistors of the pixel driving circuit, including the first transistor T1, the third transistor T3, the fourth transistor T4, the first reset transistor Tr1, the second reset transistor Tr2, the third reset transistor Tr3, and the driving transistor Td. Various appropriate semiconductor materials may be used for making the first semiconductor material layer SML1. Examples of the semiconductor materials for making the first semiconductor material layer SML1 include silicon-based semiconductor materials such as polycrystalline silicon, single-crystal silicon, and amorphous silicon.

In FIG. 3D, a pixel driving circuit corresponding to PDC1 in FIG. 3B is annotated with labels indicating components of each of multiple transistors (T1, T3, T4, Tr1, Tr2, Tr3, and Td) in the pixel driving circuit. For example, the first transistor T1 includes an active layer ACT1, a first electrode S1, and a second electrode D1. The third transistor T3 includes an active layer ACT3, a first electrode S3, and a second electrode D3. The fourth transistor T4 includes an active layer ACT4, a first electrode S4, and a second electrode D4. The first reset transistor Tr1 includes an active layer ACTr1, a first electrode Sr1, and a second electrode Dr1. The second reset transistor Tr2 includes an active layer ACTr2, a first electrode Sr2, and a second electrode Dr2. The third reset transistor Tr3 includes an active layer ACTr3, a first electrode Sr3, and a second electrode Dr3. The driving transistor Td includes an active layer ACTd, a first electrode Sd, and a second electrode Dd.

Optionally, the active layers (ACT1, ACT3, ACT4, ACTr1, ACTr2, ACTr3, and ACTd), the first electrodes (S1, S3, S4, Sr1, Sr2, Sr3, and Sd), and the second electrodes (D1, D3, D4, Dr1, Dr2, Dr3, and Dd) of the respective transistors (T1, T3, T4, Tr1, Tr2, Tr3, and Td) are in a same layer.

In some embodiments, the active layers (ACT1, ACT3, ACT4, ACTr1, and ACTd), at least portions of the first electrodes (S1, S3, S4, Sr1, and Sd), and at least portions of the second electrodes (D1, D3, D4, Dr1, and Dd) of multiple transistors (T1, T3, T4, Tr1, and Td) in the pixel driving circuit are parts of a unitary structure. Optionally, a part of the second reset transistor Tr2 (ACTr2, Sr2, Dr2) in the first semiconductor material layer is spaced apart from the unitary structure (T1, T3, T4, Tr1, and Td) in a same pixel driving circuit. Optionally, a part of the third reset transistor Tr3 (ACTr3, Sr3, Dr3) in the first semiconductor material layer is spaced apart from the unitary structure (T1, T3, T4, Tr1, and Td) in a same pixel driving circuit.

In some embodiments, the active layers (ACTr2 and ACTr2'), at least portions of the first electrodes (Sr2 and Sr2'), and at least portions of the second electrodes (Dr2 and Dr2') of second reset transistors in two adjacent pixel driving circuits in a row are parts of a unitary structure. Optionally, the first electrodes (Sr2 and Sr2') of the two adjacent pixel driving circuits in a row are directly connected to each other.

Referring to FIG. 2A, FIG. 3A, FIG. 3E, and FIG. 4A to FIG. 4H, the first gate metal layer Gate1 in some embodiments includes a plurality of first gate lines (e.g., a respective first gate line GL1), a plurality of first reset control signal lines (e.g., a respective first reset control signal line rst1), a plurality of second reset control signal lines (e.g., a respective second reset control signal line rst2), a plurality of light emitting control signal lines (e.g., a respective light emitting control signal line em), and a first capacitor electrode Ce1 of the storage capacitor Cst in the pixel driving circuit.

Various appropriate electrode materials and various appropriate fabricating methods may be used to make the first gate metal layer Gate1. For example, a conductive material may be deposited on the substrate by a plasma-enhanced chemical vapor deposition (PECVD) process and patterned. Examples of appropriate conductive materials for making the first gate metal layer Gate1 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first gate lines (e.g., the respective first gate line GL1), the plurality of first reset control signal lines (e.g., the respective first reset control signal line rst1), the plurality of second reset control signal lines (e.g., the respective second reset control signal line rst2), the plurality of light emitting control signal lines (e.g., the respective light emitting control signal line em), and the first capacitor electrode Ce1 of the storage capacitor Cst in the pixel driving circuit are in a same layer.

As used herein, the term "same layer" refers to the relationship between the layers simultaneously formed in the same step. In one example, the plurality of light emitting control signal lines and the first capacitor electrode Ce1 are in a same layer when they are formed as a result of one or more steps of a same patterning process performed in a same layer of material. In another example, the plurality of light emitting control signal lines and the first capacitor electrode Ce1 can be formed in a same layer by simultaneously performing the step of forming the plurality of light emitting control signal lines, and the step of forming the first capacitor electrode Ce1. The term "same layer" does not always mean that the thickness of the layer or the height of the layer in a cross-sectional view is the same.

Referring to FIG. 2A, FIG. 3A, FIG. 3F, and FIG. 4A to FIG. 4H, the second gate metal layer Gate2 in some embodiments includes at least portions of a plurality of second gate lines (e.g., a respective second gate line first branch GL2-1), a plurality of second reset signal lines (e.g., a respective second reset signal Vint2), and a second capacitor electrode Ce2 of the storage capacitor Cst in the pixel driving circuit. Various appropriate electrode materials and various appropriate fabricating methods may be used to make the second gate metal layer Gate2. For example, a conductive material may be deposited on the substrate by a plasma-enhanced chemical vapor deposition (PECVD) process and patterned. Examples of appropriate conductive materials for making the second gate metal layer Gate2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the at least portions of the plurality of second gate lines (e.g., a respective second gate line first branch GL2-1), the plurality of second reset signal lines (e.g., the respective second reset signal Vint2), and the second capacitor electrode Ce2 of the storage capacitor Cst in the pixel driving circuit are in a same layer.

Referring to FIG. 3F, a plurality of second capacitor electrodes in a plurality of pixel driving circuits are connected to each other, and are parts of a unitary structure. By having second capacitor electrodes connected to each other, a resistance of a respective first voltage supply line Vddh can be reduced because the second capacitor electrodes are electrically connected to the respective first voltage supply line Vddh. The inventors of the present disclosure discover that this structure improves display uniformity in the array substrate.

In alternative embodiments, the plurality of second capacitor electrodes in the plurality of pixel driving circuits are spaced apart from each other. By having second capacitor electrodes spaced apart from each other, parasitic capacitance between the plurality of second capacitor electrodes and the second electrode Dd of the driving transistor Td (e.g., the node N3) can be reduced, preventing occurrence of short-term residual image when the array substrate is in a display mode.

Vias extending through the first inter-layer dielectric layer ILD1 are depicted in FIG. 3G.

Referring to FIG. 2A, FIG. 3A, FIG. 3H, and FIG. 4A to FIG. 4H, the second semiconductor material layer SML2 in some embodiments includes at least an active layer ACT2 of the second transistor T2 in the pixel driving circuit. Optionally, the second semiconductor material layer SML2 further includes at least a portion of a first electrode S2 of the second transistor T2 in the pixel driving circuit. Optionally, the second semiconductor material layer SML2 further includes at least a portion of a second electrode D2 of the second transistor T2 in the pixel driving circuit. Optionally, the second semiconductor material layer SML2 includes the active layer ACT2, the first electrode S2, and the second electrode D2 of the second transistor T2. In the present array substrate, at least the active layer ACT2 of the second transistor T2 are in a layer different from at least the active layers of other transistors of the pixel driving circuit. Various appropriate semiconductor materials may be used for making the second semiconductor material layer SML2. Examples of the semiconductor materials for making the second semiconductor material layer SML2 include metal oxide-based semiconductor material such as indium gallium zinc oxide and metal oxynitride-based semiconductor materials such as zinc oxynitride.

In FIG. 3G, a pixel driving circuit corresponding to PDC1 in FIG. 3B is annotated with labels indicating components of the second transistor in the pixel driving circuit. For example, the second transistor T2 includes an active layer ACT2, a first electrode S2, and a second electrode D2. Optionally, the active layer ACT2, the first electrode S2, and the second electrode D2 of the second transistor T2 are in a same layer.

Vias extending through the second inter-layer dielectric layer ILD2 are depicted in FIG. 3I.

Referring to FIG. 2A, FIG. 3A, FIG. 3J, FIG. 4A to FIG. 4H, the third gate metal layer Gate3 in some embodiments includes at least portions of a plurality of second gate lines (e.g., a respective second gate line second branch GL2-2), and a plurality of third reset signal lines (e.g., a respective third reset signal line Vint3). Various appropriate electrode materials and various appropriate fabricating methods may be used to make the third gate metal layer Gate3. For example, a conductive material may be deposited on the substrate by a plasma-enhanced chemical vapor deposition (PECVD) process and patterned. Examples of appropriate conductive materials for making the third gate metal layer Gate3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Vias extending through the passivation layer PVX are depicted in FIG. 3K.

Referring to FIG. 2A, FIG. 3A, FIG. 3L, FIG. 4A to FIG. 4H, the first signal line layer SD1 in some embodiments includes a plurality of first reset signal lines (e.g., a respective first reset signal line Vint1); a plurality of fourth reset signal lines (e.g., a respective fourth reset signal line Vintv); a first data connecting pad DCP1; a voltage connecting pad VCP; a first node connecting line Cln1; a second node connecting line Cln2; a third node connecting line Cln3; a relay electrode RE; a first reset signal connecting line Cli1; and a second reset signal connecting line Cli2.

Various appropriate conductive materials and various appropriate fabricating methods may be used to make the first signal line layer SD1. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines (e.g., the respective first reset signal line Vint1); the plurality of fourth reset signal lines (e.g., the respective fourth reset signal line Vintv); the first data connecting pad DCP1; the voltage connecting pad VCP; the first node connecting line Cln1; the second node connecting line Cln2; the third node connecting line Cln3; the relay electrode RE; the first reset signal connecting line Cli1; and the second reset signal connecting line Cli2 are in a same layer.

In some embodiments, the first node connecting line Cln1 connects multiple components of the pixel driving circuit to the node N1. Referring to FIG. 4A, the first node connecting line Cln1 is connected to the first capacitor electrode Ce1 through a first via v1, and connected to the second transistor T2 (e.g., to the first electrode S2 of the second transistor T2) through a second via v2. Optionally, the first node connecting line Cln1 corresponds to the node N1 depicted in FIG. 2A.

Referring to FIG. 2A, FIG. 3A, FIG. 3E, FIG. 3F, and FIG. 4A, in some embodiments, in a hole region H, a portion of the second capacitor electrode Ce2 is absent. Optionally, an orthographic projection of the second capacitor electrode Ce2 on a base substrate BS substantially (e.g., at least 80%, at least 85%, at least 90%, at least 95%, at least 98%, at least 99%, or 100%) covers, with a margin, an orthographic projection of the first capacitor electrode Ce1 on the base substrate BS except for the hole region H in which a portion of the second capacitor electrode Ce2 is absent. Optionally, the first via v1 extends through the passivation layer PVX, the second inter-layer dielectric layer ILD2, the first inter-layer dielectric layer ILD1, the hole region H, and the insulating layer IN.

In some embodiments, the first node connecting line Cln1 crosses over a respective second gate line of the plurality of second gate lines. As shown in FIG. 3A and FIG. 4A, the first node connecting line Cln1 crosses over the respective second gate line first branch GL2-1 in the second gate metal layer Gate2, and the respective second gate line second branch GL2-2 in the third gate metal layer Gate3.

In some embodiments, referring to FIG. 4B, the second node connecting line Cln2 is connected to a second electrode D3 of the third transistor T3 through a third via v3, and connected to a second electrode Dr3 of the third reset transistor Tr3 through a fourth via v4. Optionally, the second node connecting line Cln2 corresponds to the node N2 depicted in FIG. 2A. Optionally, the second node connecting line Cln2 crosses over the respective light emitting control signal line em of the plurality of light emitting control signal lines.

In some embodiments, referring to FIG. 4C, the third node connecting line Cln3 is connected to a second electrode Dr2 of the second reset transistor Tr2 through a fifth via v5, connected to a second electrode D2 of the second transistor T2 through a sixth via v6, and connected to a second electrode Dd of the driving transistor Td and a first electrode S4 of the fourth transistor T4 through a seventh via v7. Optionally, the third node connecting line Cln3 corresponds to the node N3 depicted in FIG. 2A. Optionally, the third node connecting line Cln3 crosses over a respective second gate line of the plurality of second gate lines. As shown in FIG. 3A and FIG. 4C, the third node connecting line Cln3 crosses over the respective second gate line first branch GL2-1 in the second gate metal layer Gate2, and the respective second gate line second branch GL2-2 in the third gate metal layer Gate3.

In some embodiments, an orthographic projection of the third node connecting line Cln3 on a base substrate BS at least partially (e.g., at least 80%, at least 85%, at least 90%, at least 95%, at least 98%, or at least 99%) overlaps with an orthographic projection of the active layer ACT2 of the second transistor T2 on the base substrate. Optionally, the third node connecting line Cln3 extends along a direction substantially parallel to a direction along which the active layer ACT2 of the second transistor T2 extends. Optionally, the orthographic projection of the third node connecting line Cln3 on a base substrate BS at least partially overlaps with an orthographic projection of the first electrode S2 of the second transistor T2 on the base substrate. Optionally, the orthographic projection of the third node connecting line Cln3 on a base substrate BS at least partially overlaps with an orthographic projection of the second electrode D2 of the second transistor T2 on the base substrate.

In some embodiments, referring to FIG. 4D, the voltage connecting pad VCP connects a respective first voltage supply line Vddh of a plurality of first voltage supply lines to the second capacitor electrode Ce2, and connects a respective first voltage supply line Vddh of a plurality of first voltage supply lines to the first electrode S3 of the third transistor T3. The voltage connecting pad VCP is connected to the second capacitor electrode Ce2 through a tenth via v10, and connected to the first electrode S3 of the third transistor T3 through an eleventh via v11. Optionally, a respective second voltage supply line Vddv of a plurality of second voltage supply lines is connected to a respective first voltage supply line Vddh of a plurality of first voltage supply lines through an eighth via v8, and the respective first voltage supply line Vddh of the plurality of first voltage supply lines is connected to the voltage connecting pad VCP through a ninth via v9, thereby supplying a first reference voltage signal to the voltage connecting pad VCP, and in turn to the second capacitor electrode Ce2.

In some embodiments, the voltage connecting pad VCP is in a region between two adjacent pixel driving circuits in a same row between which at least one data line is present. Optionally, the voltage connecting pad VCP is absent in a region between two adjacent pixel driving circuits in a same row between which data lines are absent. In some embodiments, an orthographic projection of the voltage connecting pad VCP on a base substrate at least partially overlaps with an orthographic projection of a data line on the base substrate. By having this structure, the voltage connecting pad VCP is spaced apart from the first node connecting line Cln1. The inventors of the present disclosure discover that, by having the voltage connecting pad VCP spaced apart from the first node connecting line Cln1, short circuit between the voltage connecting pad VCP and the first node connecting line Cln1 can be avoided.

Referring to FIG. 3A, FIG. 3N, and FIG. 3P, in some embodiments, the respective first voltage supply line Vddh extends along a direction substantially parallel to the first direction DR1, and the respective second voltage supply line Vddv extends along a direction substantially parallel to the second direction DR2. Optionally, the plurality of first voltage supply lines and the plurality of second voltage supply lines form an interconnected voltage supply network. The first direction DR1 and the second direction DR2 are different from each other.

In some embodiments, referring to FIG. 4E, the first reset signal connecting line Cli1 connects a respective second reset signal line Vint2 of a plurality of second reset signal lines to the first electrode Sr2 of the second reset transistor. Optionally, the first reset signal connecting line Cli1 is connected to a unitary structure comprising the first electrodes (Sr2 and Sr2') of second reset transistors in two adjacent pixel driving circuits in a same row through a thirteenth via v13, connected to a portion of the respective second reset signal line Vint2 in a first adjacent pixel driving circuit, and connected to a portion of the respective second reset signal line Vint2 in a second adjacent pixel driving circuit. Through the thirteenth via v13, the first reset signal connecting line Cli1 is configured to transmit a reset signal from the respective second reset signal line Vint2 to the first electrodes of the second reset transistors in two adjacent pixel driving circuits in a same row.

In some embodiments, referring to FIG. 4F, the second reset signal connecting line Cli2 connects a respective third reset signal line Vint3 of a plurality of third reset signal lines to a first electrode Sr3 of the third reset transistor. The second reset signal connecting line Cli2 is connected to the first electrode Sr3 of the third reset transistor through a fifteenth via v15, and connected to a respective third reset signal line Vint3 of a plurality of third reset signal lines through a sixteenth via v16, thereby transmitting a reset signal from the respective third reset signal line Vint3 to the first electrode Sr3 of the third reset transistor.

In some embodiments, referring to FIG. 4G, the respective first reset signal line Vint1 of the plurality of first reset signal lines is connected to the first electrode Sr1 of the first reset transistor through a seventeenth via v17.

In some embodiments, referring to FIG. 4H, the first data connecting pad DCP1 and a second data connecting pad DCP2 connect a respective data line DL to the first electrode S1 of the first transistor. The first data connecting pad DCP1 is connected to the first electrode S1 of the first transistor through a twentieth via v20. Referring to FIG. 3N and FIG. 4H, a second data connecting pad DCP2 in the second signal line layer SD2 is connected to the first data connecting pad DCP1 through a nineteenth via v19. Referring to FIG. 3P and FIG. 4H, a respective data line DL of a plurality of data lines is connected to the second data connecting pad DCP2 through an eighteenth via v18. The first data connecting pad DCP1 and the second data connecting pad DCP2 are configured to transmit a data signal from the respective data line DL to the first electrode S1 of the first transistor.

Vias extending through the first planarization layer PLN1 are depicted in FIG. 3M.

Referring to FIG. 2A, FIG. 3A, FIG. 3N, and FIG. 4A to FIG. 4H, the second signal line layer SD2 in some embodiments includes a plurality of first voltage supply lines (e.g., the respective first voltage supply line Vddh), a second data connecting pad DCP2, an anode contact pad ACP, and a plurality of first fanout connecting lines (e.g., a respective first fanout connecting line FIPh). Various appropriate conductive materials and various appropriate fabricating methods may be used to make the second signal line layer SD2. For example, a conductive material may be deposited on the substrate by a plasma-enhanced chemical vapor deposition (PECVD) process and patterned. Examples of appropriate conductive materials for making the second signal line layer SD2 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first voltage supply lines (e.g., the respective first voltage supply line Vddh), the second data connecting pad DCP2, the anode contact pad ACP, and the plurality of first fanout connecting lines (e.g., the respective first fanout connecting line FIPh) are in a same layer.

Vias extending through the second planarization layer PLN2 are depicted in FIG. 3O.

Referring to FIG. 2A, FIG. 3A, FIG. 3P, FIG. 4A to FIG. 4H, the third signal line layer SD3 in some embodiments includes a plurality of second voltage supply lines (e.g., the respective second voltage supply line Vddv), a plurality of data lines (e.g., a respective data line DL), and a plurality of second fanout connecting lines (e.g., a respective second fanout connecting line FIPv). Various appropriate conductive materials and various appropriate fabricating methods may be used to make the third signal line layer SD3. For example, a conductive material may be deposited on the substrate by a plasma-enhanced chemical vapor deposition (PECVD) process and patterned. Examples of appropriate conductive materials for making the third signal line layer SD3 include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second voltage supply lines (e.g., the respective second voltage supply line Vddv), the plurality of data lines (e.g., the respective data line DL), and the plurality of second fanout connecting lines (e.g., the respective second fanout connecting line FIPv) are in a same layer.

The plurality of first fanout connecting lines and the plurality of second fanout connecting lines are configured to connect the plurality of data lines to a data driving circuit. By having the fanout connecting lines at least partially in a display area of the array substrate, the array substrate can have a decreased peripheral area.

In some embodiments, the respective first fanout connecting line FIPh extends along a direction substantially parallel to the first direction DR1, and the respective second voltage supply line Vddv extends along a direction substantially parallel to the second direction DR2.

In some embodiments, an orthographic projection of the respective second voltage supply line Vddv on a base substrate BS at least partially (e.g., at least 80%, at least 85%, at least 90%, at least 95%, or at least 99%) covers an orthographic projection of the first node connecting line Cln1 on the base substrate BS. Optionally, the orthographic projection of the respective second voltage supply line Vddv on the base substrate BS at least partially (e.g., at least 80%, at least 85%, at least 90%, at least 95%, or at least 99%) covers an orthographic projection of a first electrode S2 of the second transistor T2 on the base substrate BS. By having this particular structure, the inventors of the present disclosure discover that the node N1 can be shielded from interference by other signals in the array substrate.

In some embodiments, an orthographic projection of the respective second voltage supply line Vddv on a base substrate BS at least partially (e.g., at least 80%, at least 85%, at least 90%, at least 95%, or at least 99%) covers an orthographic projection of the active layer ACT2 of the second transistor T2 on the base substrate BS. By having this particular structure, the inventors of the present disclosure discover that the active layer ACT2 of the second transistor T2 can be shielded from irradiation, enhancing the performance of the second transistor T2 in the pixel driving circuit.

In some embodiments, an orthographic projection of the respective second voltage supply line Vddv on a base substrate BS at least partially (e.g., at least 20%, at least 30%, at least 40%, at least 50%, or at least 60%) covers an orthographic projection of the third node connecting line Cln3 on the base substrate BS.

In some embodiments, referring to FIG. 2A, FIG. 3A, FIG. 3F, FIG. 3J, FIG. 4A, and FIG. 4C, the respective second gate line includes the respective second gate line first branch GL2-1 and the respective second gate line second branch GL2-2 in two different layers. Optionally, the respective second gate line first branch GL2-1 is in the second gate metal layer Gate2, and the respective second gate line second branch GL2-2 is in the third gate metal layer Gate3. Optionally, an orthographic projection of the respective second gate line first branch GL2-1 on a base substrate BS at least partially (e.g., at least 80%, at least 85%, at least 90%, at least 95%, at least 98%, or at least 99%) overlaps with an orthographic projection of the respective second gate line second branch GL2-2 on the base substrate BS. Optionally, the respective second gate line first branch GL2-1 and the respective second gate line second branch GL2-2 are configured to be provided with a same gate scanning signal.

Vias extending through the third planarization layer PLN3 are depicted in FIG. 3Q.

Referring to FIG. 2A, FIG. 3A, FIG. 3R, FIG. 4A to FIG. 4H, the anode layer ADL in some embodiments includes a plurality of anodes AD.

Referring to FIG. 3A to FIG. 3R, and FIG. 4A to FIG. 4H, in some embodiments, corresponding layers of a first pixel driving circuit (e.g., PDC1 in FIG. 3B) and corresponding layers of a second pixel driving circuit (e.g., PDC2 in FIG. 3B) directly adjacent to each other and in the present stage (e.g., in a same row) have a substantially mirror symmetry with respect to each other, e.g., about a plane perpendicular to a main surface of the array substrate and substantially parallel to the plurality of data lines.

As used herein, the term "corresponding layers of a first pixel driving circuit and corresponding layers of a second pixel driving circuit" is not intended to include layers that are not parts of the pixel driving circuits. For example, the "corresponding layers of a first pixel driving circuit and corresponding layers of a second pixel driving circuit" do not include an anode layer or a pixel definition layer. In some embodiments, the "corresponding layers of a first pixel driving circuit and corresponding layers of a second pixel driving circuit" do not include a light shielding layer or a first signal line layer. In one example, the "corresponding layers of a first pixel driving circuit and corresponding layers of a second pixel driving circuit" refer to at least one conductive layer of the first pixel driving circuit and conductive layers of a second pixel driving circuit. In one specific example, "corresponding layers" includes at least one of a first semiconductor material layer, a first gate metal layer, a second gate metal layer, a second semiconductor material layer, a third gate metal layer, a first signal line layer, a second signal line layer, or a third signal line layer. In another specific example, "corresponding layers" further includes at least one of a gate insulating layer, an insulating layer, a first inter-layer dielectric layer, a second inter-layer dielectric layer, a passivation layer, a first planarization layer, a second planarization layer, or a third planarization layer.

Figure 5:
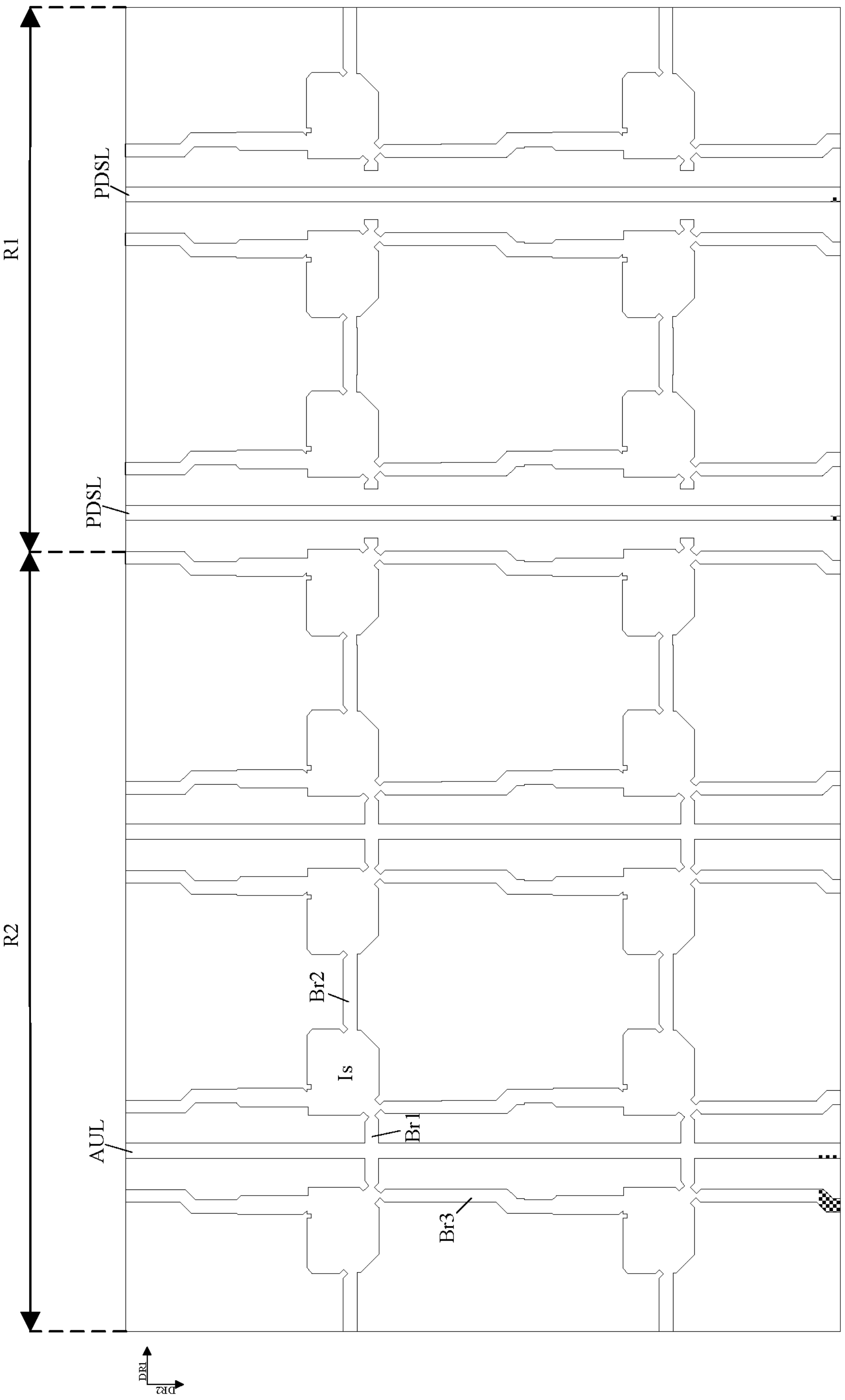
FIG. 5 is a diagram illustrating the structure of a light shielding layer in an array substrate in some embodiments according to the present disclosure.

FIG. 5 is a diagram illustrating the structure of a light shielding layer in an array substrate in some embodiments according to the present disclosure. Referring to FIG. 3A, FIG. 3C, and FIG. 5, the light shielding layer in some embodiments includes a plurality of plurality of islands Is, a plurality of first bridges Br1, a plurality of second bridges Br2, and a plurality of third bridges Br3.

Figure 6:
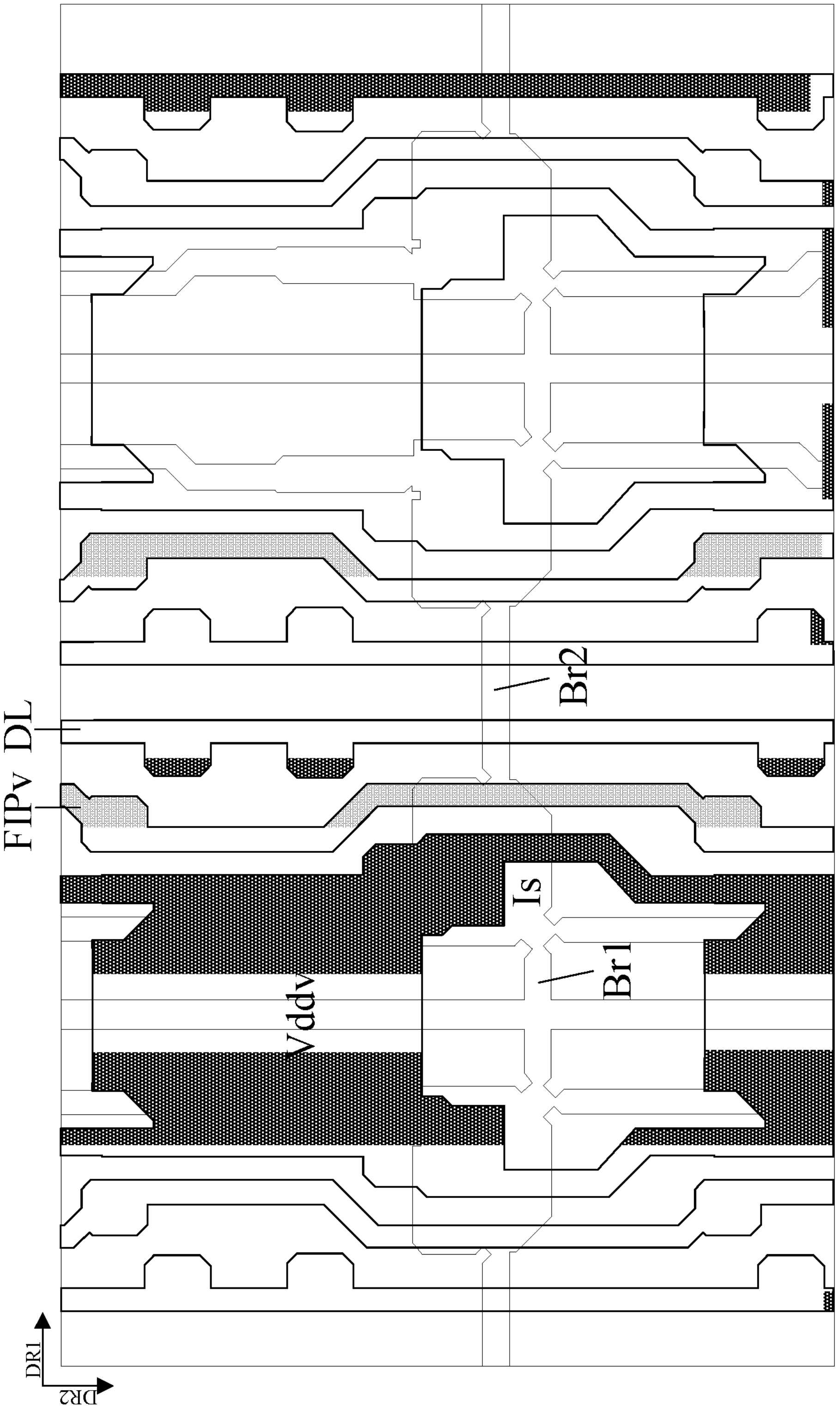
FIG. 6 is a diagram illustrating the structure of a light shielding layer and a third signal line layer in an array substrate in some embodiments according to the present disclosure.

FIG. 6 is a diagram illustrating the structure of a light shielding layer and a third signal line layer in an array substrate in some embodiments according to the present disclosure. Referring to FIG. 3A, FIG. 3C, FIG. 5, and FIG. 6, the plurality of first bridges Br1 in some embodiments extend along a direction substantially parallel to the first direction DR1, respectively; the plurality of second bridges Br2 in some embodiments extend along a direction substantially parallel to the first direction DR1, respectively; and the plurality of third bridges Br3 in some embodiments extend along a direction substantially parallel to the second direction DR2.

In some embodiments, a respective first bridge of the plurality of first bridges Br1 connects two adjacent islands of the plurality of islands Is respectively in two adjacent pixel driving circuits in a same row between which data lines are absent. Optionally, the respective first bridge does not cross over any data line.

In some embodiments, a respective second bridge of the plurality of second bridges Br2 connects two adjacent islands of the plurality of islands Is respectively in two adjacent pixel driving circuits in a same row between which at least one data line is present. Optionally, the respective second bridge crosses over at least one data line. In one example, the respective second bridge crosses over two data lines.

In some embodiments, a respective third bridge of the plurality of third bridges Br3 connects two adjacent islands of the plurality of islands Is respectively in two adjacent pixel driving circuits in a same column.

In some embodiments, the array substrate includes a first region R1 and a second region R2 outside the first region R1. In the first region R1, the light shielding layer further includes an accessory signal line PDSL. Optionally, the accessory signal line PDSL extends along a direction substantially parallel to the second direction DR2. In one example, the accessory signal line PDSL is a sensor signal line of a photosensor. For example, the accessory signal line PDSL may be an input or output signal line of the photosensor. Optionally, the accessory signal line PDSL is between two adjacent pixel driving circuits in a same row between which data lines are absent. In one example, the photosensor is a photosensor configured to detect ambient light intensity.

In some embodiments, the accessory signal line PDSL is electrically isolated from the light shield LS. Optionally, the plurality of first bridges Br1 are at least partially absent in the first region R1, allowing the accessory signal line PDSL to pass through between two adjacent pixel driving circuits in a same row between which data lines are absent, without connecting with the light shield LS.

In the second region R2, the light shielding layer further includes an auxiliary line AUL. The auxiliary line AUL is at a position in the second region R2 corresponding to the accessory signal line PDSL in the first region R1. Optionally, the auxiliary line AUL extends along a direction substantially parallel to the second direction DR2. Optionally, the auxiliary line AUL is between two adjacent pixel driving circuits in a same row between which data lines are absent.

In some embodiments, the light shielding layer includes a plurality of auxiliary lines in the second region R2, a respective auxiliary line is between a respective pair of two adjacent pixel driving circuits in a same row between which data lines are absent. The inventors of the present disclosure discover that by having the of auxiliary lines in the second region R2 at positions corresponding to the accessory signal line PDSL in the first region R1, the display uniformity throughout the array substrate can be improved.

In some embodiments, the auxiliary line AUL is connected to multiple first bridges of the plurality of first bridges Br1 in a same column. Optionally, in at least a portion of the second region R2, the auxiliary line AUL is a part of a unitary structure comprising multiple islands of the plurality of islands Is, multiple first bridges of the plurality of first bridges Br1, multiple second bridges of the plurality of second bridges Br2, and multiple third bridges of the plurality of third bridges Br3.

Referring to FIG. 5, in some embodiments, the auxiliary line AUL is continuous line extending throughout multiple rows of pixel driving circuits.

Figure 7:
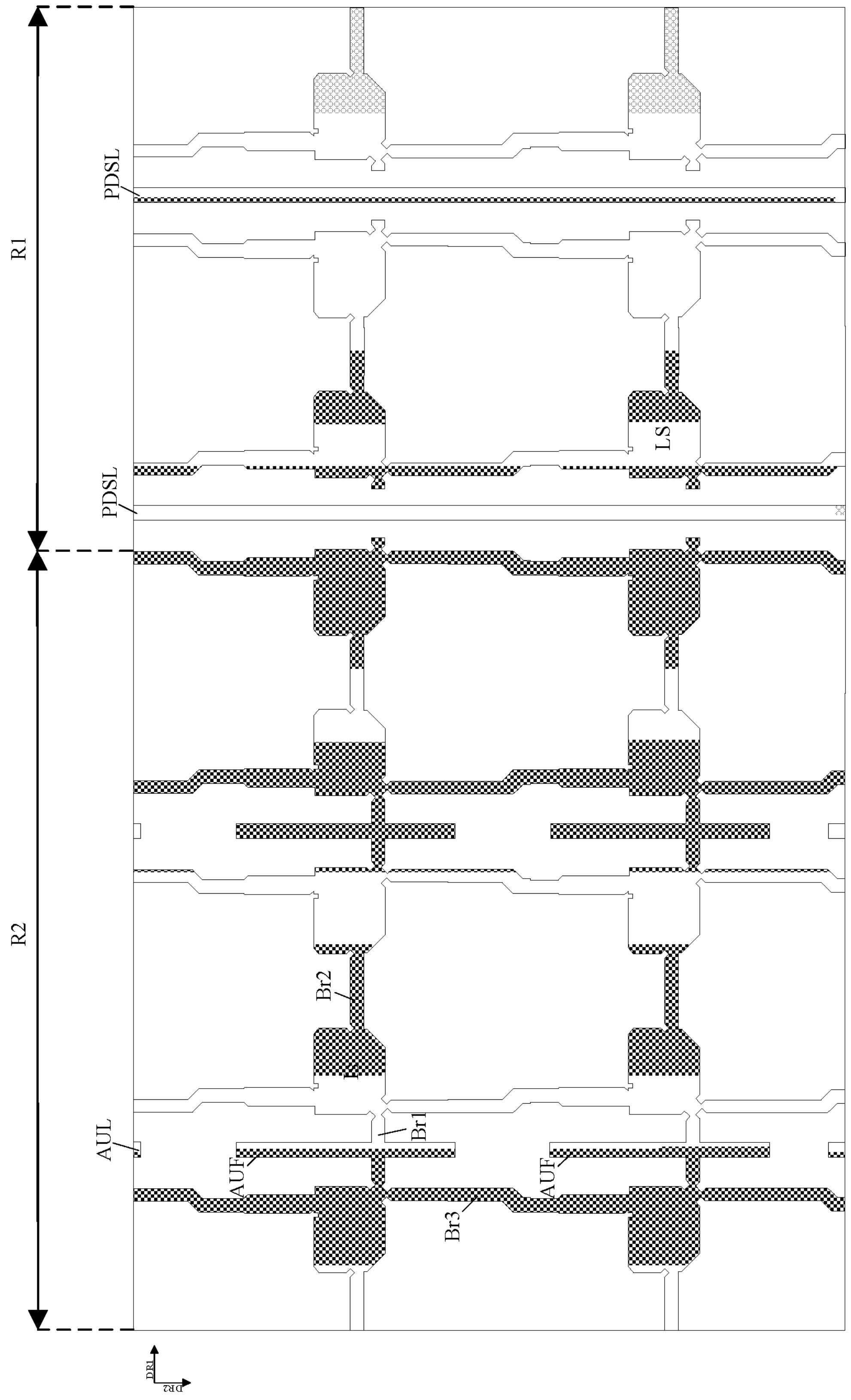
FIG. 7 is a diagram illustrating the structure of a light shielding layer in an array substrate in some embodiments according to the present disclosure.

FIG. 7 is a diagram illustrating the structure of a light shielding layer in an array substrate in some embodiments according to the present disclosure. Referring to FIG. 3A, FIG. 3C, and FIG. 7, in some embodiments, the auxiliary line AUL includes a plurality of fragments AUF spaced apart from each other. Optionally, a respective fragment is in a respective row of pixel driving circuits, and is between a respective pair of two adjacent pixel driving circuits in the respective row between which data lines are absent. Optionally, the respective fragment is connected to a respective first bridge connecting the respective pair of two adjacent islands respectively in two adjacent pixel driving circuits in the respective row between which data lines are absent.

Figure 8:
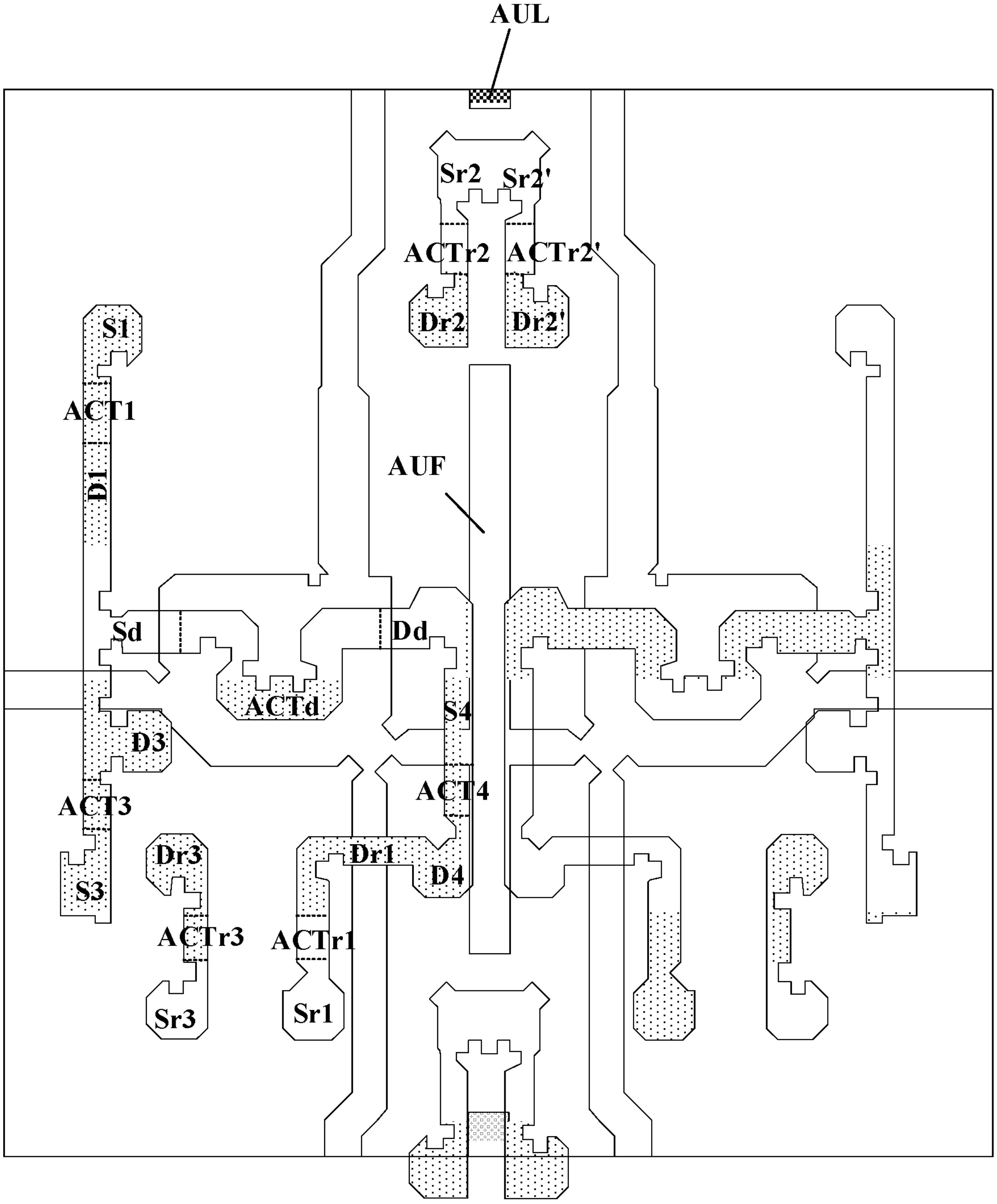
FIG. 8 is a diagram illustrating the structure of a light shielding layer and a first semiconductor material layer in an array substrate in some embodiments according to the present disclosure.

FIG. 8 is a diagram illustrating the structure of a light shielding layer and a first semiconductor material layer in an array substrate in some embodiments according to the present disclosure. Referring to FIG. 3A, FIG. 3C, FIG. 7, and FIG. 8, in some embodiments, an orthographic projection of the plurality of fragments AUF on a base substrate is substantially non-overlapping (e.g., at least 80% non-overlapping, at least 90% non-overlapping, at least 95% non-overlapping, at least 99% non-overlapping, or completely non-overlapping) with an orthographic projection of the first semiconductor material layer on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of a semiconductor material layer of the second reset transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the first electrode Sr2 of the second reset transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the active layer ACTr2 of the second reset transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the second electrode Dr2 of the second reset transistor on the base substrate.

In one example, the orthographic projection of the plurality of fragments AUF on the base substrate is completely non-overlapping with the orthographic projection of the first electrode Sr2 of the second reset transistor on the base substrate. In another example, the orthographic projection of the plurality of fragments AUF on the base substrate is completely non-overlapping with the orthographic projection of the active layer ACTr2 of the second reset transistor on the base substrate. In another example, the orthographic projection of the plurality of fragments AUF on the base substrate is completely non-overlapping with the orthographic projection of the second electrode Dr2 of the second reset transistor on the base substrate. The inventors of the present disclosure discover that this structure can minimize any interference from the light shielding layer to the transistors (e.g., the second reset transistor).

Figure 9:
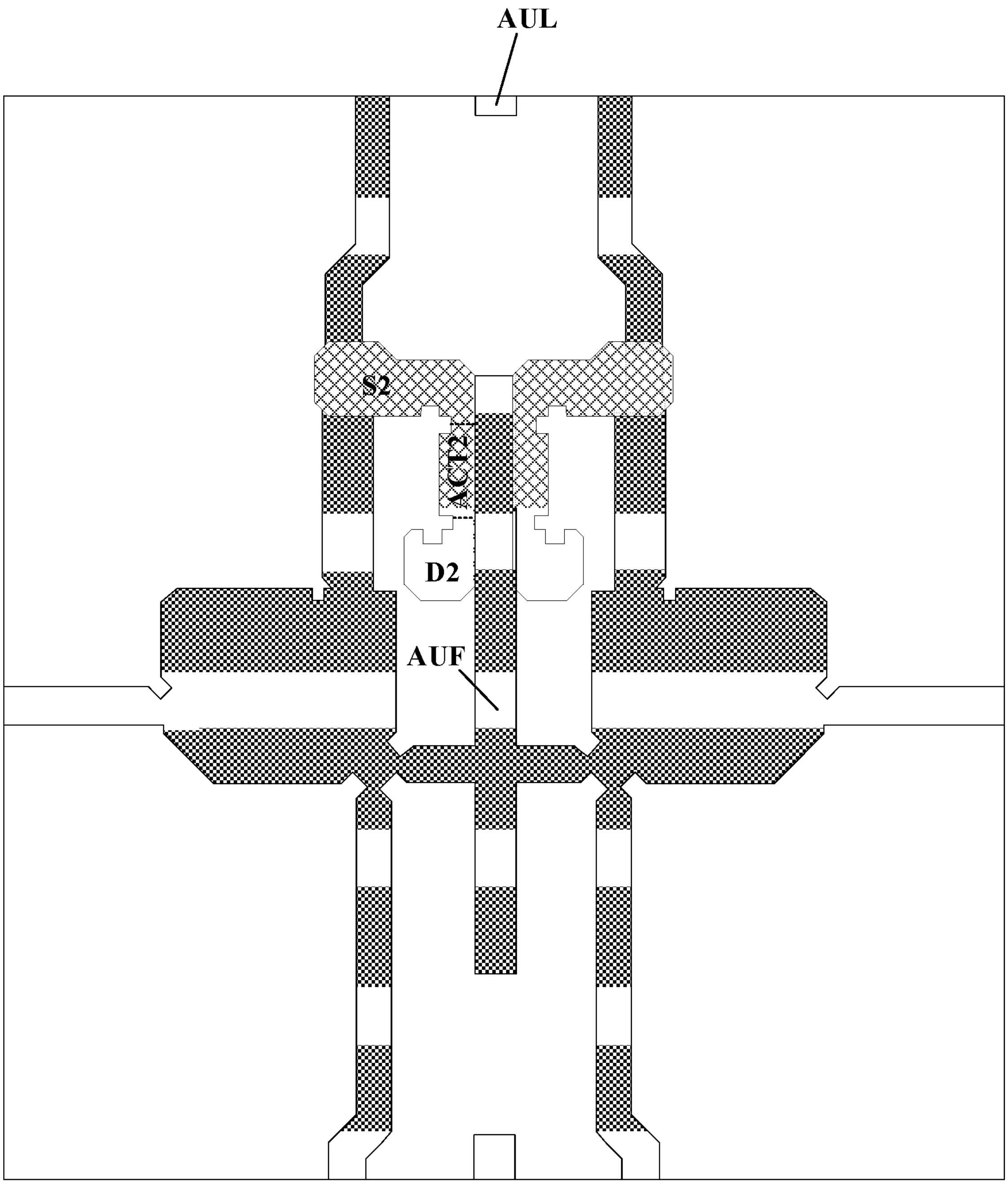
FIG. 9 is a diagram illustrating the structure of a light shielding layer and a second semiconductor material layer in an array substrate in some embodiments according to the present disclosure.

FIG. 9 is a diagram illustrating the structure of a light shielding layer and a second semiconductor material layer in an array substrate in some embodiments according to the present disclosure. Referring to FIG. 3A, FIG. 3C, FIG. 7, and FIG. 9, in some embodiments, an orthographic projection of the plurality of fragments AUF on a base substrate is substantially non-overlapping (e.g., at least 80% non-overlapping, at least 90% non-overlapping, at least 95% non-overlapping, at least 99% non-overlapping, or completely non-overlapping) with an orthographic projection of the second semiconductor material layer on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of a semiconductor material layer of the second transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the first electrode S2 of the second transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the active layer ACT2 of the second transistor on the base substrate. Optionally, the orthographic projection of the plurality of fragments AUF on the base substrate is substantially non-overlapping (e.g., at least 80% non-overlapping, at least 90% non-overlapping, at least 95% non-overlapping, at least 99% non-overlapping, or completely non-overlapping) with an orthographic projection of the second electrode D2 of the second transistor on the base substrate.

In one example, the orthographic projection of the plurality of fragments AUF on the base substrate is completely non-overlapping with the orthographic projection of the first electrode S2 of the second transistor on the base substrate. In another example, the orthographic projection of the plurality of fragments AUF on the base substrate is completely non-overlapping with the orthographic projection of the active layer ACT2 of the second transistor on the base substrate. In another example, the orthographic projection of the plurality of fragments AUF on the base substrate is completely non-overlapping with the orthographic projection of the second electrode D2 of the second transistor on the base substrate. The inventors of the present disclosure discover that this structure can minimize any interference from the light shielding layer to the transistors (e.g., the second transistor).

Referring to FIG. 3A, FIG. 3N, and FIG. 3P, as discussed above, the array substrate in some embodiments includes a plurality of first fanout connecting lines (e.g., a respective first fanout connecting line FIPh) and a plurality of second fanout connecting lines (e.g., a respective second fanout connecting line FIPv). Optionally, the plurality of first fanout connecting lines are in the second signal line layer. Optionally, the plurality of second fanout connecting lines are in the third signal line layer. Optionally, the plurality of first fanout connecting lines extend along a direction substantially parallel to the first direction DR1. Optionally, the plurality of second fanout connecting lines extend along a direction substantially parallel to the second direction DR2.

In some embodiments, a respective second fanout connecting line FIPv is between a second voltage supply line and a data line. Optionally, two adjacent second fanout connecting lines of the plurality of second fanout connecting lines are between two adjacent data lines of the plurality of data lines. Optionally, a second voltage supply line of the plurality of second voltage supply lines spaces apart two adjacent second fanout connecting lines.

Figure 10:
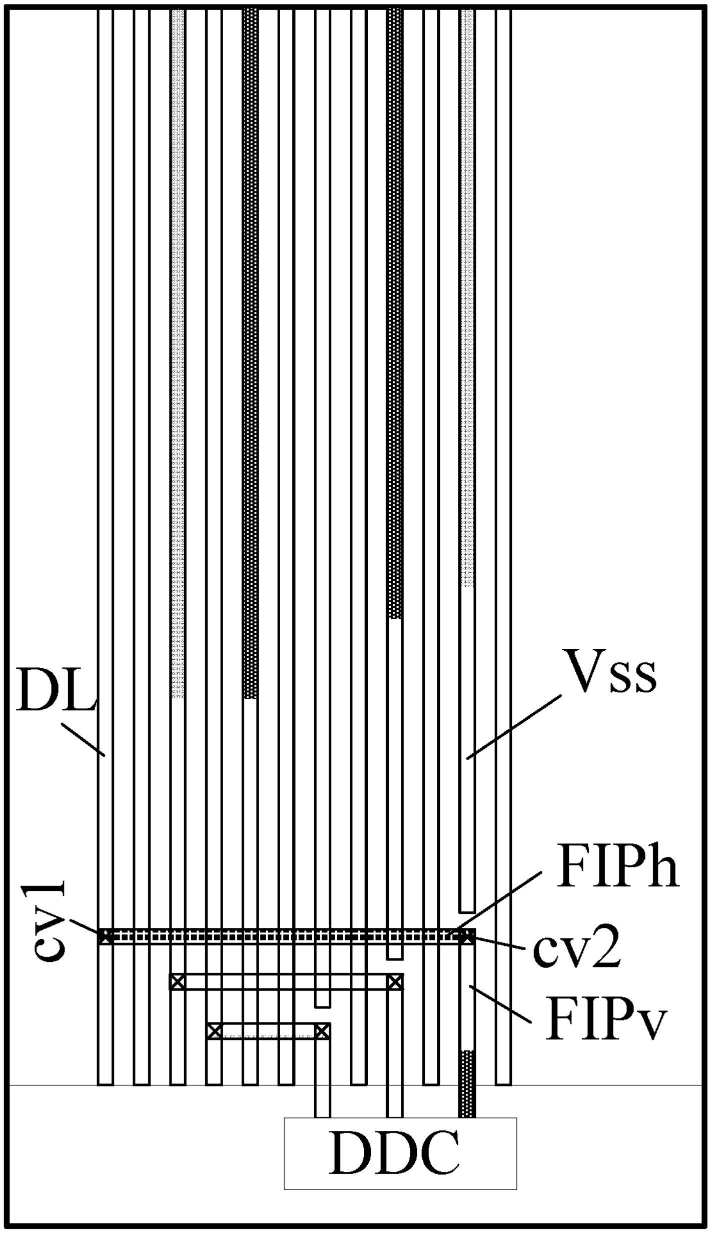
FIG. 10 is a diagram illustrating a layout of certain signal lines in a second signal line layer and a third signal line layer in an array substrate in some embodiments according to the present disclosure.

FIG. 10 is a diagram illustrating a layout of certain signal lines in a second signal line layer and a third signal line layer in an array substrate in some embodiments according to the present disclosure. Referring to FIG. 10, in some embodiments, a respective data line DL is connected to a respective first fanout connecting line FIPh, e.g., through a first connecting via cv1 extending through the second planarization layer. A respective second fanout connecting line FIPv is connected to the respective first fanout connecting line FIPh, e.g., through a second connecting via cv2 extending through the second planarization layer. The respective first fanout connecting line FIPh connects the respective data line DL with the respective second fanout connecting line FIPv. The plurality of second fanout connecting lines are connected to a data driving circuit DDC. Optionally, an individual first fanout connecting line of the plurality of first fanout connecting lines is connected to only one data line of the plurality of data lines, and an individual data line of the plurality of data lines is connected to only one first fanout connecting line of the plurality of first fanout connecting lines. Optionally, an individual second fanout connecting line of the plurality of second fanout connecting lines is connected to only one first fanout connecting line of the plurality of first fanout connecting lines, and an individual first fanout connecting line of the plurality of first fanout connecting lines is connected to only one second fanout connecting line of the plurality of second fanout connecting lines.

Figure 11A:
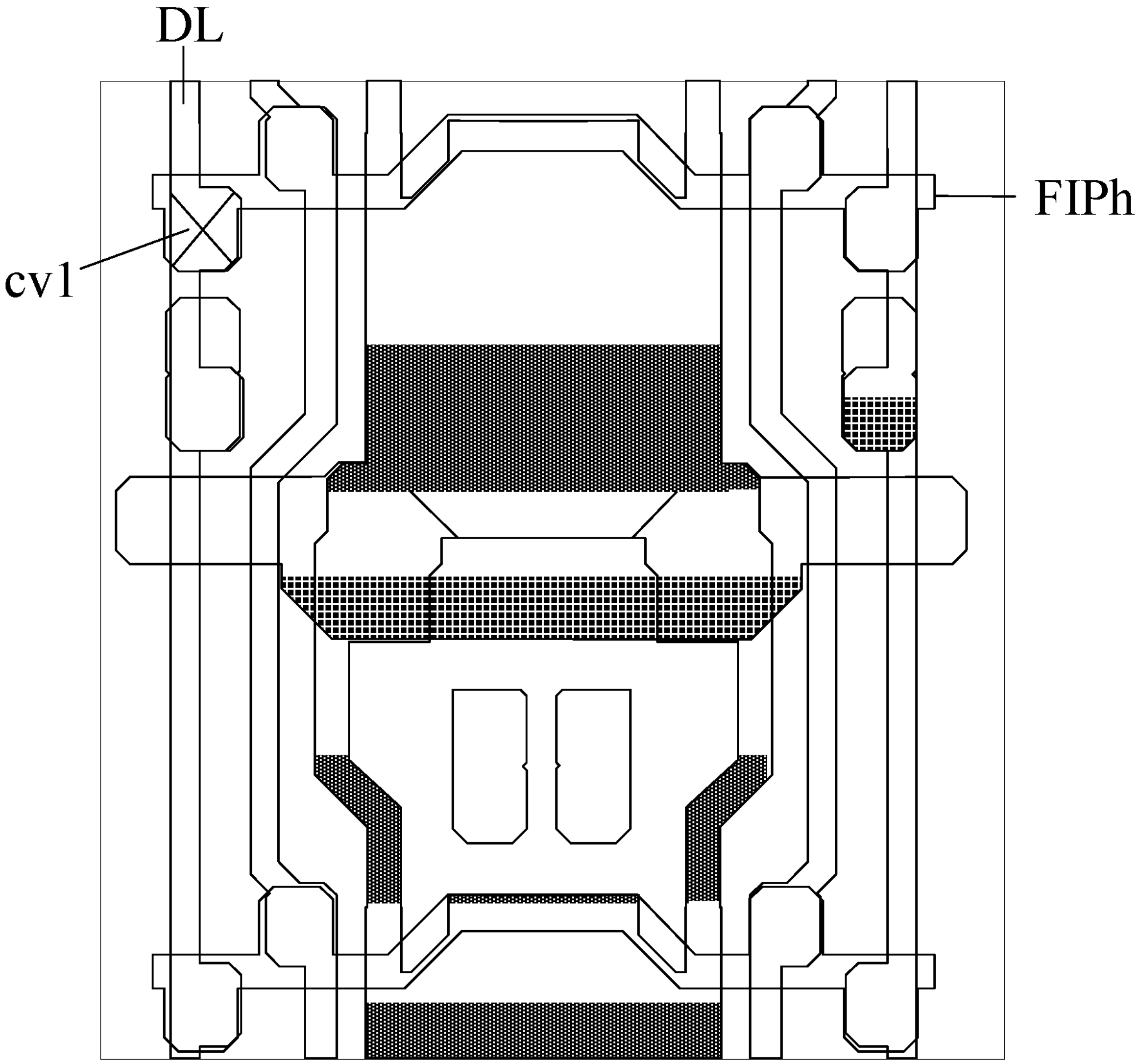
FIG. 11A shows connection between a respective data line and a respective first fanout connecting line through a first connecting via.
Figure 11B:
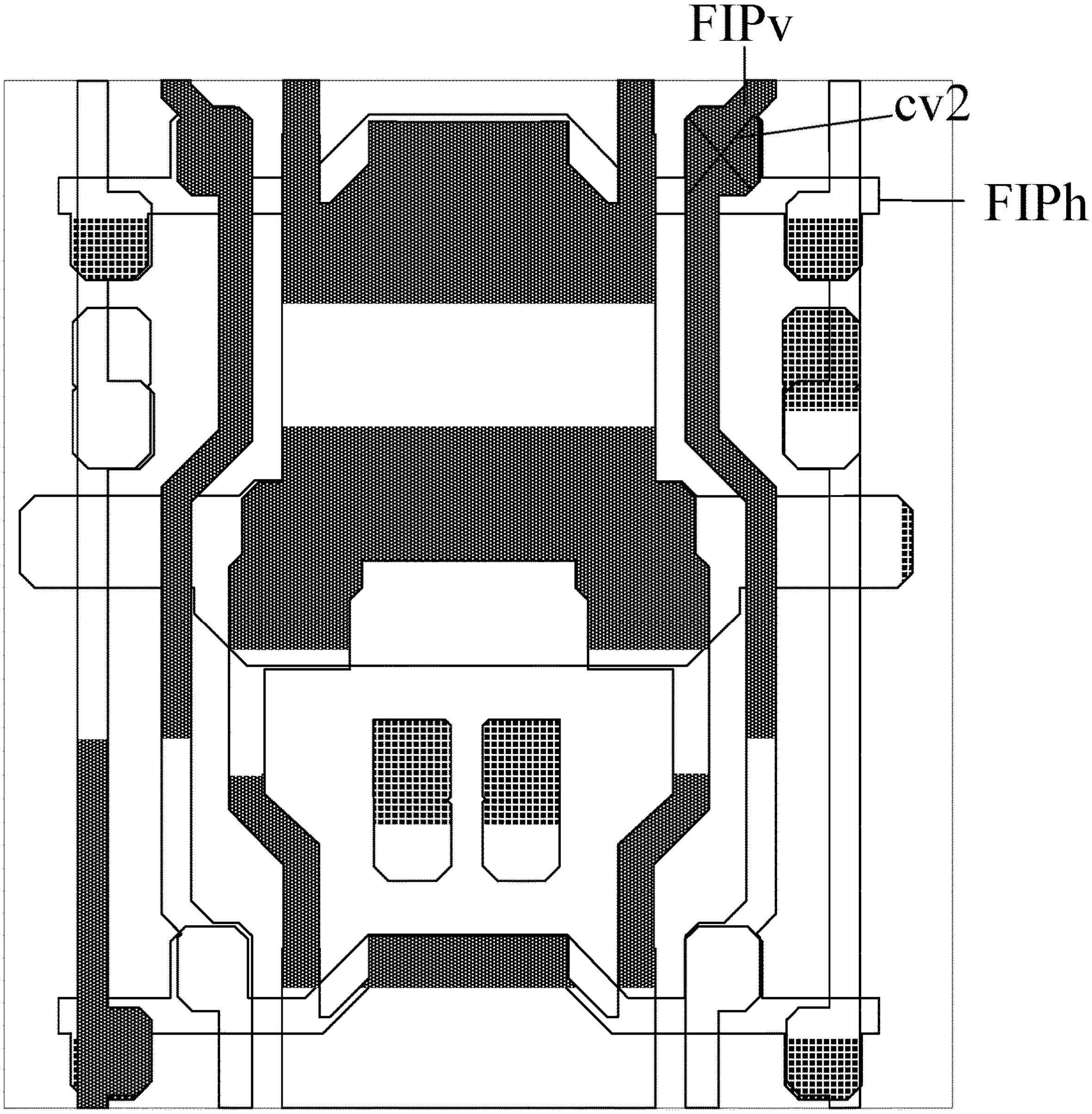
FIG. 11B shows connection between a respective first fanout connecting line and a respective second fanout connecting line through a second connecting via.

In some embodiments, at least one of the plurality of first fanout connecting lines crosses over multiple data lines of the plurality of data lines, but is not connected to the multiple data lines except for one corresponding data line. FIG. 11A shows connection between a respective data line and a respective first fanout connecting line through a first connecting via. FIG. 11B shows connection between a respective first fanout connecting line and a respective second fanout connecting line through a second connecting via.

Referring to FIG. 10, the array substrate in some embodiments further includes a plurality of third voltage supply lines. In some embodiments, the respective first voltage supply line Vddh and the respective second voltage supply line Vddv are configured to provide a first reference voltage signal (e.g., a high reference voltage signal). Optionally, the respective third voltage supply line Vss is configured to provide a second reference voltage signal (e.g., a low reference voltage signal). Optionally, the first reference voltage signal is a constant voltage signal, the second reference voltage signal is a constant voltage signal, the first reference voltage signal has a voltage level higher than a voltage level of the second reference voltage signal.

Optionally, the plurality of third voltage supply lines are in the third signal line layer. Optionally, the plurality of third voltage supply lines extend along a direction substantially parallel to the second direction DR2.

In some embodiments, a respective third voltage supply line Vss of the plurality of third voltage supply lines is between a second voltage supply line and a data line. Optionally, two adjacent third voltage supply lines of the plurality of third voltage supply lines are between two adjacent data lines of the plurality of data lines. Optionally, a second voltage supply line of the plurality of second voltage supply lines spaces apart two adjacent third voltage supply lines.

In some embodiments, at least one third voltage supply line of the plurality of third voltage supply lines and a second fanout connecting line of the plurality of second fanout connecting lines are disconnected from each other, and are between a same second voltage supply line and a same data line that are configured to provide signals to a same column of pixel driving circuits. The at least one third voltage supply line crosses over a first portion of the array substrate, and the second fanout connecting line crosses over a second portion of the array substrate, and the first portion and the second portion are non-overlapping to each other.

For example, the at least one third voltage supply line crosses over at least one row of pixel driving circuit in the first portion of the array substrate, and the second fanout connecting line crosses over at least one row of pixel driving circuit in the second portion of the array substrate, and the first portion and the second portion are non-overlapping to each other.

Figure 12:
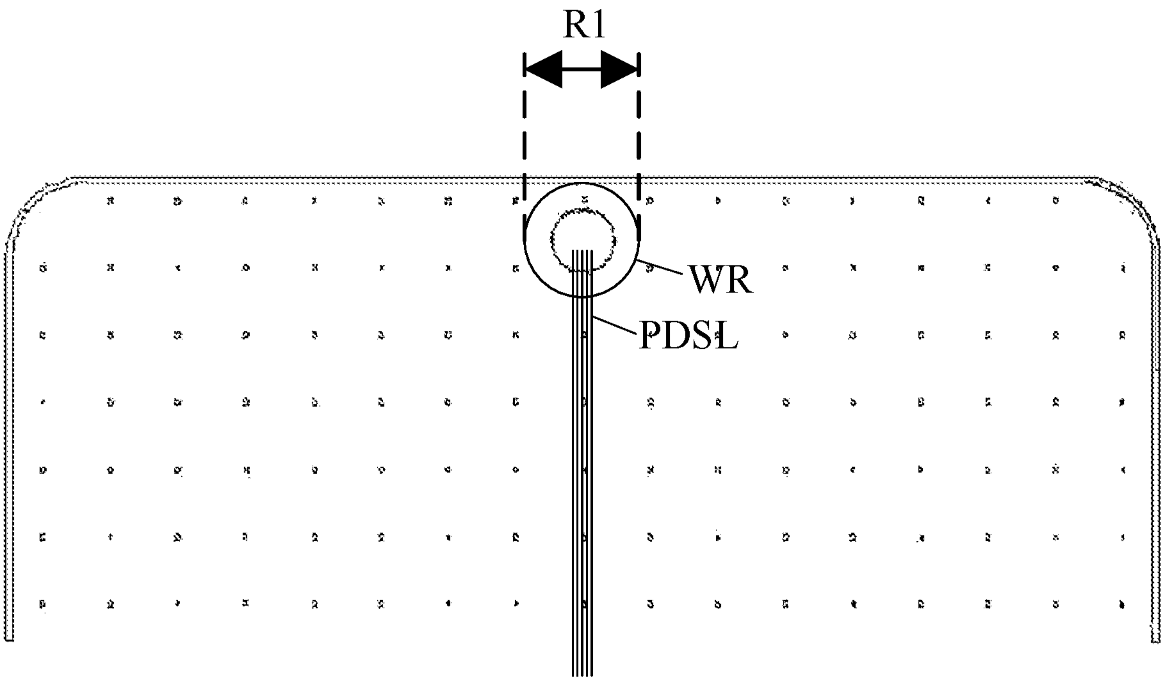
FIG. 12 illustrates a layout of a window region in an array substrate in some embodiments according to the present disclosure.

In some embodiments, the accessory signal line is in a region adjacent to a window region of the array substrate. FIG. 12 illustrates a layout of a window region in an array substrate in some embodiments according to the present disclosure. Referring to FIG. 12, the array substrate includes a window region WR having a hole configured for installing an accessory such as a camera lens or a fingerprint sensor. The accessory signal line PDSL is connected to an accessory installed in the window region WR. In one example, the accessory signal line PDSL is a sensor signal line of a photosensor. For example, the accessory signal line PDSL may be an input or output signal line of the photosensor. In one example, the photosensor is a photosensor configured to detect ambient light intensity.

Referring to FIG. 3A and FIG. 3C, in some embodiments, the accessory signal line PDSL is disposed in the light shielding layer.

Figure 13:
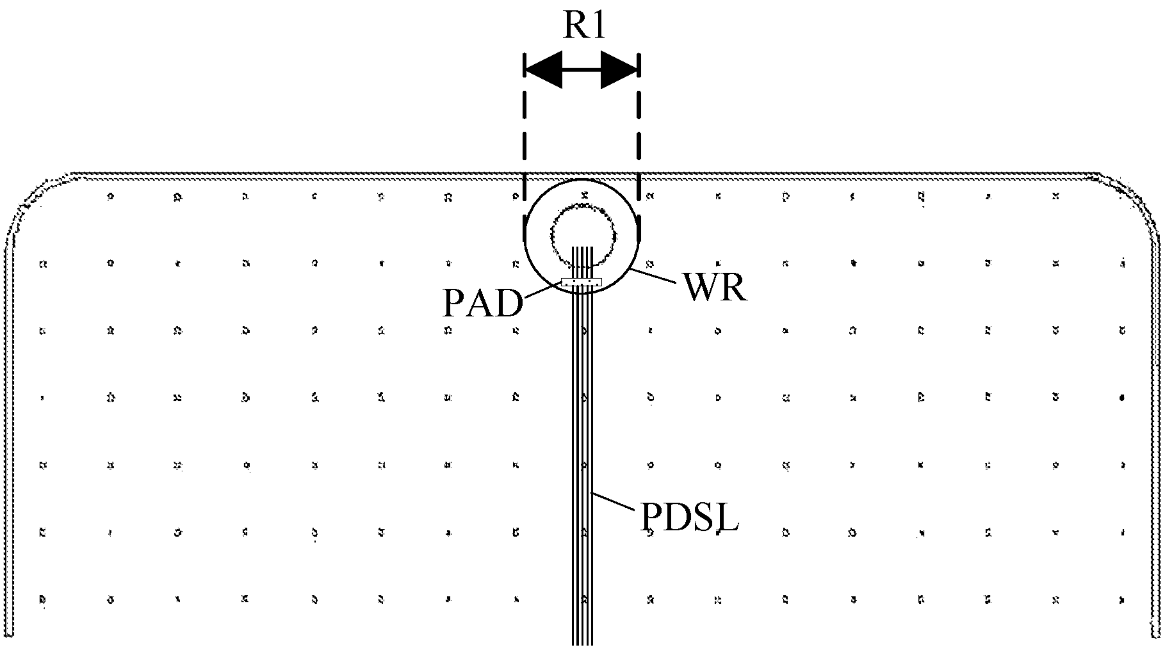
FIG. 13 illustrates a layout of a window region in an array substrate in some embodiments according to the present disclosure.

In alternative embodiments, the accessory signal line may be disposed in other appropriate layers. FIG. 13 illustrates a layout of a window region in an array substrate in some embodiments according to the present disclosure. Referring to FIG. 13, in some embodiments, the accessory signal line PDSL is connected to a signal line in the window region WR that is connected to the accessory. The signal line in the window region WR is connected to the accessory signal line PDSL through a connecting pad PAD. In one example, the accessory signal line PDSL is in a third signal line layer.

Figure 14:
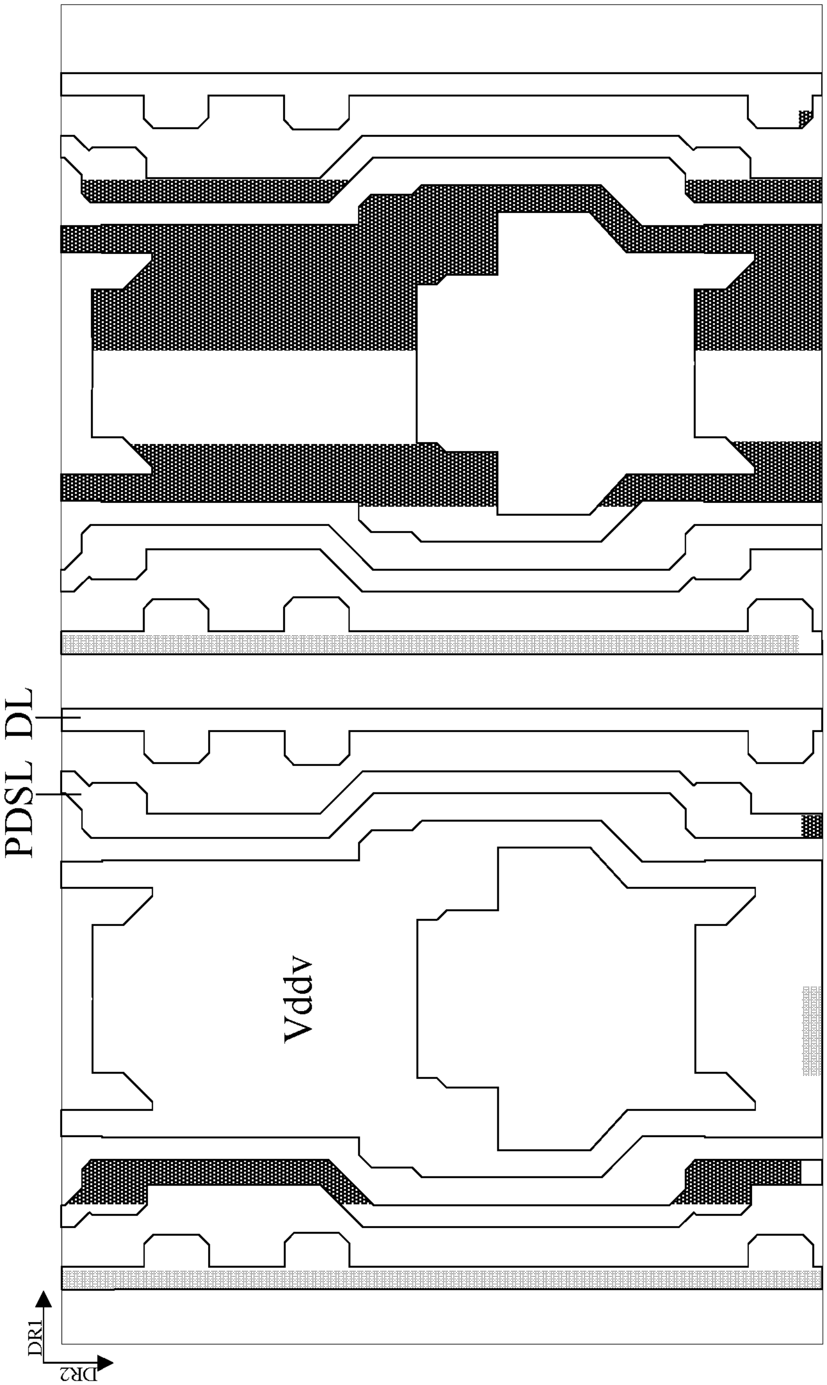
FIG. 14 is a diagram illustrating the structure of a third signal line layer in an array substrate in some embodiments according to the present disclosure.

FIG. 14 is a diagram illustrating the structure of a third signal line layer in an array substrate in some embodiments according to the present disclosure. Referring to FIG. 14, the accessory signal line PDSL is in the third signal line layer in at least a portion of the array substrate.

In some embodiments, the accessory signal line PDSL is between a respective second voltage supply line Vddv and a respective data line DL. Optionally, two adjacent accessory signal lines of a plurality of accessory signal lines are between two adjacent data lines of the plurality of data lines. Optionally, a second voltage supply line of the plurality of second voltage supply lines spaces apart two adjacent accessory signal lines.

Figure 15:
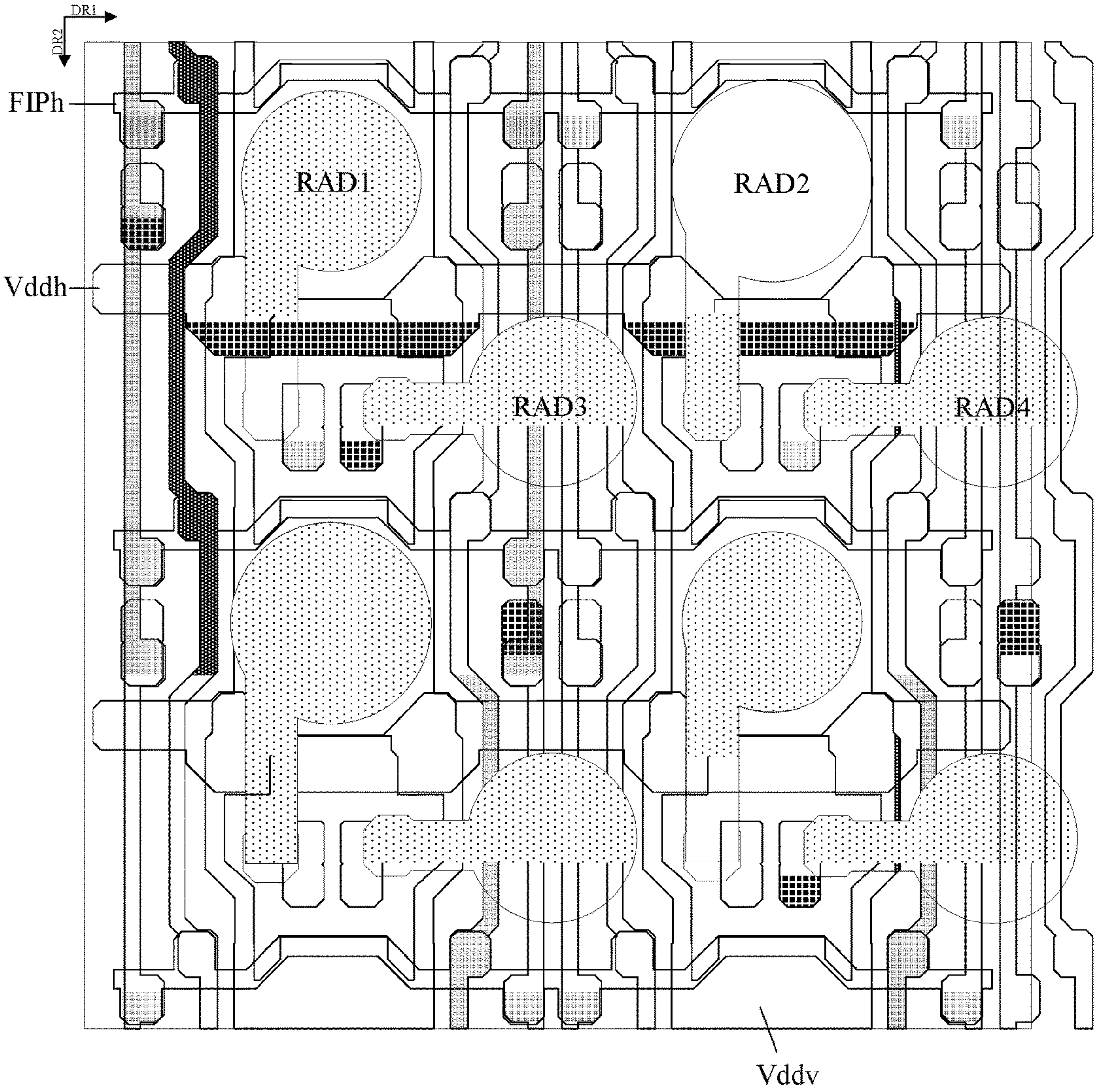
FIG. 15 is a diagram illustrating the structure of a second signal line layer, a third signal line layer, and an anode layer in an array substrate in some embodiments according to the present disclosure.

FIG. 15 is a diagram illustrating the structure of a second signal line layer, a third signal line layer, and an anode layer in an array substrate in some embodiments according to the present disclosure. Referring to FIG. 3A, FIG. 3N, FIG. 3P, FIG. 3R, and FIG. 15, in some embodiments, an orthographic projection of the plurality of anodes AD on a base substrate is substantially non-overlapping (e.g., at least 80% non-overlapping, at least 90% non-overlapping, at least 95% non-overlapping, at least 99% non-overlapping, or completely non-overlapping) with an orthographic projection of the plurality of first fanout connecting lines (e.g., a respective first fanout connecting line FIPh) on the base substrate. In some embodiments, the orthographic projection of the plurality of anodes AD on a base substrate is substantially non-overlapping (e.g., at least 80% non-overlapping, at least 90% non-overlapping, at least 95% non-overlapping, at least 99% non-overlapping, or completely non-overlapping) with an orthographic projection of the plurality of first voltage supply lines (e.g., the respective first voltage supply line Vddh) on the base substrate.

Optionally, the orthographic projection of the plurality of anodes AD on a base substrate is substantially non-overlapping (e.g., at least 80% non-overlapping, at least 90% non-overlapping, at least 95% non-overlapping, at least 99% non-overlapping, or completely non-overlapping) with the orthographic projection of the plurality of first fanout connecting lines (e.g., a respective first fanout connecting line FIPh) on the base substrate, and is substantially non-overlapping (e.g., at least 80% non-overlapping, at least 90% non-overlapping, at least 95% non-overlapping, at least 99% non-overlapping, or completely non-overlapping) with the orthographic projection of the plurality of first voltage supply lines (e.g., the respective first voltage supply line Vddh) on the base substrate.

The inventors of the present disclosure discover that a degree of evenness of anodes in a display panel could adversely affect image display. For example, color shift may result from the anodes being tilted. It is discovered in the present disclosure that signal lines underneath the anodes could significantly affect the degree the anodes being titled. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. For example, the presence of a signal line underneath a left side portion of a planarization layer results in an uneven surface of the planarization layer, which in turn results in an anode on top of the planarization layer being titled toward the right side. The titled anode reflects more light toward the right side of the display panel. In the display panel, anodes associated with subpixels of different colors have different titled angles, thus light reflected by anodes in subpixels of different colors reflect light of different colors respectively at different angles. The accumulated effect of this issue lead to color shift at a large viewing angle.

In the present disclosure, by having the orthographic projection of the plurality of anodes AD on a base substrate substantially non-overlapping with the orthographic projection of the plurality of first fanout connecting lines on the base substrate, and substantially non-overlapping with the orthographic projection of the plurality of first voltage supply lines on the base substrate, the array substrate achieves an even surface of the planarization layer underneath the anodes. As a result, color shift issue can be alleviated.

In some embodiments, the anode layer in some embodiments includes a first respective anode RAD1, a second respective anode RAD2, a third respective anode RAD3, and a fourth respective anode RAD4. In one example, the first respective anode RAD1 is an anode for a subpixel of a first color (e.g., a red subpixel), the second respective anode RAD2 is an anode for a subpixel of a second color (e.g., a blue subpixel), and the third respective anode RAD3 and the fourth respective anode RAD4 are anodes for two subpixels of a third color (e.g., two green subpixels). In some embodiments, an array of the plurality of subpixels in the array substrate includes a R-G-B-G format repeating array, in which R stands for the red subpixel, B stands for the blue subpixel, and G stands for the green subpixel.

Figure 16:
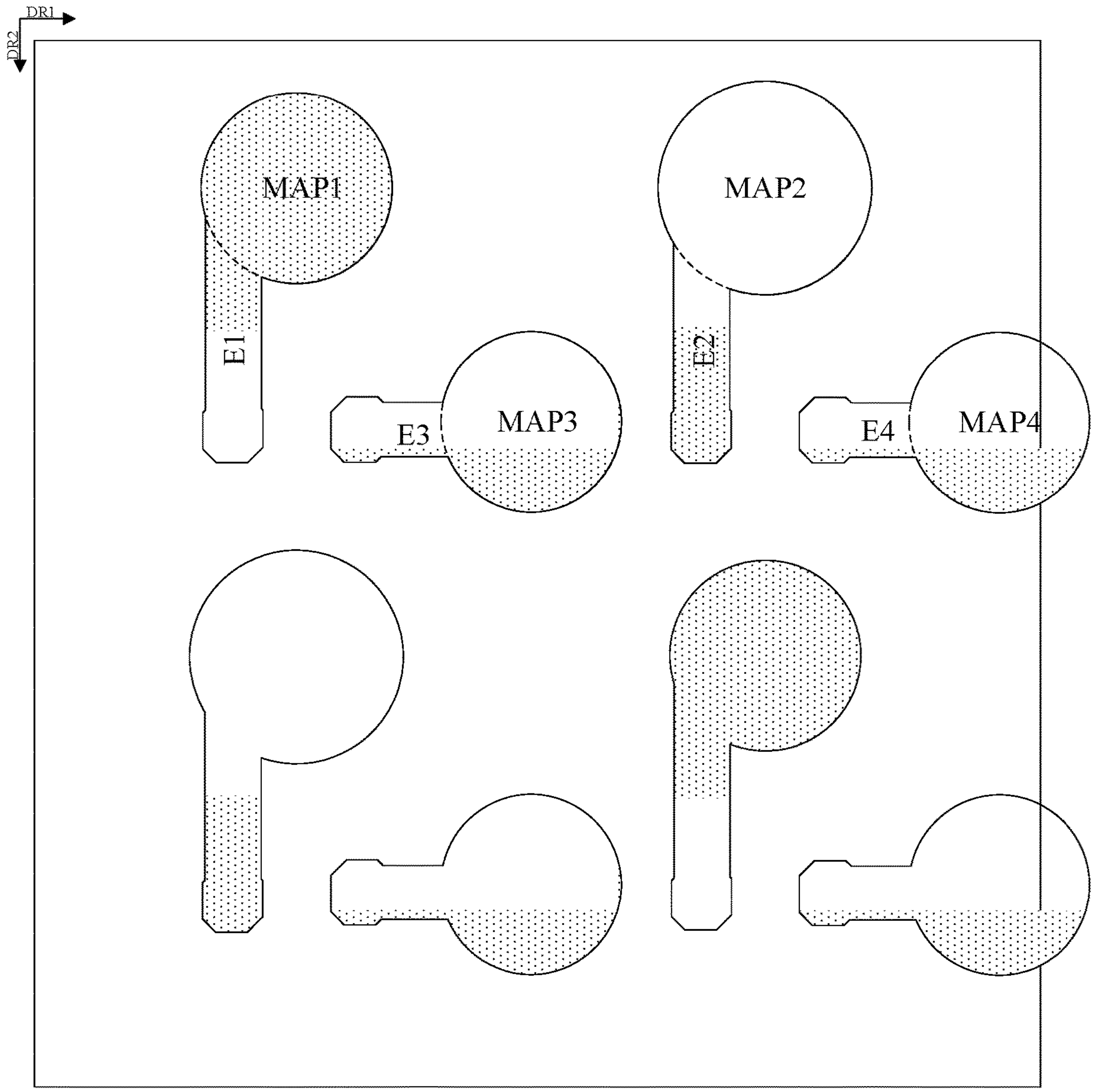
FIG. 16 is a diagram illustrating the structure of an anode layer in an array substrate in some embodiments according to the present disclosure.

FIG. 16 is a diagram illustrating the structure of an anode layer in an array substrate in some embodiments according to the present disclosure. In some embodiments, the first respective anode RAD1 includes a first main anode part MAP1 and a first extension E1 extending away from the first main anode part MAP1. The first extension E1 connects the first main anode part MAP1 with a first corresponding anode connecting pad. In some embodiments, the second respective anode RAD2 includes a second main anode part MAP2 and a second extension E2 extending away from the second main anode part MAP2. The second extension E2 connects the second main anode part MAP2 with a second corresponding anode connecting pad. In some embodiments, the third respective anode RAD3 includes a third main anode part MAP3 and a third extension E3 extending away from the third main anode part MAP3. The third extension E3 connects the third main anode part MAP3 with a third corresponding anode connecting pad. In some embodiments, the fourth respective anode RAD4 includes a fourth main anode part MAP4 and a fourth extension E4 extending away from the fourth main anode part MAP4. The fourth extension E4 connects the fourth main anode part MAP4 with a fourth corresponding anode connecting pad. Optionally, the first extension E1 extends away from the first main anode part MAP1 along a direction substantially parallel to the second direction DR2. Optionally, the second extension E2 extends away from the second main anode part MAP2 along a direction substantially parallel to the second direction DR2. Optionally, the third extension E3 extends away from the third main anode part MAP3 along a direction substantially parallel to the first direction DR1. Optionally, the fourth extension E4 extends away from the fourth main anode part MAP4 along a direction substantially parallel to the first direction DR1.

In some embodiments, an orthographic projection of the first main anode part MAP1 on a base substrate is completely non-overlapping with the orthographic projection of the plurality of first fanout connecting lines on the base substrate, and is completely non-overlapping with the orthographic projection of the plurality of first voltage supply lines on the base substrate. In some embodiments, an orthographic projection of the second main anode part MAP2 on a base substrate is completely non-overlapping with the orthographic projection of the plurality of first fanout connecting lines on the base substrate, and is completely non-overlapping with the orthographic projection of the plurality of first voltage supply lines on the base substrate. In some embodiments, an orthographic projection of the third main anode part MAP3 on a base substrate is completely non-overlapping with the orthographic projection of the plurality of first fanout connecting lines on the base substrate, and is completely non-overlapping with the orthographic projection of the plurality of first voltage supply lines on the base substrate. In some embodiments, an orthographic projection of the fourth main anode part MAP4 on a base substrate is completely non-overlapping with the orthographic projection of the plurality of first fanout connecting lines on the base substrate, and is completely non-overlapping with the orthographic projection of the plurality of first voltage supply lines on the base substrate.

In some embodiments, an orthographic projection of the plurality of second voltage supply lines (e.g., the respective second voltage supply line Vddv) on a base substrate substantially covers (e.g., covers at least 80%, covers at least 85%, covers at least 90%, covers at least 95%, covers at least 99%, or completely covers) an orthographic projection of the first respective anode RAD1 on the base substrate. In some embodiments, an orthographic projection of the plurality of second voltage supply lines (e.g., the respective second voltage supply line Vddv) on a base substrate substantially covers (e.g., covers at least 80%, covers at least 85%, covers at least 90%, covers at least 95%, covers at least 99%, or completely covers) an orthographic projection of the second respective anode RAD2 on the base substrate. The inventors of the present disclosure discover that, by having the orthographic projection of the plurality of second voltage supply lines on the base substrate covers the orthographic projection of the first respective anode RAD1 and the second respective anode RAD2 on the base substrate, an even surface of the planarization layer underneath the first respective anode RAD1 and the second respective anode RAD2 can be achieved. As a result, color shift issue can be alleviated.

In some embodiments, an orthographic projection of the plurality of second voltage supply lines on the base substrate completely covers an orthographic projection of the first main anode part MAP1 on the base substrate. In some embodiments, an orthographic projection of the plurality of second voltage supply lines on the base substrate completely covers an orthographic projection of the second main anode part MAP2 on the base substrate.

In some embodiments, an orthographic projection of the third respective anode RAD3 on a base substrate at least partially overlaps with orthographic projections of two adjacent data lines and two adjacent second fanout connecting lines on the base substrate, as shown in FIG. 15. The two adjacent data lines and the two adjacent second fanout connecting lines respectively cross over the third respective anode RAD3 along the second direction DR2, and the two adjacent data lines and the two adjacent second fanout connecting lines are substantially evenly distributed along the first direction DR1 with respect to the third main anode part MAP3 of the third respective anode RAD3. For example, portions of the two adjacent data lines and the two adjacent second fanout connecting lines, in a region crossing over the third main anode part MAP3, are equi-spaced. In another example, portions of the two adjacent data lines and the two adjacent second fanout connecting lines, in a region crossing over the third main anode part MAP3, have a mirror symmetry with respect to a plane intersecting a central point of the third main anode part MAP3 and perpendicular to the third main anode part MAP3. The inventors of the present disclosure discover that, by having the intricate structure of anodes and signal lines according to the present disclosure, an even surface of the planarization layer underneath the third respective anode RAD3 can be achieved. As a result, color shift issue can be alleviated.

In some embodiments, an orthographic projection of the fourth respective anode RAD4 on a base substrate at least partially overlaps with orthographic projections of two adjacent data lines and two adjacent second fanout connecting lines on the base substrate, as shown in FIG. 15. The two adjacent data lines and the two adjacent second fanout connecting lines respectively cross over the fourth respective anode RAD4 along the second direction DR2, and the two adjacent data lines and the two adjacent second fanout connecting lines are substantially evenly distributed along the first direction DR1 with respect to the fourth main anode part MAP4 of the fourth respective anode RAD4. For example, portions of the two adjacent data lines and the two adjacent second fanout connecting lines, in a region crossing over the fourth main anode part MAP4, are equi-spaced. In another example, portions of the two adjacent data lines and the two adjacent second fanout connecting lines, in a region crossing over the fourth main anode part MAP4, have a mirror symmetry with respect to a plane intersecting a central point of the fourth main anode part MAP4 and perpendicular to the fourth main anode part MAP4. The inventors of the present disclosure discover that, by having the intricate structure of anodes and signal lines according to the present disclosure, an even surface of the planarization layer underneath the fourth respective anode RAD4 can be achieved. As a result, color shift issue can be alleviated.

Referring to FIG. 3A and FIG. 3L, the array substrate in some embodiments includes an interconnected reset signal line network. In some embodiments, the interconnected reset signal line network includes a plurality of first reset signal lines (e.g., a respective first reset signal line Vint1) and a plurality of fourth reset signal lines (e.g., a respective fourth reset signal line Vintv) interconnected together. Optionally, the plurality of first reset signal lines extend along a direction substantially parallel to the first direction DR1. Optionally, the plurality of fourth reset signal lines extend along a direction substantially parallel to the second direction DR2. Optionally, the plurality of first reset signal lines and the plurality of fourth reset signal lines are parts of a unitary structure. Optionally, the plurality of first reset signal lines and the plurality of fourth reset signal lines are in a same layer (e.g., in the first signal line layer).

In some embodiments, a ratio of a number of the plurality of first reset signal lines to a number of rows of pixel driving circuits in a display area of the array substrate is in a range of 0.8:1.0 to 1.2:1.0. In one example, the ratio of a number of the plurality of first reset signal lines to a number of rows of pixel driving circuits in a display area of the array substrate is 1:1.

In some embodiments, a ratio of a number of the plurality of fourth reset signal lines to a number of columns of pixel driving circuits in a display area of the array substrate is in a range of 0.8:2.0 to 1.2:2.0. In one example, the ratio of a number of the plurality of fourth reset signal lines to a number of columns of pixel driving circuits in a display area of the array substrate is 1:2.

Figure 17:
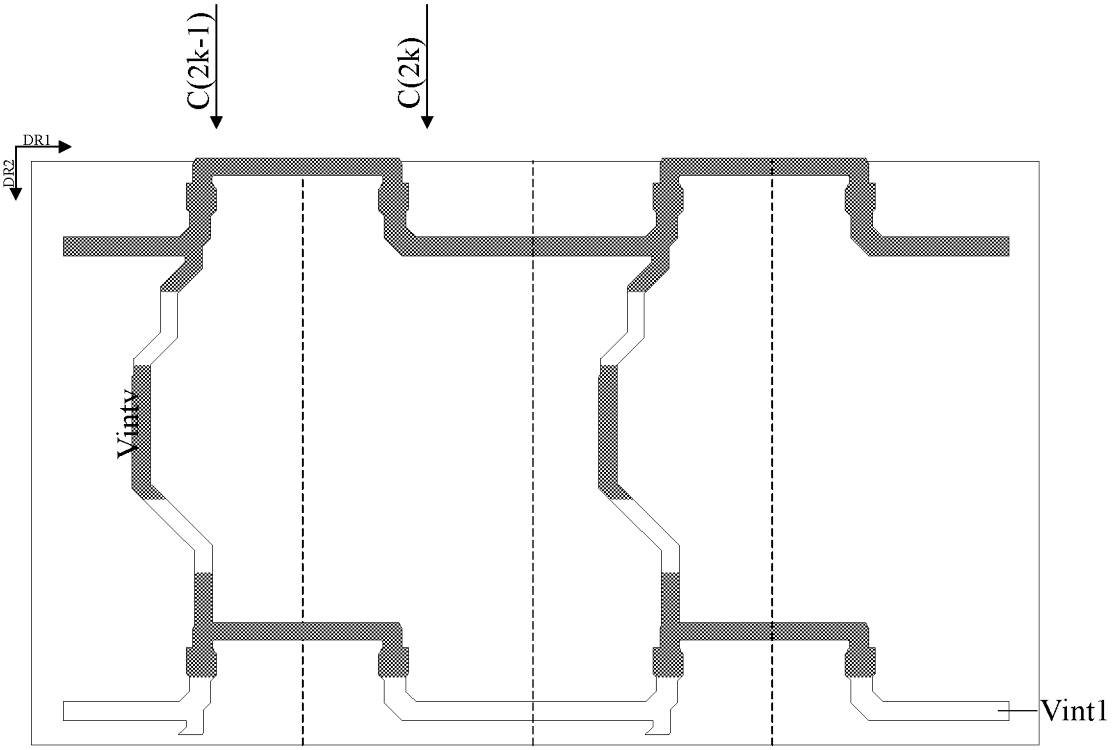
FIG. 17 illustrates an interconnected reset signal line network in some embodiments according to the present disclosure.

FIG. 17 illustrates an interconnected reset signal line network in some embodiments according to the present disclosure. Referring to FIG. 17, the plurality of pixel driving circuits are arranged in columns, including (2k−1)-th column C(2k−1), and (2k)-th column C(2k) of K columns, K and k being positive integers, $1 \leq k \leq (K/2)$. Referring to FIG. 17, in some embodiments, the plurality of fourth reset signal lines are present in the (2k−1)-th column C (2k−1), and are absent in the (2k)-th column C(2k).

As used herein, the terms "(2k−1)-th column" and "(2k)-th column" are used in the context of the K columns. The array substrate may or may not include additional column(s) before the first column of the K columns and/or additional columns after the last column of the K columns. In the context of the array substrate, the term "(2k−1)-th column" does not necessarily denote an odd-numbered column, and the term "(2k)-th column" does not necessarily denote an even-numbered column. In one example, the (2k−1)-th column is an odd-numbered column in the context of the K columns, but may be an even-numbered column in the context of the array substrate. In another example, the (2k−1)-th column is an odd-numbered column in the context of the K columns, and also an odd-numbered column in the context of the array substrate. In one example, the (2k)-th column is an even-numbered column in the context of the K columns, but may be an odd-numbered column in the context of the array substrate. In another example, the (2k)-th column is an even-numbered column in the context of the K columns, and also an even-numbered column in the context of the array substrate.

Figure 18:
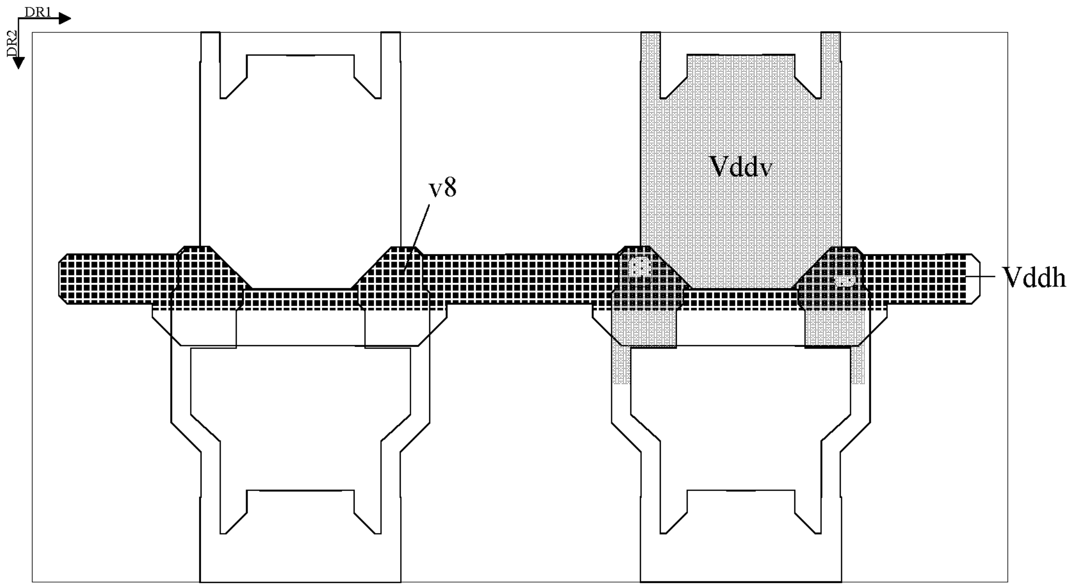
FIG. 18 illustrates an interconnected voltage supply network in some embodiments according to the present disclosure.

FIG. 18 illustrates an interconnected voltage supply network in some embodiments according to the present disclosure. Referring to FIG. 18, the interconnected voltage supply network in some embodiments includes a plurality of first voltage supply lines (e.g., a respective first voltage supply line Vddh) and a plurality of second voltage supply lines (e.g., a respective second voltage supply line Vddv) interconnected together. Optionally, the plurality of first voltage supply lines extend along a direction substantially parallel to the first direction DR1. Optionally, the plurality of second voltage supply lines extend along a direction substantially parallel to the second direction DR2. Optionally, the plurality of first voltage supply lines are in a layer different from the plurality of second voltage supply lines. In one example, the plurality of first voltage supply lines are in the second signal line layer. In another example, the plurality of second voltage supply lines are in the third signal line layer. Optionally, a respective second voltage supply line Vddv is connected to a respective first voltage supply line Vddh through an eighth via v8 (see, e.g., FIG. 4D). In one example, the eighth via v8 extends through the second planarization layer PLN2.

In some embodiments, a ratio of a number of the plurality of second voltage supply lines to a number of columns of pixel driving circuits in a display area of the array substrate is in a range of 0.8:2.0 to 1.2:2.0. In one example, the ratio of a number of the plurality of second voltage supply lines to a number of columns of pixel driving circuits in a display area of the array substrate is 1:2. A respective second voltage supply line Vddv is at least partially in a (2k)-th column and at least partially in a (2k−1)-th column.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a light shielding layer on a base substrate. Optionally, an orthographic projection of the light shielding layer on the base substrate at least partially overlaps with an orthographic projection of an active layer of a driving transistor of a pixel driving circuit on the base substrate. Optionally, forming the light shielding layer in a second region comprises forming a plurality of islands, forming a plurality of bridges, and forming an auxiliary line extending along a direction substantially parallel to a second direction. Optionally, the auxiliary line is connected to one or more adjacent islands of the plurality of islands through a bridge of the plurality of bridges. Optionally, forming the auxiliary line includes forming a plurality of fragments spaced apart from each other. Optionally, an orthographic projection of the plurality of fragments on the base substrate is substantially non-overlapping with an orthographic projection of transistors of the pixel driving circuit on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a base substrate, and a light shielding layer on the base substrate;

wherein an orthographic projection of the light shielding layer on the base substrate at least partially overlaps with an orthographic projection of an active layer of a driving transistor of a pixel driving circuit on the base substrate;

wherein a part of the light shielding layer in a second region comprises a plurality of islands, a plurality of bridges, and an auxiliary line extending along a direction substantially parallel to a second direction;

the auxiliary line is connected to one or more adjacent islands of the plurality of islands through a bridge of the plurality of bridges;

the auxiliary line comprises a plurality of fragments spaced apart from each other; and an orthographic projection of the plurality of fragments on the base substrate is substantially non-overlapping with an orthographic projection of transistors of the pixel driving circuit on the base substrate.

2. The array substrate of claim 1, wherein, in a column of fragments, a respective fragment is in a respective row of pixel driving circuits, and is between a respective pair of two adjacent pixel driving circuits in the respective row between which data lines are absent.

3. The array substrate of claim 1, further comprising an accessory signal line in a first region outside the second region;

the accessory signal line extends along a direction substantially parallel to the second direction;

the accessory signal line is between two adjacent pixel driving circuits in a same row between which data lines are absent; and the accessory signal line continuously extends through multiple rows of pixel driving circuits.

4. The array substrate of claim 3, wherein the accessory signal line is in a region adjacent to a window region of the array substrate having a hole configured for installing an accessory; and the accessory signal line is connected to an accessory installed in the window region.

5. The array substrate of claim 3, wherein the accessory signal line and the auxiliary line are in the light shielding layer.

6. The array substrate of claim 3, wherein the accessory signal line is connected to a signal line in a window region that is connected to an accessory;

the signal line in the window region is connected to the accessory signal line through a connecting pad;

the accessory signal line is in a third signal line layer on a side of the light shielding layer away from the base substrate.

7. The array substrate of claim 1, further comprising:

a plurality of first fanout connecting lines extending along a direction substantially parallel to a first direction;

a plurality of second fanout connecting lines extending along a direction substantially parallel to the second direction;

a plurality of second voltage supply lines extending along a direction substantially parallel to the second direction; and a plurality of data lines extending along a direction substantially parallel to the second direction;

wherein a respective second fanout connecting line of the plurality of second fanout connecting lines is between a second voltage supply line and a data line;

two adjacent second fanout connecting lines of the plurality of second fanout connecting lines are between two adjacent data lines of the plurality of data lines; and a second voltage supply line of the plurality of second voltage supply lines spaces apart two adjacent second fanout connecting lines.

8. The array substrate of claim 7, wherein the respective data line is connected to a respective first fanout connecting line;

a respective second fanout connecting line is connected to the respective first fanout connecting line;

the respective first fanout connecting line connects the respective data line with the respective second fanout connecting line; and the plurality of second fanout connecting lines are connected to a data driving circuit.

9. The array substrate of claim 7, further comprising a plurality of third voltage supply lines extending along a direction substantially parallel to the second direction;

a respective third voltage supply line of the plurality of third voltage supply lines is between a second voltage supply line and a data line;

two adjacent third voltage supply lines of the plurality of third voltage supply lines are between two adjacent data lines of the plurality of data lines; and a second voltage supply line of the plurality of second voltage supply lines spaces apart two adjacent third voltage supply lines.

10. The array substrate of claim 9, wherein at least one third voltage supply line of the plurality of third voltage supply lines and a second fanout connecting line of the plurality of second fanout connecting lines are disconnected from each other, and are between a same second voltage supply line and a same data line that are configured to provide signals to a same column of pixel driving circuits;

the at least one third voltage supply line crosses over a first portion of the array substrate;

the second fanout connecting line crosses over a second portion of the array substrate; and the first portion and the second portion are non-overlapping to each other.

11. The array substrate of claim 1, further comprising:

an anode layer comprising a plurality of anodes;

a plurality of first fanout connecting lines extending along a direction substantially parallel to a first direction; and a plurality of first voltage supply lines extending along a direction substantially parallel to the first direction;

wherein an orthographic projection of the plurality of anodes on the base substrate is substantially non-overlapping with an orthographic projection of the plurality of first fanout connecting lines on the base substrate, and is substantially non-overlapping with an orthographic projection of the plurality of first voltage supply lines on the base substrate.

12. The array substrate of claim 11, further comprising a plurality of second voltage supply lines extending along a direction substantially parallel to the second direction;

wherein the anode layer comprises a first respective anode, a second respective anode, a third respective anode, and a fourth respective anode; and an orthographic projection of the plurality of second voltage supply lines on the base substrate substantially covers an orthographic projection of the first respective anode on the base substrate, and substantially covers an orthographic projection of the second respective anode on the base substrate.

13. The array substrate of claim 11, further comprising:

a plurality of second fanout connecting lines extending along a direction substantially parallel to the second direction; and a plurality of data lines extending along a direction substantially parallel to the second direction;

wherein the anode layer comprises a first respective anode, a second respective anode, a third respective anode, and a fourth respective anode;

an orthographic projection of the third respective anode on the base substrate at least partially overlaps with orthographic projections of two adjacent data lines and two adjacent second fanout connecting lines on the base substrate;

the third respective anode comprises a third main anode part and a third extension connecting the third main anode part with a third corresponding anode connecting pad;

the two adjacent data lines and the two adjacent second fanout connecting lines respectively cross over the third respective anode along the second direction; and the two adjacent data lines and the two adjacent second fanout connecting lines are substantially evenly distributed along a first direction with respect to the third main anode part of the third respective anode.

14. The array substrate of claim 1, further comprising a voltage connecting pad;

wherein the voltage connecting pad connects a respective first voltage supply line of a plurality of first voltage supply lines to a second capacitor electrode of a storage capacitor and connects a respective first voltage supply line of a plurality of first voltage supply lines to a first electrode of a light emitting control transistor;

a respective second voltage supply line of a plurality of second voltage supply lines is connected to a respective first voltage supply line of a plurality of first voltage supply lines through an eighth via; and the respective first voltage supply line is connected to the voltage connecting pad through a ninth via, thereby supplying a first reference voltage signal to the voltage connecting pad, and in turn to the second capacitor electrode.

15. The array substrate of claim 14, wherein the voltage connecting pad is in a region between two adjacent pixel driving circuits in a same row between which at least one data line is present;

the voltage connecting pad is absent in a region between two adjacent pixel driving circuits in a same row between which data lines are absent; and an orthographic projection of the voltage connecting pad on the base substrate at least partially overlaps with an orthographic projection of a data line on the base substrate.

16. The array substrate of claim 1, further comprising an interconnected reset signal line network;

wherein the interconnected reset signal line network comprises a plurality of first reset signal lines and a plurality of fourth reset signal lines interconnected together;

the plurality of first reset signal lines extend along a direction substantially parallel to a first direction;

the plurality of fourth reset signal lines extend along a direction substantially parallel to the second direction; and the plurality of first reset signal lines and the plurality of fourth reset signal lines are parts of a unitary structure and are in a same layer.

17. The array substrate of claim 16, wherein a ratio of a number of the plurality of first reset signal lines to a number of rows of pixel driving circuits in a display area of the array substrate is in a range of 0.8:1.0 to 1.2:1.0; and a ratio of a number of the plurality of fourth reset signal lines to a number of columns of pixel driving circuits in a display area of the array substrate is in a range of 0.8:2.0 to 1.2:2.0.

18. The array substrate of claim 1, further comprising an interconnected voltage supply network;

wherein the interconnected voltage supply network comprises a plurality of first voltage supply lines and a plurality of second voltage supply lines interconnected together;

the plurality of first voltage supply lines extend along a direction substantially parallel to a first direction;

the plurality of second voltage supply lines extend along a direction substantially parallel to the second direction;

the plurality of first voltage supply lines are in a layer different from the plurality of second voltage supply lines; and a respective second voltage supply line is connected to a respective first voltage supply line through a via extending through a planarization layer.

19. The array substrate of claim 18, wherein a ratio of a number of the plurality of second voltage supply lines to a number of columns of pixel driving circuits in a display area of the array substrate is in a range of 0.8:2.0 to 1.2:2.0.

20. A display apparatus, comprising the array substrate of claim 1, and one or more integrated circuits connected to the array substrate.

* * * * *